US012684716B2

(12) United States Patent
Ahn et al.

(10) Patent No.: US 12,684,716 B2
(45) Date of Patent: Jul. 14, 2026

(54) DISPLAY DEVICE

(71) Applicant: LG ELECTRONICS INC., Seoul (KR)

(72) Inventors: Daeseon Ahn, Seoul (KR); Kwangho Choi, Seoul (KR); Minsuk Kim, Gumi-si (KR); Dongil Park, Chilgok-gun (KR); Changmin Jo, Kijang-gun (KR)

(73) Assignee: LG ELECTRONICS INC., Seoul (KR)

( * ) Notice: Subject to any disclaimer, the term of this patent is extended or adjusted under 35 U.S.C. 154(b) by 136 days.

(21) Appl. No.: 18/624,416

(22) Filed: Apr. 2, 2024

(65) Prior Publication Data

US 2025/0081370 A1 Mar. 6, 2025

(30) Foreign Application Priority Data

Aug. 31, 2023 (KR) ........................ 10-2023-0115625
Jan. 31, 2024 (KR) ........................ 10-2024-0014940

(51) Int. Cl.
*H05K 5/02* (2006.01)

(52) U.S. Cl.
CPC ................................. H05K 5/0226 (2013.01)

(58) Field of Classification Search
CPC ................................................... H05K 5/0226
USPC ........................................ 361/807, 809, 810
See application file for complete search history.

(56) References Cited

U.S. PATENT DOCUMENTS

| | | | | |
|---|---|---|---|---|
| 6,769,657 | B1 * | 8/2004 | Huang | ................. F16M 13/022 |
| | | | | 248/278.1 |
| 2003/0222041 | A1 * | 12/2003 | Hong | .................... F16M 13/02 |
| | | | | 211/99 |
| 2005/0002159 | A1 * | 1/2005 | Jeong | ................. F16M 11/2092 |
| | | | | 361/679.21 |
| 2007/0028419 | A1 * | 2/2007 | Lu | .......................... F16M 13/02 |
| | | | | 16/366 |
| 2007/0029457 | A1 | 2/2007 | Baek | |
| 2007/0152125 | A1 * | 7/2007 | Lee | ........................ F16M 11/38 |
| | | | | 248/398 |

FOREIGN PATENT DOCUMENTS

| | | |
|---|---|---|
| KR | 10-0658836 B1 | 12/2006 |
| KR | 10-2007-0082792 A | 8/2007 |
| KR | 10-2023-0010222 A | 1/2023 |

* cited by examiner

*Primary Examiner* — Hung S. Bui
(74) *Attorney, Agent, or Firm* — Birch, Stewart, Kolasch & Birch, LLP

(57) ABSTRACT

A display device is disclosed. The display device may include: a display; an upper arm coupled to a rear of the display; a lower arm to which the upper arm is hingedly connected; a base to which the lower arm is hingedly connected; a joint connecting the upper arm and the lower arm; a first elastic member providing an elastic force to the lower arm with respect to the base; a second elastic member providing an elastic force to the upper arm with respect to the joint; an inner bar having opposite ends pivotably coupled to the base and the joint; and an outer bar having opposite ends pivotably coupled the base and the joint.

13 Claims, 40 Drawing Sheets

DISPLAY DEVICE

CROSS-REFERENCE TO RELATED APPLICATION

This application claims the priority benefit of Korean Provisional Application No. 10-2023-0115625, filed on Aug. 31, 2023, and Korean Patent Application 10-2024-0014940, filed on Jan. 31, 2024, the disclosures of which are incorporated herein by reference in their entirety.

BACKGROUND OF THE INVENTION

Field of the Invention

The present disclosure relates to a display device.

Description of the Related Art

With the development of information society, there has been a growing demand for various types of display devices. In order to meet such demand, various display devices, such as a liquid crystal display (LCD), a plasma display panel (PDP), an electro luminescent display (ELD), a vacuum fluorescent display (VFD), an organic light emitting diode (OLED), and the like, have been developed and used.

Among them, an LCD panel includes a TFT substrate and a color substrate that face each other with a liquid crystal layer interposed therebetween, so as to display an image using light provided from a backlight unit. Meanwhile, an OLED panel can display an image by depositing a self-luminescent organic layer on a substrate having a transparent electrode formed thereon.

Recently, numerous research has been conducted on a display device for outdoor use. In addition, various research has been conducted on a structure that can improve the storage and portability of display devices.

A recent display stand has been used for freely adjusting the height or distance and the angle of a display. However, as the weight of a display mounted to a stand increases due to the gaining popularity of larger displays, it causes a difficulty for the stand to securely support the display or a difficulty in smooth adjustment of the angle or height of the stand.

SUMMARY OF THE INVENTION

It is an objective of the present disclosure to solve the above and other problems.

Another objective of the present disclosure may be to provide a structure that enables a display stand to be folded and unfolded.

Another objective of the present disclosure may be to provide a structure that can facilitate folding and unfolding of a foldable link of a display stand.

Another objective of the present disclosure may be to provide a support link for supporting a foldable link of a display stand.

Another objective of the present disclosure may be to provide a structure that can minimize the deformation of a support link by increasing the rigidity of the support link.

Another objective of the present disclosure may be to provide various examples of a display stand.

In accordance with an aspect of the present disclosure to achieve the above or other objectives, a display device may include: a display; an upper arm coupled to a rear of the display; a lower arm to which the upper arm is hingedly connected; a base to which the lower arm is hingedly connected; a joint connecting the upper arm and the lower arm; a first elastic member providing an elastic force to the lower arm with respect to the base; a second elastic member providing an elastic force to the upper arm with respect to the joint; an inner bar having opposite ends pivotably coupled to the base and the joint; and an outer bar having opposite ends pivotably coupled the base and the joint.

BRIEF DESCRIPTION OF THE DRAWINGS

The above and other objects, features and advantages of the present disclosure will be more apparent from the following detailed description in conjunction with the accompanying drawings, in which.

DETAILED DESCRIPTION

Description will now be given in detail according to exemplary embodiments disclosed herein, with reference to the accompanying drawings. For the sake of brief description with reference to the drawings, the same or equivalent components may be denoted by the same reference numbers, and description thereof will not be repeated.

In the following description, a suffix such as "module" and "unit" may be used to refer to elements or components. Use of such a suffix herein is merely intended to facilitate description of the specification, and the suffix itself is not intended to give any special meaning or function.

In the present disclosure, that which is well known to one of ordinary skill in the relevant art has generally been omitted for the sake of brevity. The accompanying drawings are used to help easily understand the technical idea of the present disclosure and it should be understood that the idea of the present disclosure is not limited by the accompanying drawings. The idea of the present disclosure should be construed to extend to any alterations, equivalents, and substitutes besides the accompanying drawings.

It will be understood that although the terms "first", "second", etc. may be used herein to describe various elements, these elements should not be limited by these terms. These terms are only used to distinguish one element from another.

It will be understood that when a component is referred to as being "connected to" or "coupled to" another component, it may be directly connected to or coupled to another component, or intervening components may be present. In contrast, when a component is referred to as being "directly connected to" or "directly coupled to" another component, there are no intervening components present.

As used herein, a singular representation is intended to include a plural representation unless the context clearly indicates otherwise.

It will be understood that the terms "comprises" and/or "has," when used in this specification, specify the presence of a stated feature, number, step, operation, component, element, or combination thereof, but do not preclude the presence or addition of one or more other features, numbers, steps, operations, components, elements, or combinations thereof.

Figure 1:
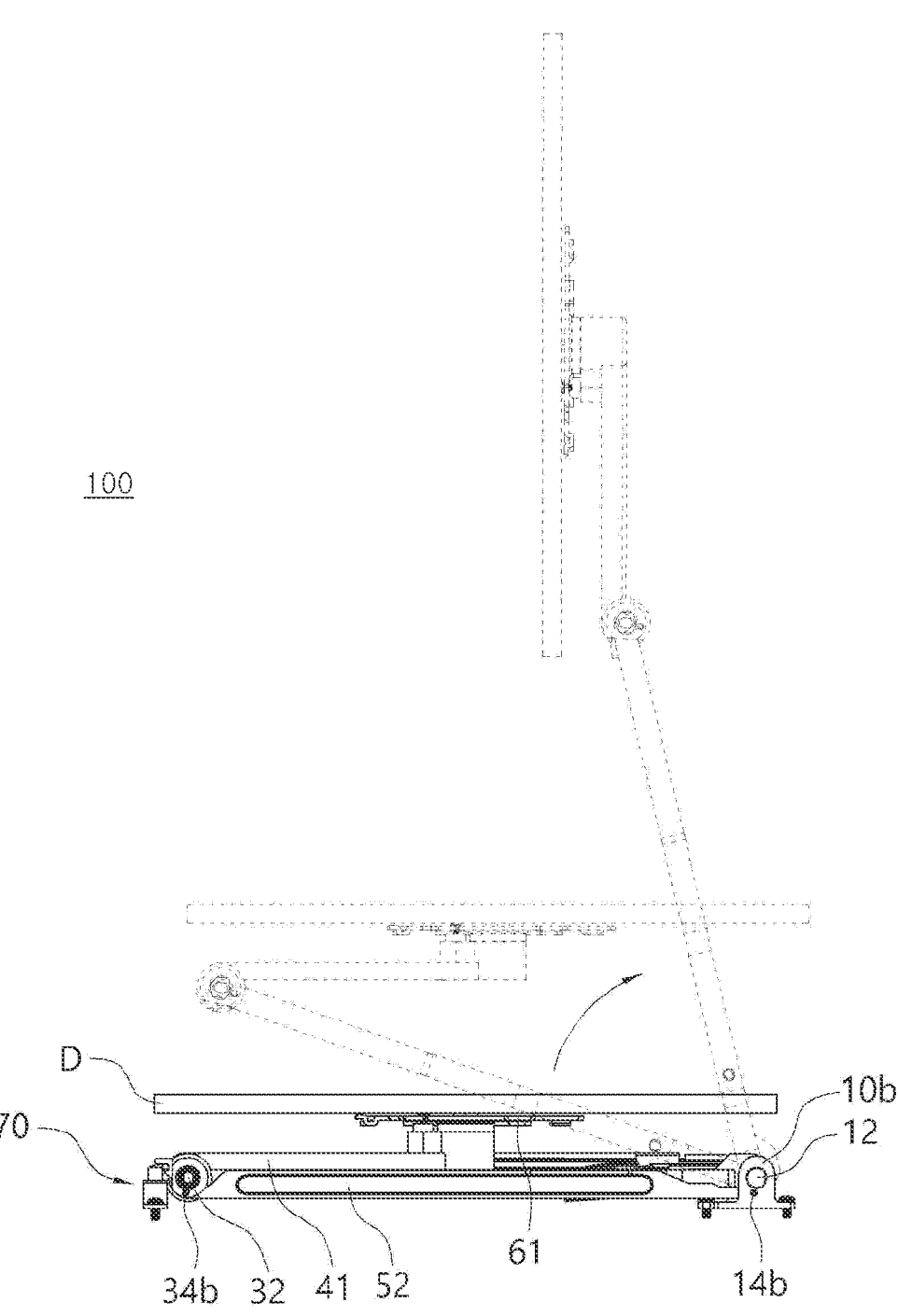
FIGS. 1 to 40 illustrate examples of a display device according to embodiments of the present disclosure.
Figure 2:
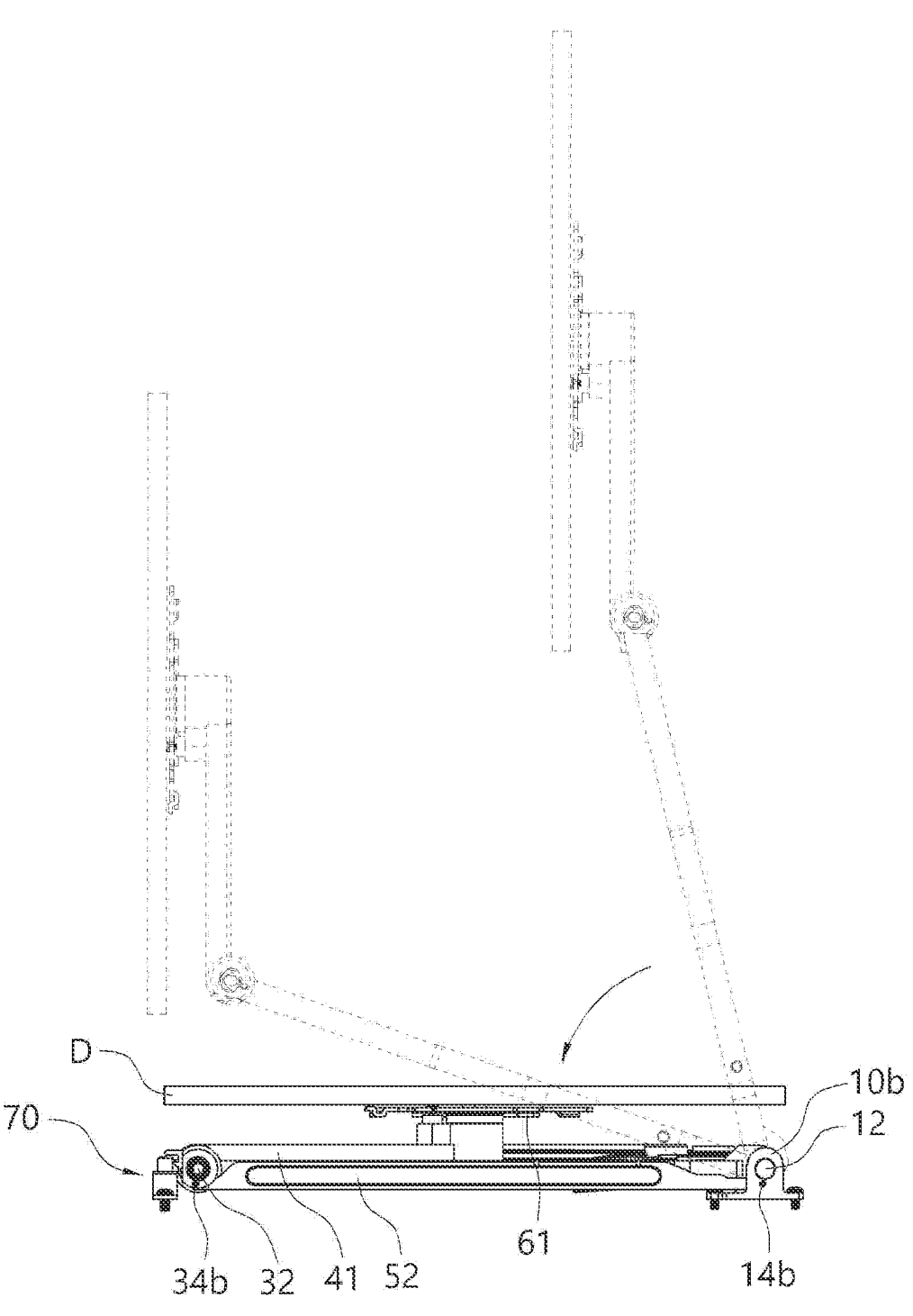
Figure 3:
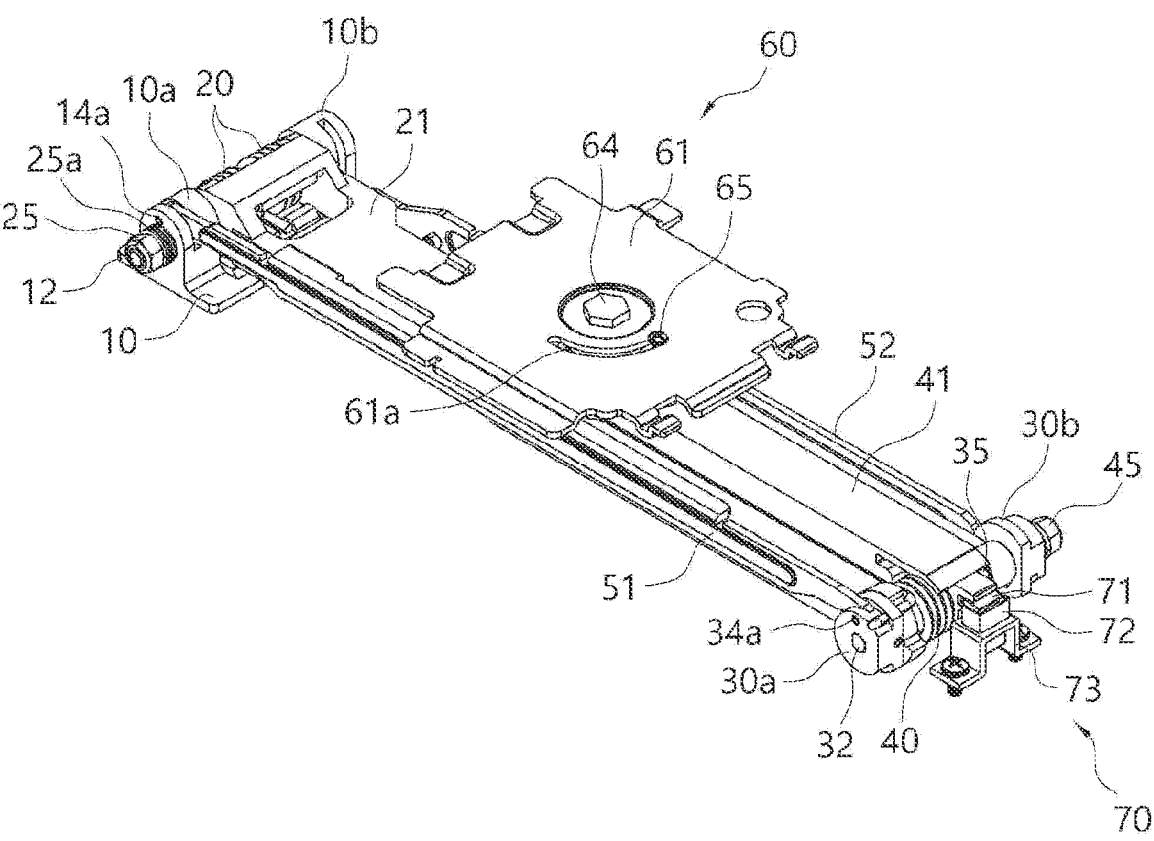
Figure 4:
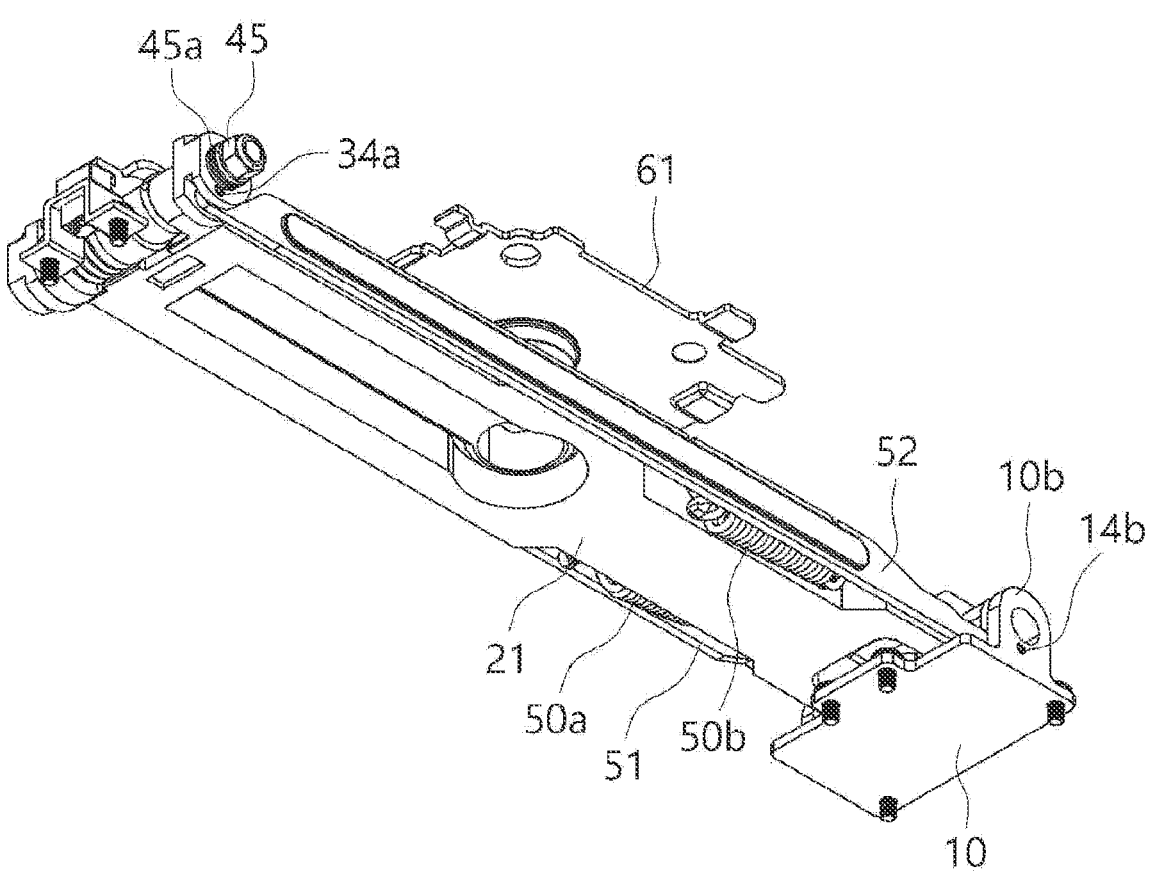
Figure 5:
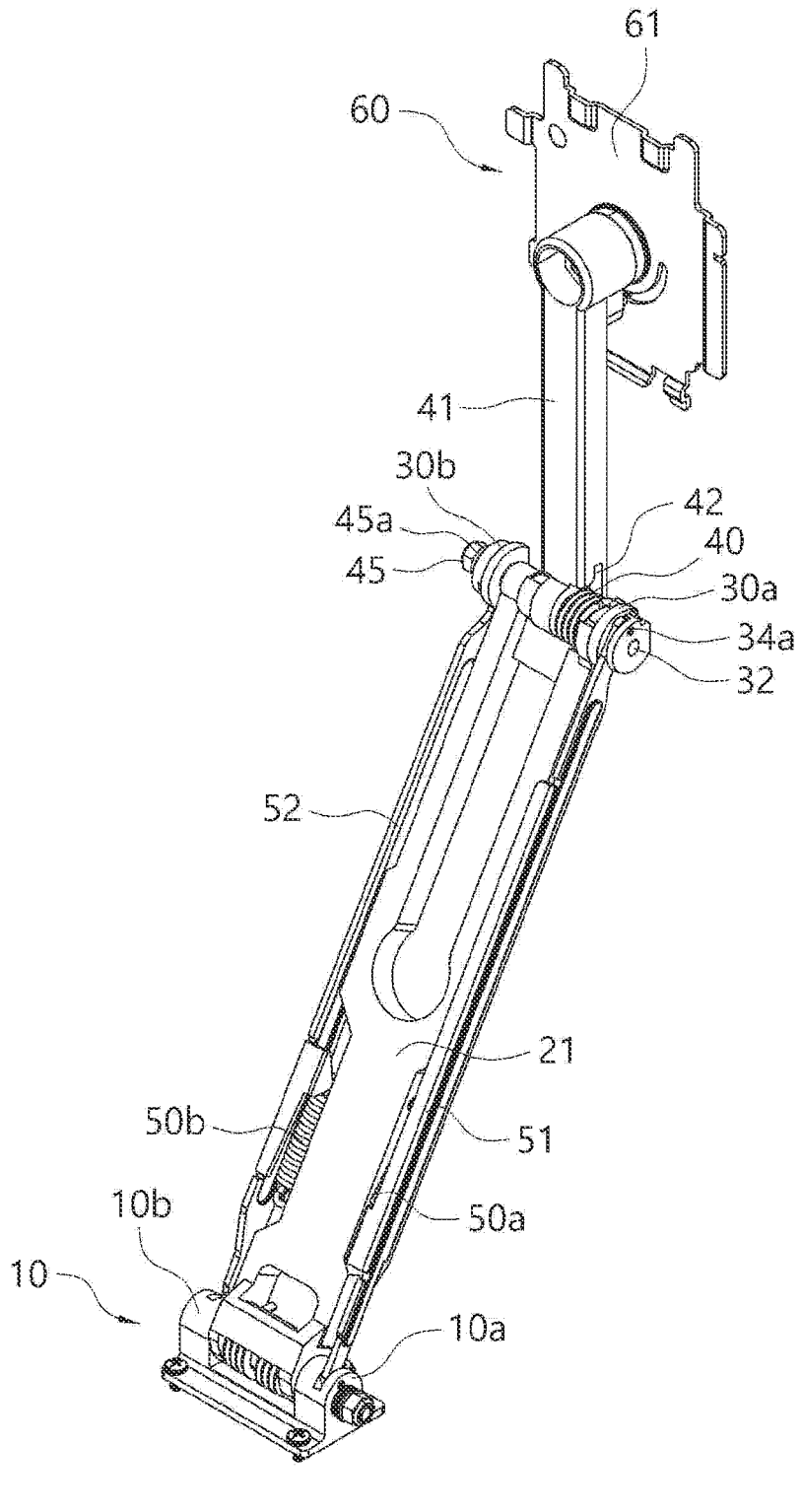
Figure 6:
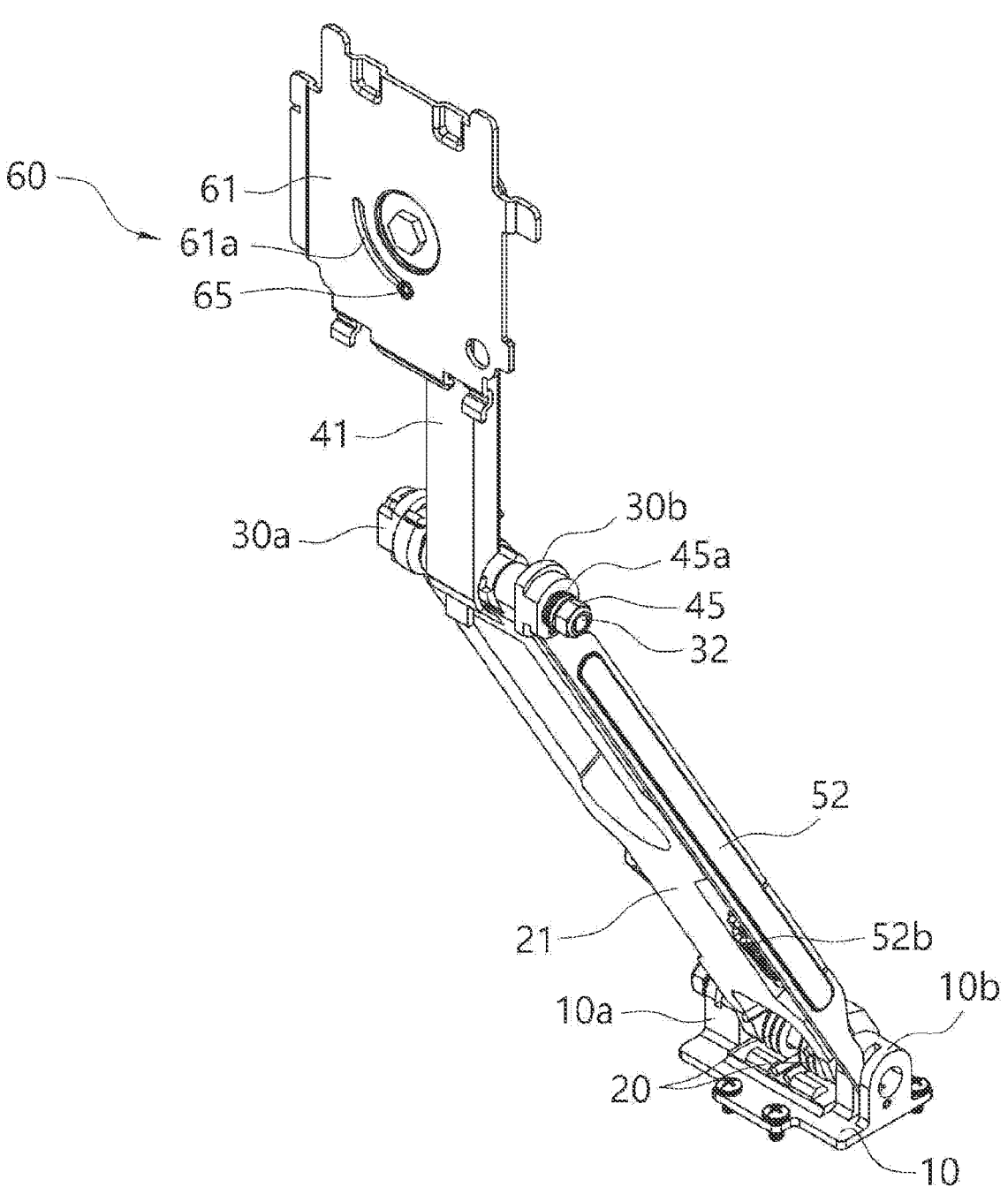
Figure 7:
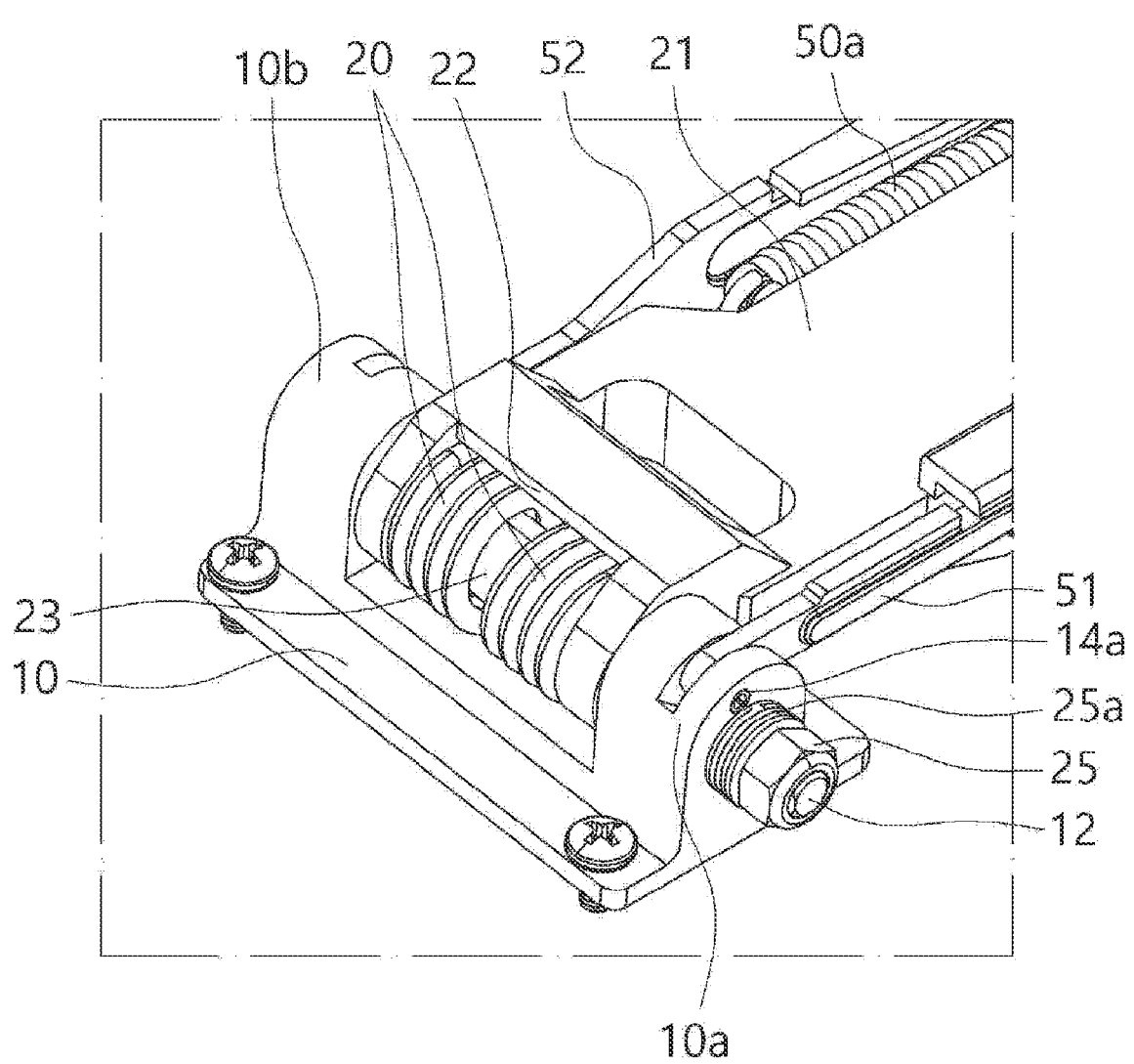
Figure 8:
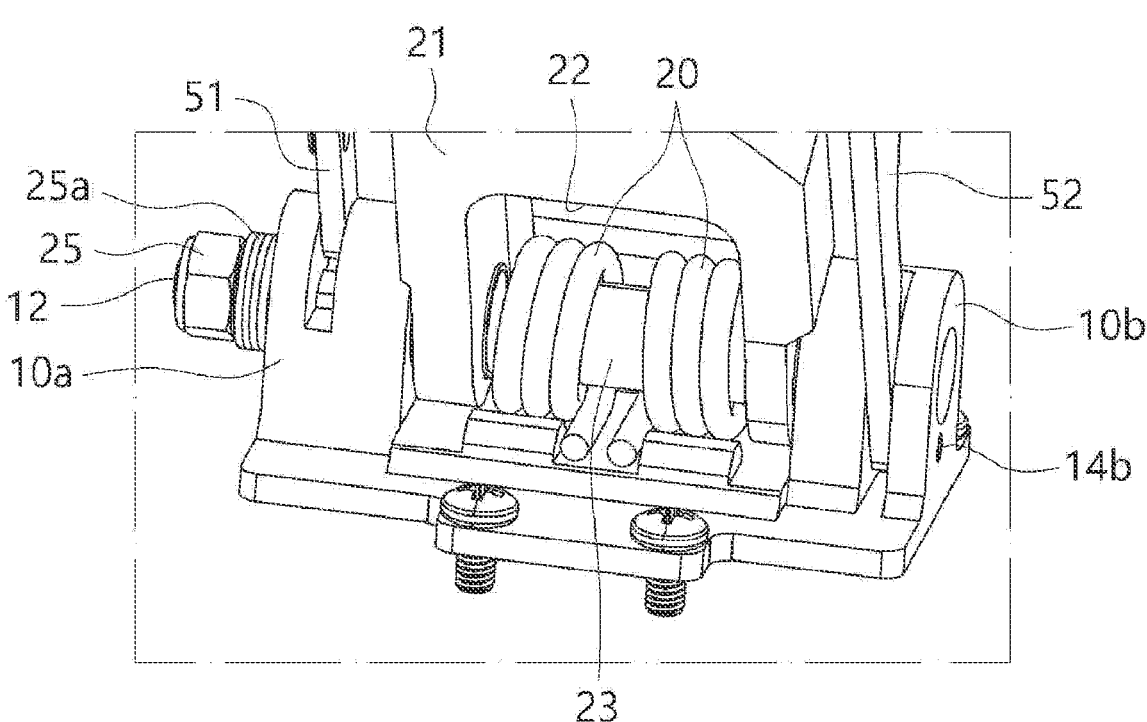

FIGS. 1 and 2 are schematic views illustrating a state of switching between a folded position and an unfolded position of an arm stand for a display according to an embodiment of the present disclosure; FIGS. 3 and 4 are perspective views illustrating a folded state of an arm stand for a display according to an embodiment of the present disclosure; FIGS. 5 and 6 are perspective views illustrating an unfolded state of an arm stand for a display according to an embodiment of the present disclosure; FIGS. 7 and 8 are detailed views illustrating a coupled state between a base, a first link, and a first torsion spring in a folded state and an unfolded state of an arm stand for a display according to an embodiment of the present disclosure; and FIG. 9 is an exploded perspective view illustrating a base, a first link, and a first torsion spring that are provided at an arm stand for a display according to an embodiment of the present disclosure.

As shown in FIGS. 1 to 6, an arm stand 100 for a display of this embodiment may include a base 10, a first link 21, a first torsion spring 20, articulating bases 30a and 30b, a second link 41, a second torsion spring 40, third links 51 and 52, tension springs 50a and 50b, a bracket unit 60, and a locking unit 70 so as to be smoothly and stably switched from an folded state to an unfolded state when a display D is in use, and from the unfolded state to the folded state when the display D is not in use. The arm stand 100 for a display may be referred to as a display stand 100, a monitor arm 100, a stand 100, or a supporter 100. The display D and the arm stand 100 for a display may be collectively referred to as a display device. The display D may be referred to as a display unit D, a display module D, or a head D. The first link 21 and the second link 41 may be collectively referred to as a foldable link (21, 41). The third links 51 and 52 may be referred to as bars 51 and 52, auxiliary links 51 and 52, or support links 51 and 52.

Figure 9:
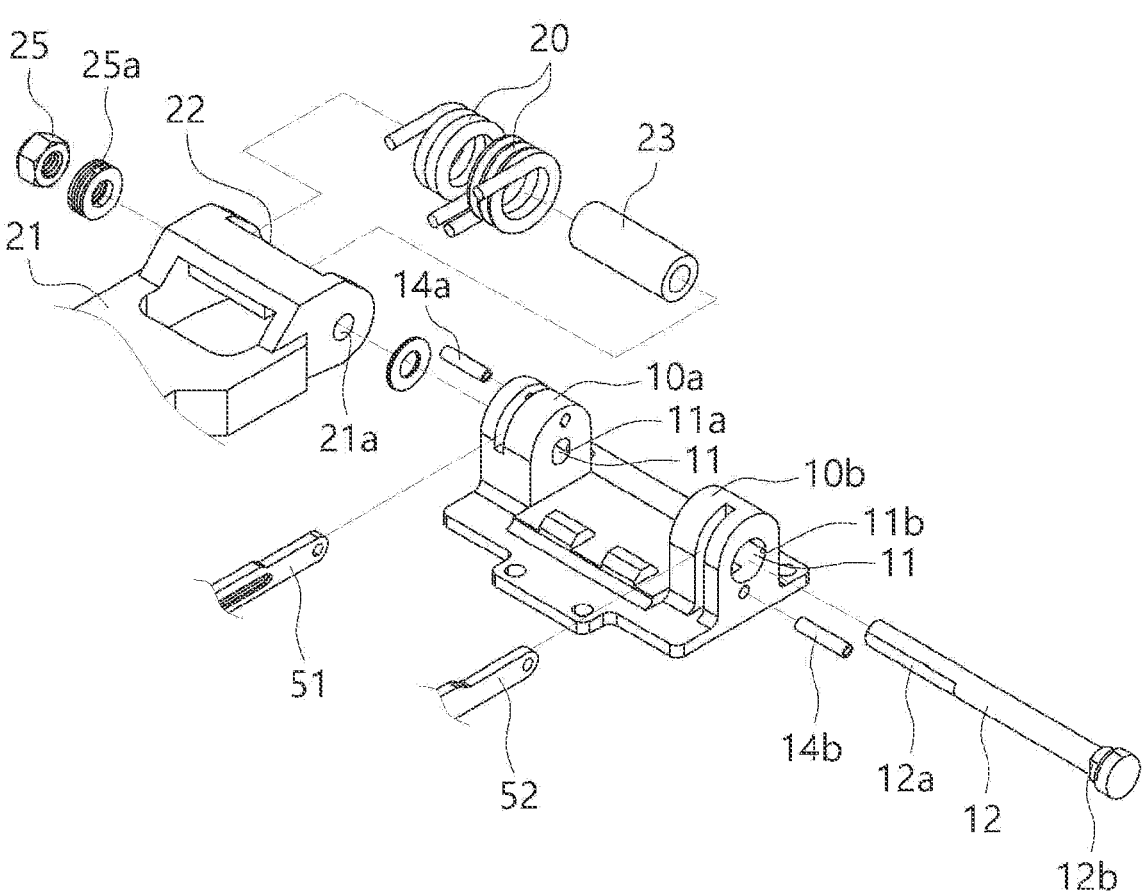

As shown in FIGS. 7 to 9, the base 10 includes a first base 10a and a second base 10b, each having a first hinge hole 11 formed through a body, and is provided with a first hinge shaft 12 passing through the first hinge holes to be detachably installed on a flat surface by a plurality of fastening members.

Such a base 10 is a structure in which the first and second bases are fixedly installed at a regular interval on the flat surface of a table or on the bottom surface of a pit depressed to a certain depth in the flat surface.

The base 10 may include, on its upper surface, a pair of left and right bases, namely, a first base 10a that defines a flat surface 11a, which is in contact with a flat surface 12a formed on an outer surface of a first end of the first hinge shaft 12, on an inner surface of the hinge hole, and a second base 10b that defines a flat surface 11b, which is in contact with a flat surface 12b formed on an outer surface of a second end of the first hinge shaft 12, on an inner surface of the hinge hole.

Accordingly, when the first hinge shaft is coupled to the first hinge holes of the base consisting of the first and second bases, the first hinge shaft may be coupled to the first hinge hole of the base in a non-rotatable manner by the contact between the flat surface formed on the inner surface of the first hinge hole and the flat surface formed on the outer surface of the first hinge shaft.

The first hinge shaft that is exposed to the outside between the first base and the second base facing each other may be configured such that a first end, namely, a lower end of the first link is rotatably coupled thereto and is provided with a first torsion spring that provides an elastic force to the first link.

As shown in FIGS. 7 to 9, the first link 21, which is a link member of a predetermined length, has a connecting hole 21a of a substantially circular shape formed through its one end to correspond to the first hinge shaft 12 exposed between the first and second bases of the base, so as to be rotatably connected to the first hinge shaft 12. The first link 21 may be referred to as a lower arm 21.

It is preferable that a cut-out portion 22 that is cut outward is formed in the first end, namely, the lower end of the first link 21 coupled to the first hinge shaft 12 so as to prevent the interference with a pair of first torsion springs 20 provided in the middle of a length of the first hinge shaft, and another cut-out portion is formed in a second end, namely, an upper end of the first link 21 connected via a second hinge shaft with the second link so as to secure a space to allow the second link, which is laid on top of the first link when folded, to be inserted and disposed without interference.

The first torsion spring 20 is an elastic member provided on the first hinge shaft 12 corresponding to the first end of the first link 21 so that its first end contacts and is engaged to the upper surface of the base integrally including the first and second bases and its second end contacts and is hooked into an engaging groove formed in the first end (i.e., the lower end) of the first link 21, so as to apply an elastic force to allow the first link 21 to pivot upward about the first hinge shaft 12 when switched to an unfolded position. The first torsion spring 20 may be referred to as a first elastic member 20.

In order to prevent a direct contact between an inner surface of the first torsion spring 20, which is elastically deformed during folding and unfolding, and an outer surface of the first hinge shaft, a spacer 23 of a hollow cylindrical shape may be provided in the middle of the length of the first hinge shaft that corresponds to the first torsion spring 20.

Although it is illustrated and described that the first torsion spring 20 is configured as a pair of torsion spring members each having one end positioned between a pair of projections formed on the upper surface of the base to be engaged thereto, the present disclosure is not limited thereto, and the first torsion spring 20 may be configured as a single torsion spring member.

A first nut 25 for separation prevention may be fastened to an end portion of the first hinge shaft 12 via a plurality of first spacer washers 25a. The first spacer washer 25a may be referred to as a washer 25a or a disc spring 25a.

Accordingly, when the first link is pivoted downward as the first link is switched from an unfolded state to a folded state by the force of a user, the second end of the first torsion spring hooked to the lower end of the first link may be torsionally elastically deformed to generate an elastic restoring force by being forcibly moved to the base side.

Conversely, when the first link is switched from the folded state to the unfolded state as the locking unit that restricts the second link when folded is released, the first link may be pivoted upward about the first hinge shaft by an elastic restoring force of the first torsion spring torsionally elastically deformed during folding.

Figure 10:
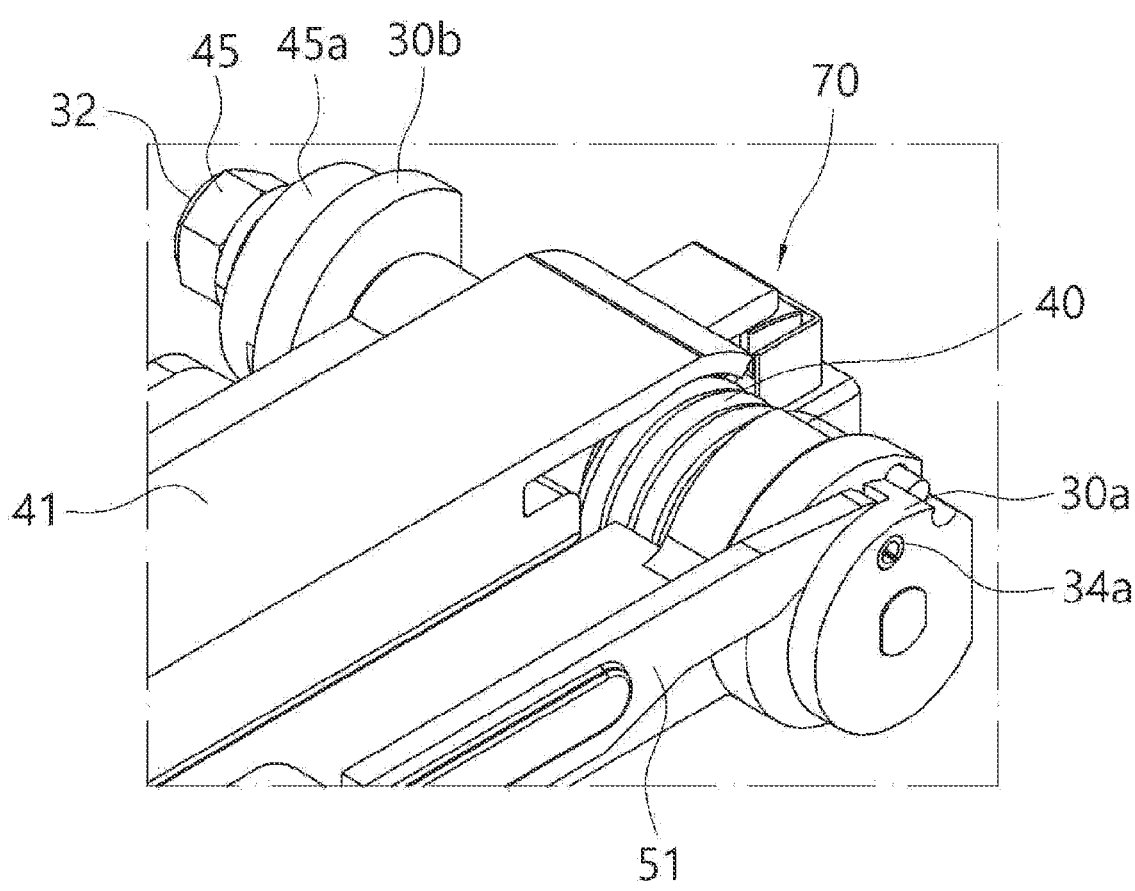
Figure 11:
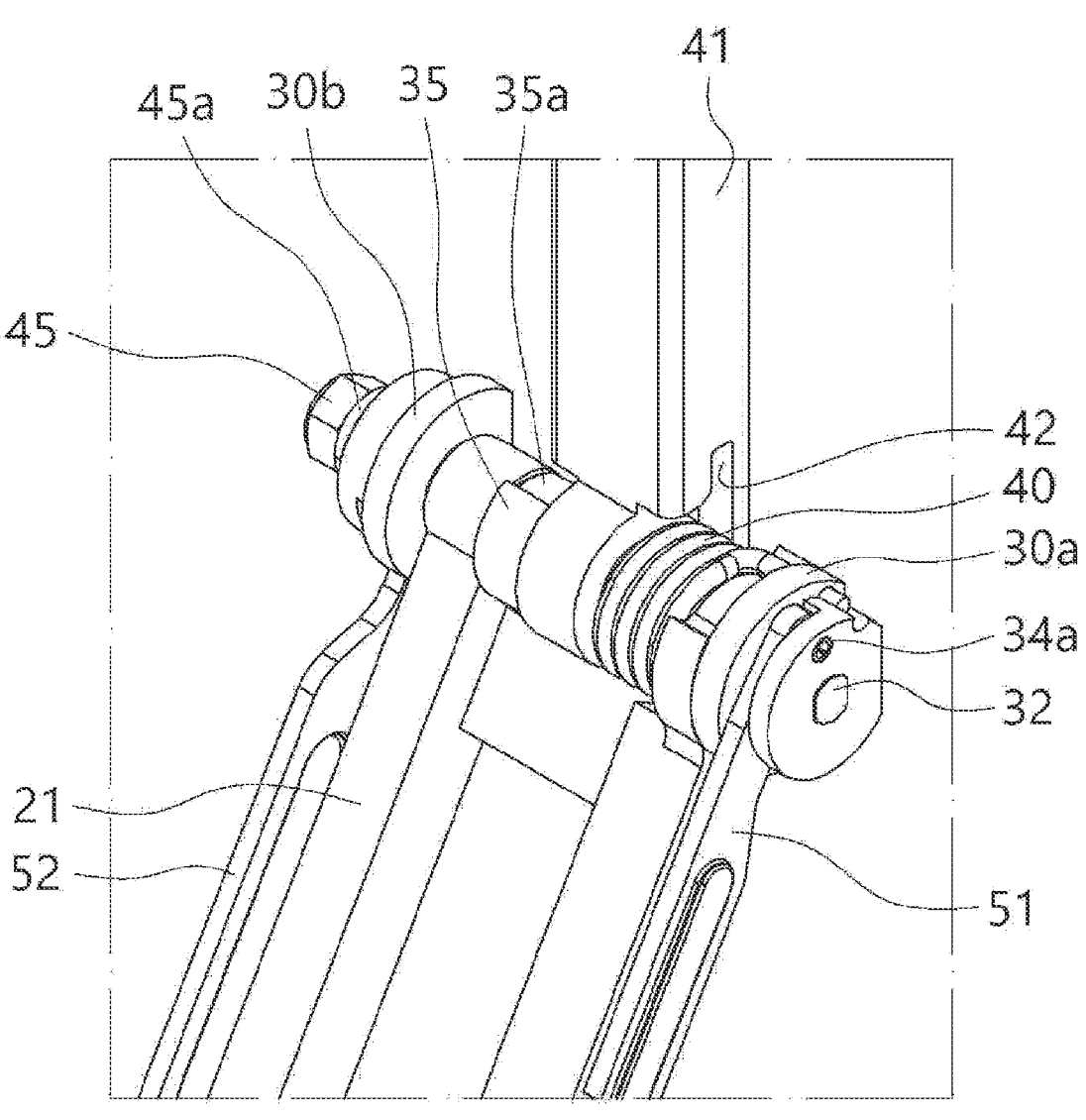
Figure 12:
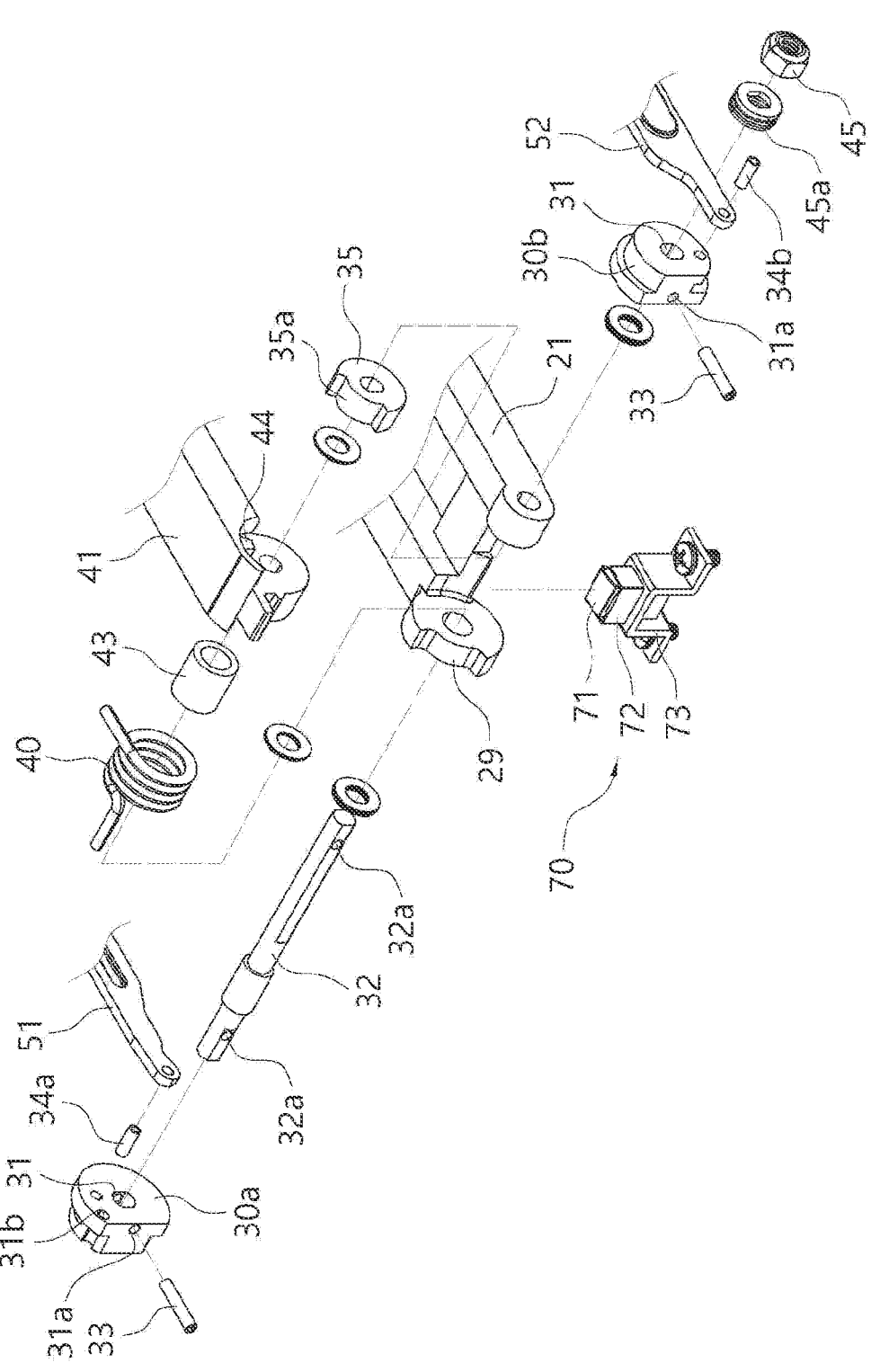

FIGS. 10 and 11 are detailed views illustrating a coupled state between an articulating base, a second link, and a second torsion spring in an unfolded state and a folded state of an arm stand for a display according to an embodiment of the present disclosure; and FIG. 12 is an exploded perspective view illustrating an articulating base, a second link, and a second torsion spring provided at an arm stand for a display according to an embodiment of the present disclosure.

As shown in FIGS. 10 to 12, the articulating bases 30a and 30b each have a second hinge hole 31 formed through the center of a body, and are provided with a second hinge shaft 32 of a predetermined length passing through the second hinge holes, so as to provide a connection between the first link and the second link. The articulating bases 30a and 30b may be referred to as joints 30a and 30b or arm hinges 30a and 30b.

Such articulating bases 30a and 30b may be provided as a pair of structures respectively disposed at opposite ends of the second hinge shaft correspondingly coupled to the second hinge holes.

The second hinge shaft 32, which is a shaft member of a predetermined length, is correspondingly inserted into the second hinge holes 31 so that its opposite ends are respectively exposed to the outside of the pair of articulating bases 30a and 30b.

In the middle of a length of the second hinge shaft 32 coupled to the pair of articulating bases, a connecting hole formed through the second end, namely, the upper end of the first link may be rotatably coupled, a connecting hole formed through a first end, namely, a lower end of the second link may be rotatably coupled, and the second torsion spring 40 disposed between the second end (i.e., the upper end) of the first link and the first end (i.e., the lower end) of the second link may be provided so as to apply an elastic restoring force to the second link.

A first pin hole 31a intersecting the second hinge hole may be formed through each of the pair of articulating bases 30a and 30b, a second pin hole 32a intersecting the second hinge hole may be formed through each of opposite ends of the second hinge shaft 32 corresponding to the pair of articulating bases 30a and 30b, and a pair of fixing pins 33 correspondingly inserted into the first and second pin holes aligned with each other may be provided.

As the fixing pin is coupled to the second hinge shaft by being correspondingly inserted through the first and second pin holes, the second hinge shaft inserted and disposed in the second hinge holes may be configured as a fixed shaft member coupled to the second hinge hole of each of the pair of articulating bases in a non-rotatable manner by the fixing pin.

In addition, the pair of articulating bases 30a and 30b may each define a flat surface, which is in contact with a flat surface formed on an outer surface of the second hinge shaft, on an inner surface of the second hinge hole 31. Accordingly, when the second hinge shaft and the second hinge hole are correspondingly coupled to each other, due to the contact with the flat surface formed on the outer surface of the second hinge shaft 32 and the flat surface formed on the inner surface of the second hinge hole, the second hinge shaft may be coupled to the second hinge hole of the articulating base in a non-rotatable manner while being securely fixed by the fixing pin.

As shown in FIGS. 10 to 12, the second link 41, which is a link member having a predetermined length less than the length of the first link, has a connecting hole of a substantially circular shape formed therethrough to allow the first end, namely, the lower end of the second link 41 to be rotatably connected to the second hinge shaft 32 that passes through the second hinge holes of the pair of articulating bases and is rotatably connected to the second end, namely, the upper end of the first link. The second link 41 may be referred to as an upper arm 41.

The bracket unit 60 detachably coupled to the display D, which is a heavy object, may be fixedly installed at a second end, namely, an upper end of the second link 41.

The second torsion spring 40 is an elastic member having a first end, which is bent, hooked into a fixing hole 31b formed in a recessed manner in an inner surface of one articulating base 30a of the pair of articulating bases, and a second end engaged to a projection formed in a protruding manner on one surface of the first end, namely, the lower end of the second link, so as to apply an elastic restoring force to allow the second link to pivot upward about the second hinge shaft when switched to an unfolded position, while being torsionally elastically deformed to generate an elastic restoring force when switched to a folded position in which the second link 41 is laid flat on top of the first link 21. The second torsion spring 40 may be referred to as a second torsion spring member 40.

As a flat surface in contact with a flat surface formed on the outer surface of opposite ends of the second hinge shaft is formed in each of the second hinge holes 31 of the pair of articulating bases coupled to the second hinge shaft 32, the second hinge shaft coupled to the pair or articulating bases may be restricted in rotation by the fixing pin while being coupled to the second hinge hole in a non-rotational manner.

In addition, the second hinge shaft 32 corresponding to the second torsion spring 40 may be provided with a spacer 43 of a hollow cylindrical shape disposed in a space formed between an inner surface of the second torsion spring 40 and the outer surface of the second hinge shaft.

A second nut 45 for separation prevention may be fastened to a first end of the second hinge shaft 32 via a spacer washer 45a to prevent the separation of the first link, the second link, and the third link. The spacer washer 45a may be referred to as a washer 45a or a disc spring 45a.

In addition, a stopper plate 35 coupled to the middle of a length of the second hinge shaft 32 in a non-rotatable manner so as to be disposed between the first end (i.e., the lower end) of the second link 41 and one articulating base 30b of the pair of articulating bases may be provided, and an arcuate engaging guide groove 35a by which a positioning projection 44 formed on the first end of the second link is guided and moved in a contact manner to be engaged therewith may be formed in a recessed manner in an outer surface of the stopper plate 35 that corresponds to the first end of the second link 41, so as to restrict a rotational movement of the second link pivoting about the second hinge shaft in a direction opposite to the first link when converting between an unfolded position and an folded position.

Another arcuate engaging guide groove 29 by which a bent portion of the torsion spring hooked to the articulating base 30a is guided and moved in a contact manner to be engaged therewith may be formed in a recessed manner in an outer surface of the second end, namely, the upper end of the first link 21 corresponding to the articulating base 30a of the pair of articulating bases, so as to prevent a rotational movement of the first link pivoting about the second hinge shaft in a direction opposite to the second link when converting between an unfolded position and a folded position.

Accordingly, while the second link pivoting about the second hinge shaft to convert the position between the folded position and the unfolded position, it is possible to control a pivoting movement of the second link at a predetermined angle by the positioning projection moved along the arcuate engaging guide groove formed in the stopper plate to be engaged with an end portion of the arcuate engaging guide groove and the bent portion of the second torsion spring.

Figure 13:
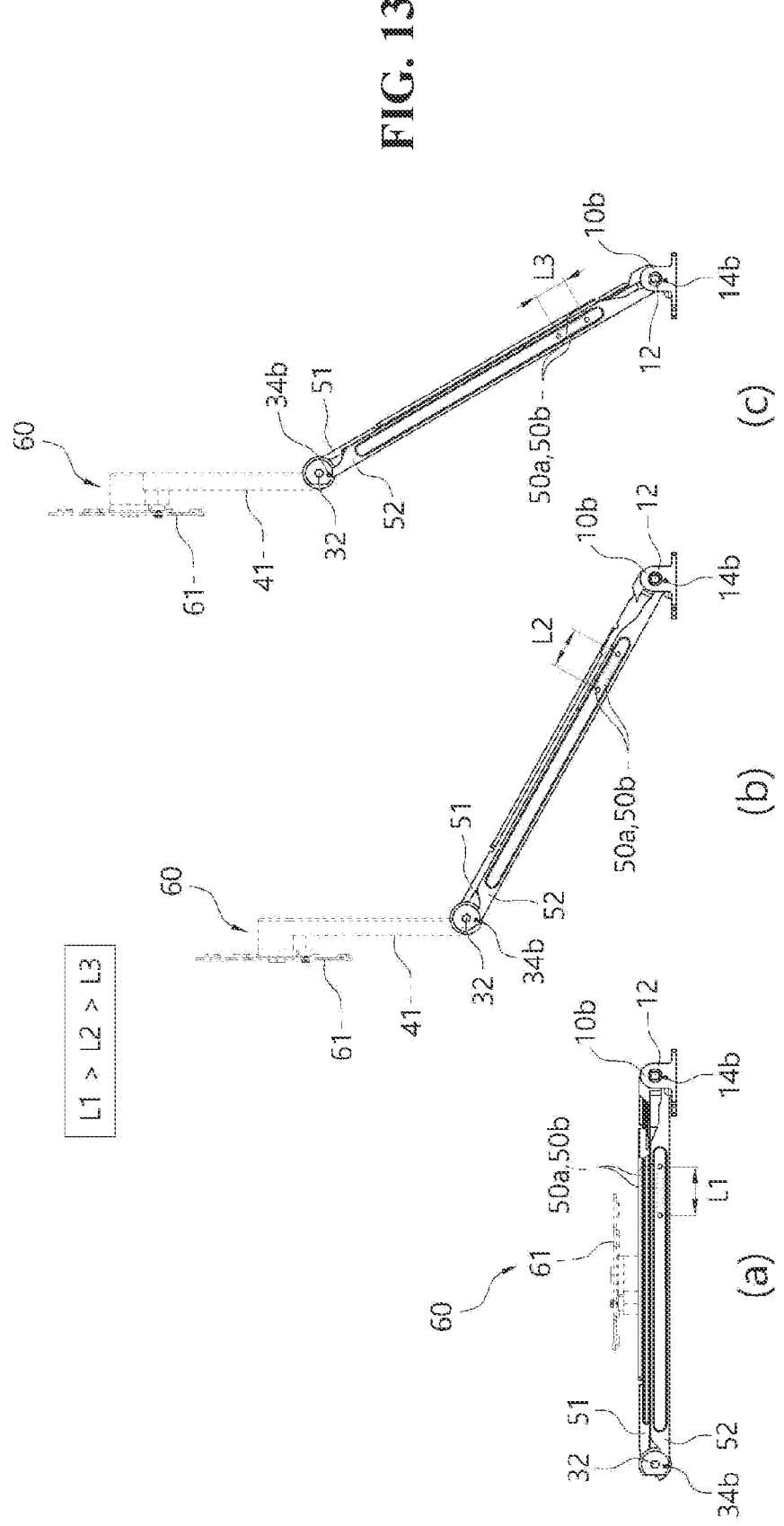

As shown in FIGS. 11, 12, and 13, the third links 51 and 52, which are link members of a predetermined length, each have both ends rotatably connected to the pair of articulating bases 30a and 30b, respectively, which provide a connection between the first and second bases 10a and 10b of the base 10 fixed on the flat surface and the first and second links, so as to be disposed at opposite sides of the first link, respectively. The third link 51 may be referred to as a first bar 51, and the third link 52 may be referred to as a second bar 52.

A connecting hole, which is ratably connected with a first upper pin 14a correspondingly inserted into an upper pin hole formed in a penetrating manner to be eccentric upward from the first hinge hole of the first base 10a of the first and second bases constituting the base, may be formed through a first end of the third link 51 of the pair of third links corresponding to the base 10, and another connecting hole, which is rotatably connected with a second upper pin 34a correspondingly inserted into another upper pin hole formed in a penetrating manner to be eccentric upward from the second hinge hole of the articulating base 30a of the pair of articulating bases 30a and 30b, may be formed through a second end of the third link 51 corresponding to the articulating base 30a of the pair of articulating bases.

A connecting hole, which is rotatably connected with a first lower pin 14b formed in a penetrating manner to be eccentric downward from the first hinge hole of the second base 10b of the first and second bases constituting the base, may be formed through a first end of the third link 52 of the pair of third links, and another connecting hole, which is rotatably connected with a second lower pin 34b formed in a penetrating manner to be eccentric downward from the second hinge hole of the articulating base 30b of the pair of articulating bases, may be formed through a second end of the third link 52 of the pair of third links.

The third link 51 has opposite ends rotatably connected to the first upper pin 14a of the first base and the second upper pin 34a of one articulating base, and the third link 52 has opposite ends rotatably connected to the first lower pin 14b of the second base and the second lower pin 34b of the other articulating base, so that the pair of third links 51 and 52 are disposed at opposite sides of the first link with a height difference to be parallel with the first link.

It is preferable that a slit groove is formed in a cut-out manner in the outer surface of the first and second bases having the first upper and lower pins so that the first end of the third link is rotated without being caught when converting the position together with the first link, and another slit groove is formed in a cut-out manner in the outer surface of the pair of articulating bases having the second upper and lower pins so that the second end of the third link is rotated without being caught when converting the position together with the first link.

As shown in FIGS. 3, 4, 5, and 6, a pair of tension springs 50a and 50b, which are coiled spring members, have first ends respectively hooked to both sides of the middle of the length of the first link 21 and second ends respectively hooked to both inner sides of the middle of a length of the third link, so as to apply, together with the first torsion spring, an elastic restoring force to the first link pivoting upward about the first hinge shaft 12 when unfolded, and to provide a reaction force to prevent a rapid downward rotation of the first link pivoting about the first hinge shaft 12 due to the weight (or load) of the display when folded. The tension spring 50a, 50b may be referred to as a third elastic member 50a, 50b.

The first end of each of the pair of tension sprigs 50a and 50b may be hooked to a hanging bar provided to each of opposite sides of the first link, and the second end of each of the pair of tension springs may be hooked to a bent portion bent from the inner side of each of the pair of third links disposed at opposite sides of the first link toward the first link side.

The pair of tension springs 50a and 50b may be disposed between opposite sides of the first link and the inside of the first link 21 while being adjacent to the base, and a cut-out portion cut inward may be provided at each of opposite sides of the first link 21 adjacent to the base to secure a space in which the respective pair of tension springs 50a, 50b are disposed.

FIG. 13 is a schematic view illustrating an arm stand for a display in transition from a folded state to an unfolded state, according to an embodiment of the present disclosure. In the folded state in which the first link is folded in parallel with the flat surface, when the first link is rotated upward in a clockwise direction in the drawing, since the pair of third links 51 and 52 arranged side by side with different heights on opposite sides of the first link are pivoted upward about the first and second upper and lower pins eccentrically disposed adjacent to the first and second hinge shafts while maintaining a parallel state with the first link, a distance between opposite ends of each of the pair of tension springs 50a and 50b decreases in the order of L1>L2>L3 as the engaging position where the second ends of the pair of tension springs 50a and 50b are respectively connected to the pair of third links is moved closer to the engaging position where the first ends of the pair of tension springs 50a and 50b are connected to the first link.

Accordingly, when the first link is switched from the folded state to the unfolded state for using the display, an elastic restoring force generated while the pair of tension springs stretched to the fullest extent are contracted and restored to their original state may be transferred to the first link in addition to an elastic restoring force from the first torsion spring, allowing the first link pivoting upward about the first hinge shaft with a large and heavy display mounted thereto to be more stably rotated. In addition, the elastic modulus of the first torsion spring that provides the elastic restoring force when the first link pivots upward to be switched to the unfolded state may be reduced, thereby increasing the degree of freedom in design.

In addition, as shown in FIG. 1, when switching from the folded state to the unfolded state, a pivoting angle for the first link to pivot upward about the first hinge shaft by the elastic restoring force of the first torsion spring and the tension spring is set to be similar to a pivoting angle for the second link to pivot upward about the second hinge shaft by the elastic restoring force of the second torsion spring, and thus, the display may be raised to a certain height while maintaining the display in a horizontal state, and then be converted to a vertical state.

Conversely, in the unfolded state in which the first link is in a slantly standing position as the first link is pivoted upward, when the first link is rotated downward about the first hinge shaft in a counterclockwise direction in the drawing, since the pair of third links are pivoted downward about the upper and lower pins eccentrically disposed adjacent to the first hinge shaft while maintaining a parallel state at opposite sides of the first link, a distance between opposite ends of each of the pair of tension springs 50a and 50b increases in the order of L3<L2<L1 as the engaging position where the second ends of the pair of tension springs are respectively connected to the pair of third links are moved away from the engaging position where the first ends of the pair of tension springs 50a and 50b are connected to the first link.

Accordingly, when the first link is switched from the unfolded state to the folded state for storing the display device after use, an elastic restoring force may be generated while the pair of tension springs contracted and restored to their original state when unfolded are stretched in the longitudinal direction.

Due to this elastic restoring force, the weight of the heavy large display mounted on the bracket unit of the second link may be distributed, thereby preventing the first link from rotating suddenly downward about the first hinge shaft while allowing the first link to be rotated more stably. In addition, the degree of freedom in design may be increased by reducing the elastic modulus of the first torsion spring.

Further, while the first link pivots downward about the first hinge shaft in the transition from the folded state to the unfolded state, as shown in FIG. 2, the display mounted on the bracket unit of the second link may be lowered while maintaining a vertical state until the first end, namely, the lower end of the second link is engaged and restricted by the locking unit.

In addition, as the pair of third links 51 and 52 are arranged in parallel on one side and the other side of the first link 21, when the first link is rotated upward to be switched from the folded state to the unfolded state or is rotated downward to be switched from the unfolded state to the folded state, an external force transferred directly or indirectly to the first link due to the weight of the display, which is a heavy object, may be distributed to the left and right by the third links arranged at the outside of opposite sides of the first link, thereby preventing deformation or damage of the first link without excessively increasing the section modulus and strength of the first link, which is a key component. Thus, it is possible to achieve an optimal arm stand suitable for mounting a larger and heavier display. Also, it is possible to reduce the size of the elastic force to be borne by the torsion spring that applies the elastic force to the first link, and thus, the size of the torsion spring may be reduced to thereby reduce the size of the base, which is advantageous to achieve a slim profile.

Figure 14:
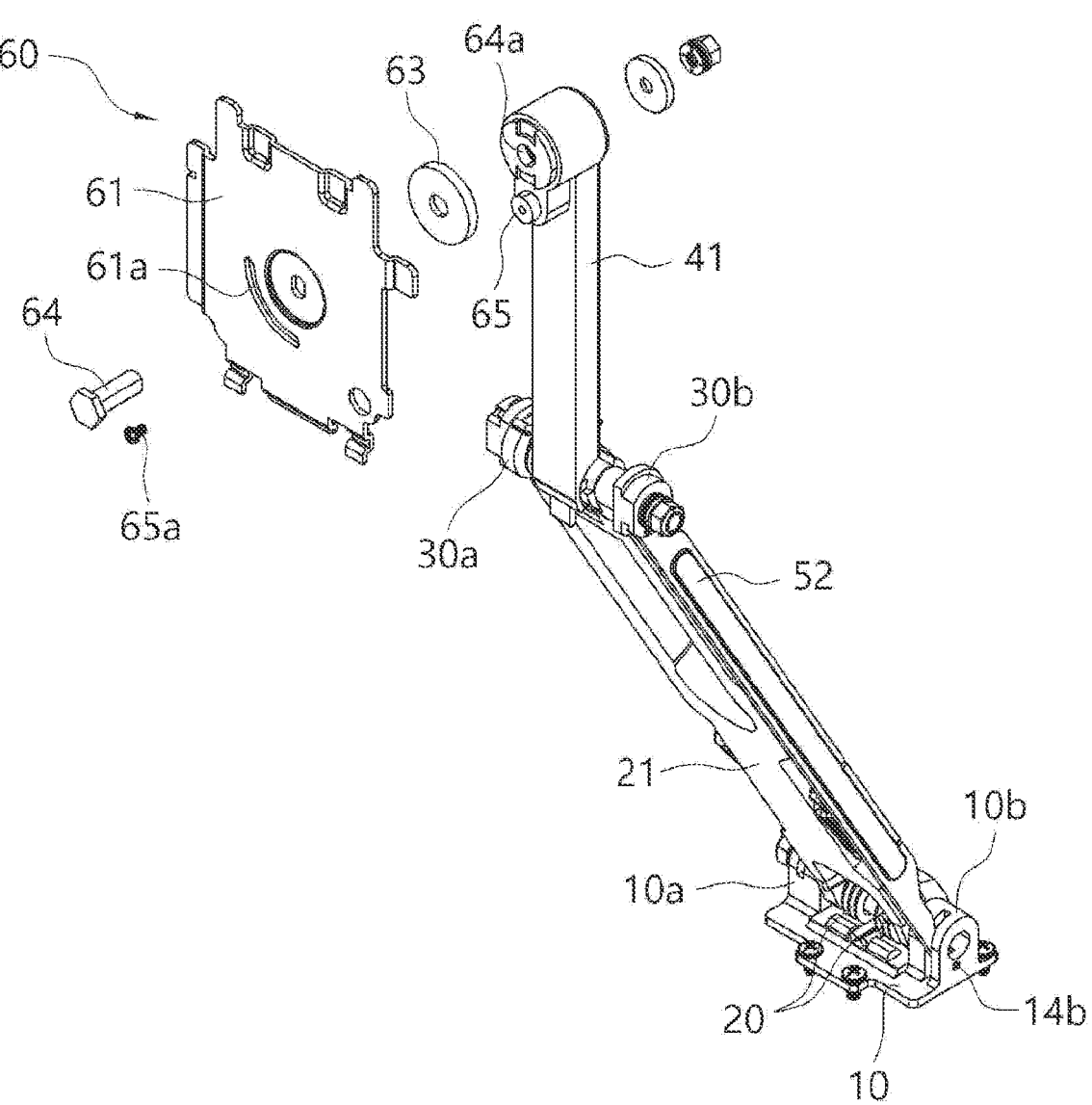
Figure 15:
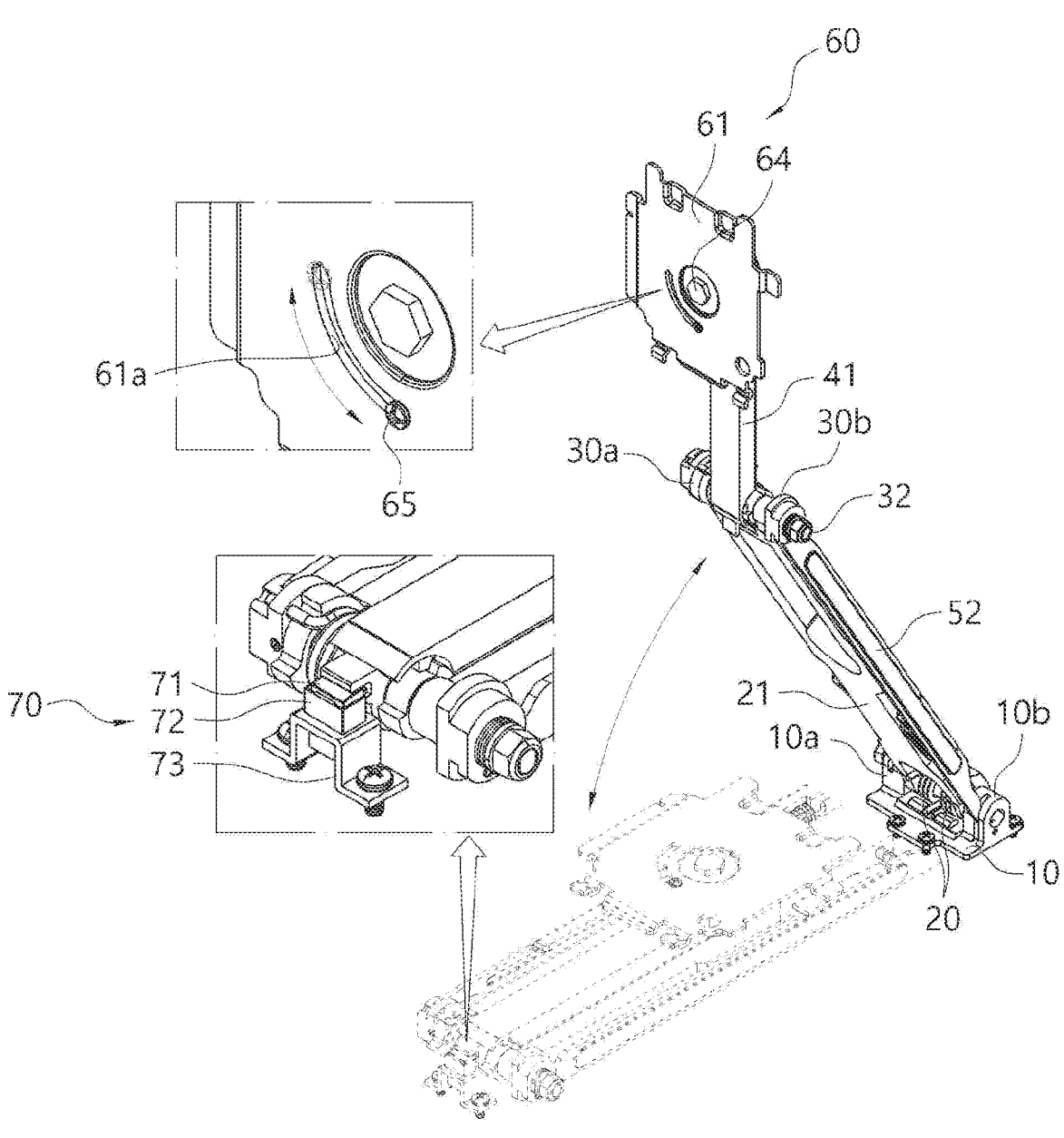

FIG. 14 is a bracket unit provided at an arm stand for a display according to an embodiment of the present disclosure, and FIG. 15 is a detailed view illustrating a locking unit provided at an arm stand for a display according to an embodiment of the present disclosure.

As shown in FIGS. 14 and 15, the bracket unit 60 may have a rotating plate 61 of a substantially square plate shape rotatably coupled to a tip of a rotation support shaft 64 provided at the second end of the second link 41 so as to be detachably connected to the rear surface of the display D. The bracket unit 60 may be referred to as a bracket 60. The bracket 60 may be detachably coupled to a back cover of the display D. The display D may include an LCD panel or an OLED panel that is opposite the back cover and configured to display an image. When the display D has an LCD panel, the display D may include a backlight unit to provide light to the LCD panel.

The rotation support shaft 64, which is a shaft member of a predetermined length, is coupled in a non-rotatable manner to an assembly hole 64a formed through the second end (i.e., the upper end) of the second link, and is fastened by a nut member to prevent the separation from the assembly hole.

A spacer plate 63 of a substantially disc shape in contact with a rear surface of the rotating plate may be provided for separation between the rotating plate 61, rotatably coupled to the tip of the rotation support shaft, and the second end of the second link having the assembly hole, so as to facilitate the rotation of the rotating plate.

In addition, a pin support 65 having an engaging pin member 65a at its tip may be provided at the second end of the second link 41 that corresponds to the rotating plate, and the rotating plate 61 corresponding to the engaging pin member may include an arcuate guide slit 61a formed in a penetrating manner at a rotation angle of approximately 90 degrees to allow the engaging pin member to be guided and moved.

Accordingly, the rotating plate detachably connected to the rear surface of the display may be rotated about 90 degrees in a forward direction or a reverse direction about the rotation support shaft, thereby allowing the display to be rotatably moved.

In addition, when the rotating plate is rotatably moved, the engaging pin member may be engaged by being guided and moved along the arcuate guide slit, allowing a user to be easily and freely change the mode of the display in landscape mode or in portrait mode as desired.

As shown in FIGS. 14 and 15, the locking unit 70 may selectively restrict the first end of the second link 41 that corresponds to the pair of articulating bases to maintain a folded state in which the first link 21 and the second link 41 are laid flat by being folded with respect to the second hinge shaft 32, or may selectively release a constraint on the first end, namely the lower end of the second link to be switched to a unfolded state achieved by the first link and the second link being pivoted upwardly in opposite directions about the first and second hinge shafts.

The locking unit 70 may include a striker 71 detachably provided at the first end of the second link 41 that corresponds to the articulating base, a push-type latch 72 having a snap fit in which a lower end of the striker is fittingly inserted to be fixed, and a latch holder 73 that allows the push-type latch to be fixedly installed on the flat surface on which the base is fixedly installed.

Here, the locking unit is illustrated and described as a push-type latch, but is not limited thereto. An actuator such as a solenoid that generates an external force to cause a latching force on one end of the second link when power is applied as the first and second links overlapping each other approach the flat surface or a manual latching mechanism such as a latching pin may be used.

Referring to FIGS. 1 to 15, an arm stand for a display may include: a base provided with a first hinge shaft coupled to a first hinge shaft formed through a body thereof to be fixedly installed on a flat surface; a first link having a first end rotatably coupled to the first hinge shaft; a first torsion spring provided on the first hinge shaft in such a manner that a first end thereof is engaged to the base and a second end thereof is engaged to the first end of the first link so as to apply an elastic force to the first link; a pair of articulating bases provided with a second hinge shaft coupled to a second hinge shaft formed through a body thereof; a second link having a first end rotatably coupled to a middle of a length of the second hinge shaft; a second torsion spring having a first end engaged with one articulating base of the pair of the articulating bases and a second end engaged with the first end of the second link so as to apply an elastic force to the second link; a pair of third links having opposite ends rotatably coupled to the first and second bases and the pair of articulating bases to be disposed at opposite sides of the first link; a pair of tension springs each having a first end engaged with the first link and a second end engaged with the third link so as to apply an elastic force to the first link; a bracket unit having a rotating plate rotatably coupled to a tip of a rotation support shaft provided at the second end of the second link so as to be coupled to a rear surface of the display; and a locking unit that restricts the second link to maintain a folded state in which the first and the second links are folded with respect to the first and second hinge shafts, or releases the engagement with the second link to be switched to an unfolded state, which is achieved by the first link and the second link being pivoted about the first and second hinge shafts.

The base may include a pair of left and right bases, namely, a first base that defines a flat surface, which is in contact with a flat surface formed on an outer surface of a first end of the first hinge shaft, on an inner surface of a hinge hole, and a second base that defines a flat surface, which is in contact with a flat surface on an outer surface of a second end of the first hinge shaft, on an inner surface of a hinge hole.

A first pin hole intersecting the second hinge hole may be formed through each of the articulating bases, and a second pin hole intersecting the second hinge hole may be formed through each of opposite ends of the second hinge shaft corresponding to the articulating bases, and the second hinge shaft may be coupled to the second hinge hole in a non-rotatable manner by a fixing pin correspondingly inserted into the first and second pine holes aligned with each other.

The arm stand for a display may include a stopper plate coupled to the second hinge shaft in a non-rotatable manner so as to be disposed between the first end of the second link and one articulating base of the pair of the articulating bases, and an arcuate engaging groove may be formed in a recessed manner in an outer surface of the stopper plate to allow a positioning projection formed in a protruding manner on the second end of the second link to be engaged therewith while being guided and moved.

Another arcuate guide groove may be formed in a recessed manner in an outer surface of the second end of the first link that corresponds to the other articulating base of the pair of the articulating bases to allow a bent portion of the torsion spring hooked to the other articulating base to be engaged therewith while being guided and moved.

A pin support body having an engaging pin member at a tip thereof may be provided at the second end of the second link where the rotation support shaft is installed, and an arcuate guide slit may be formed through the rotating plate at a rotation angle of 90 degrees to allow the engaging pin member to be guided and moved.

Figure 16:
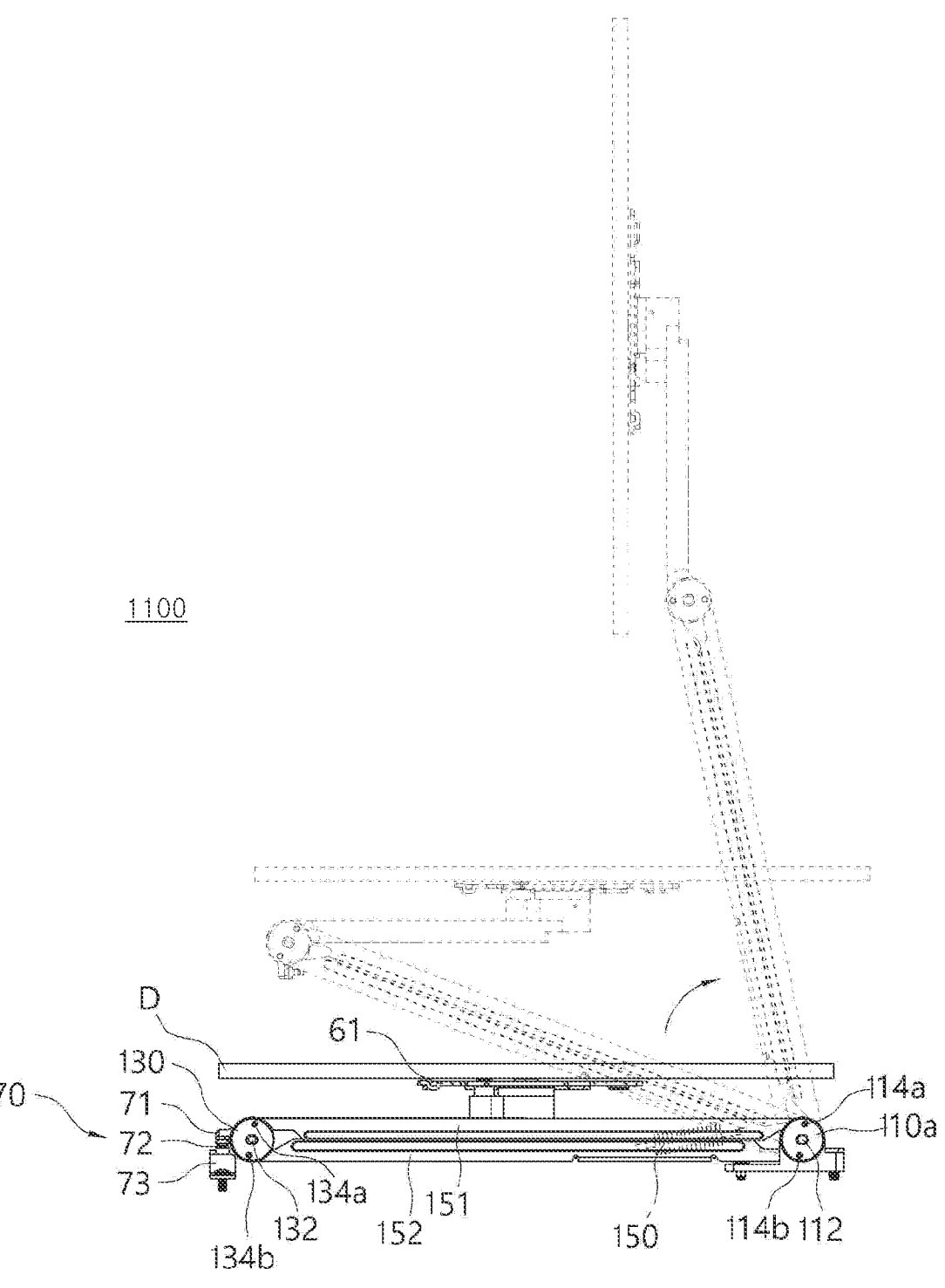
Figure 17:
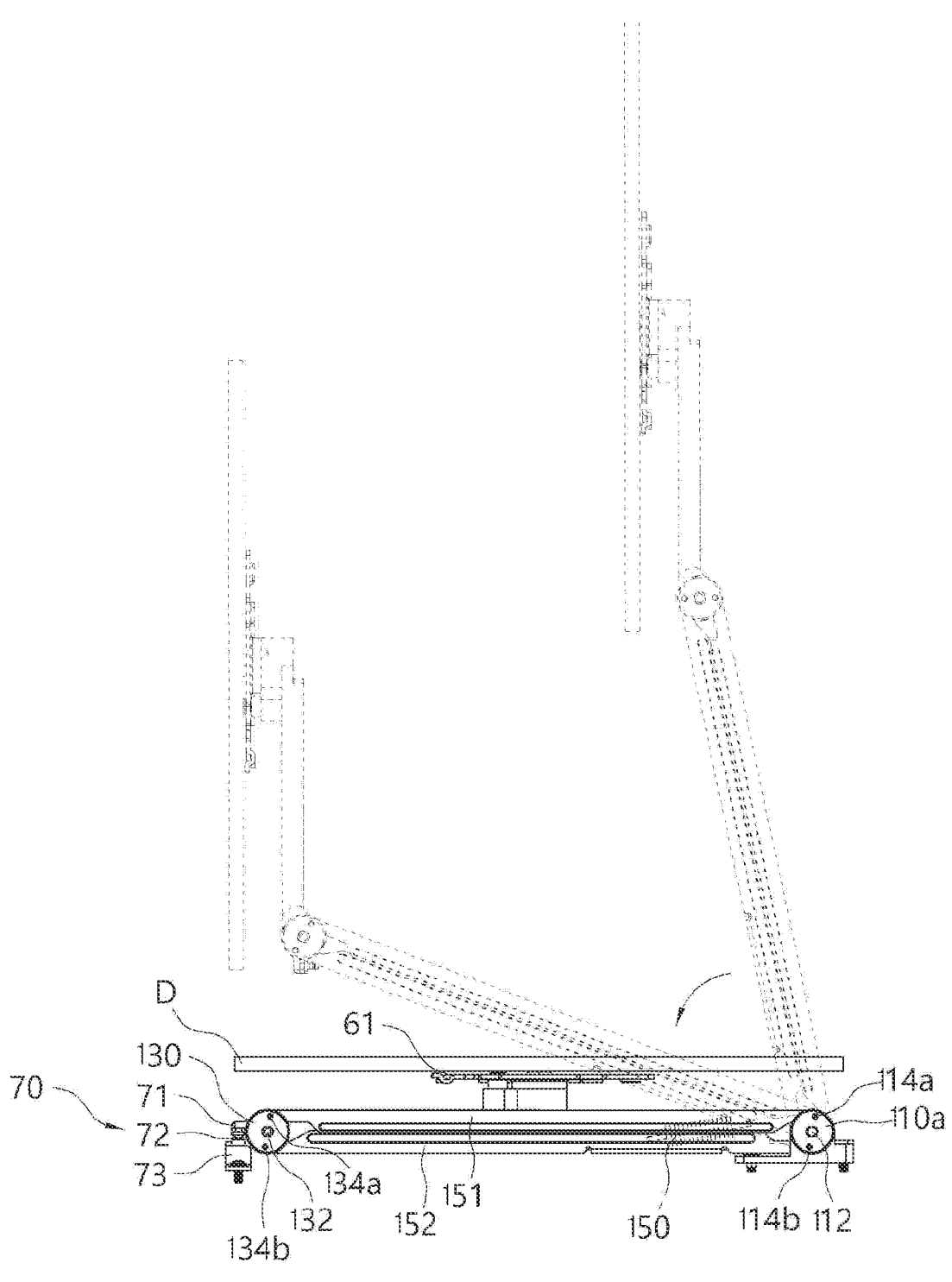
Figure 18:
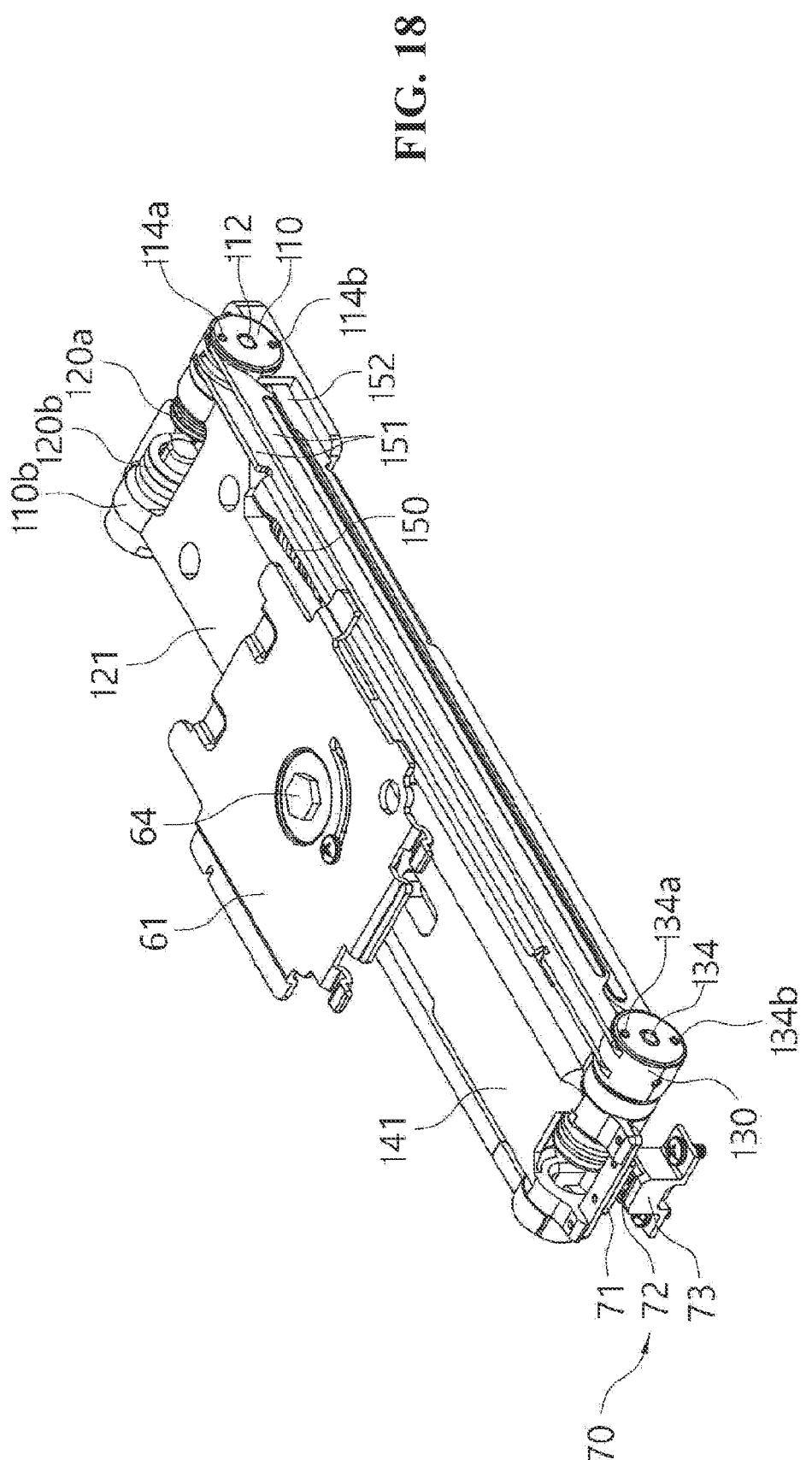
Figure 19:
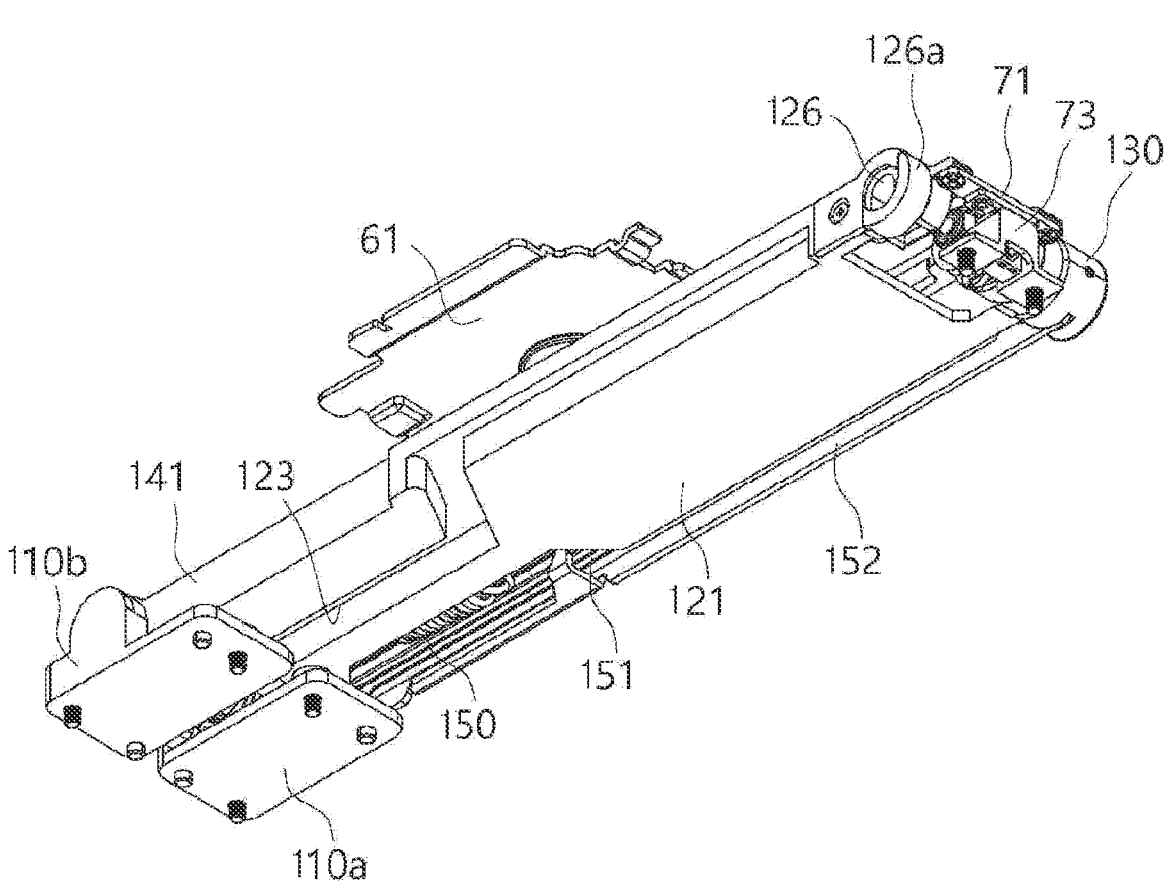
Figure 20:
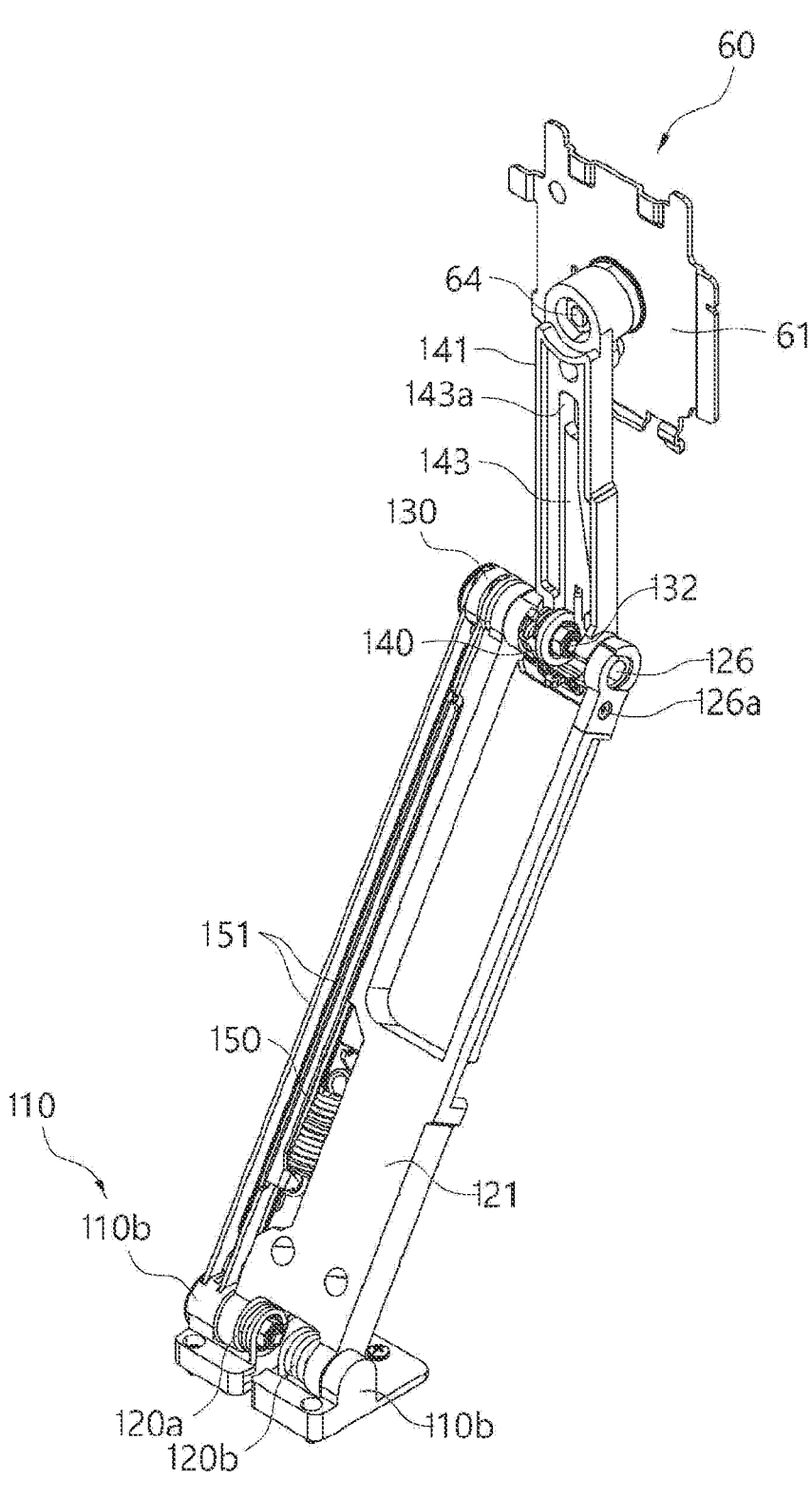
Figure 21:
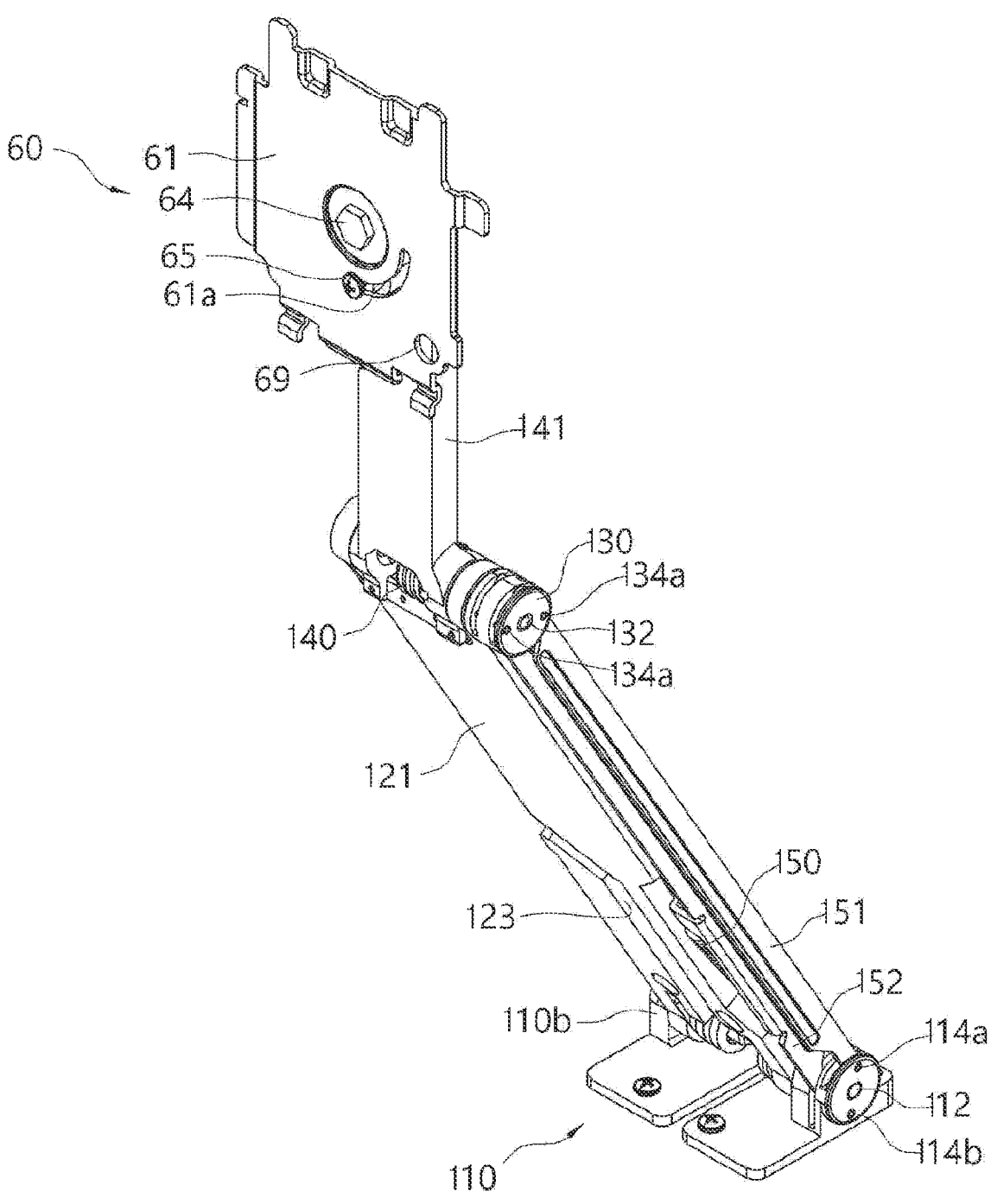
Figure 22:
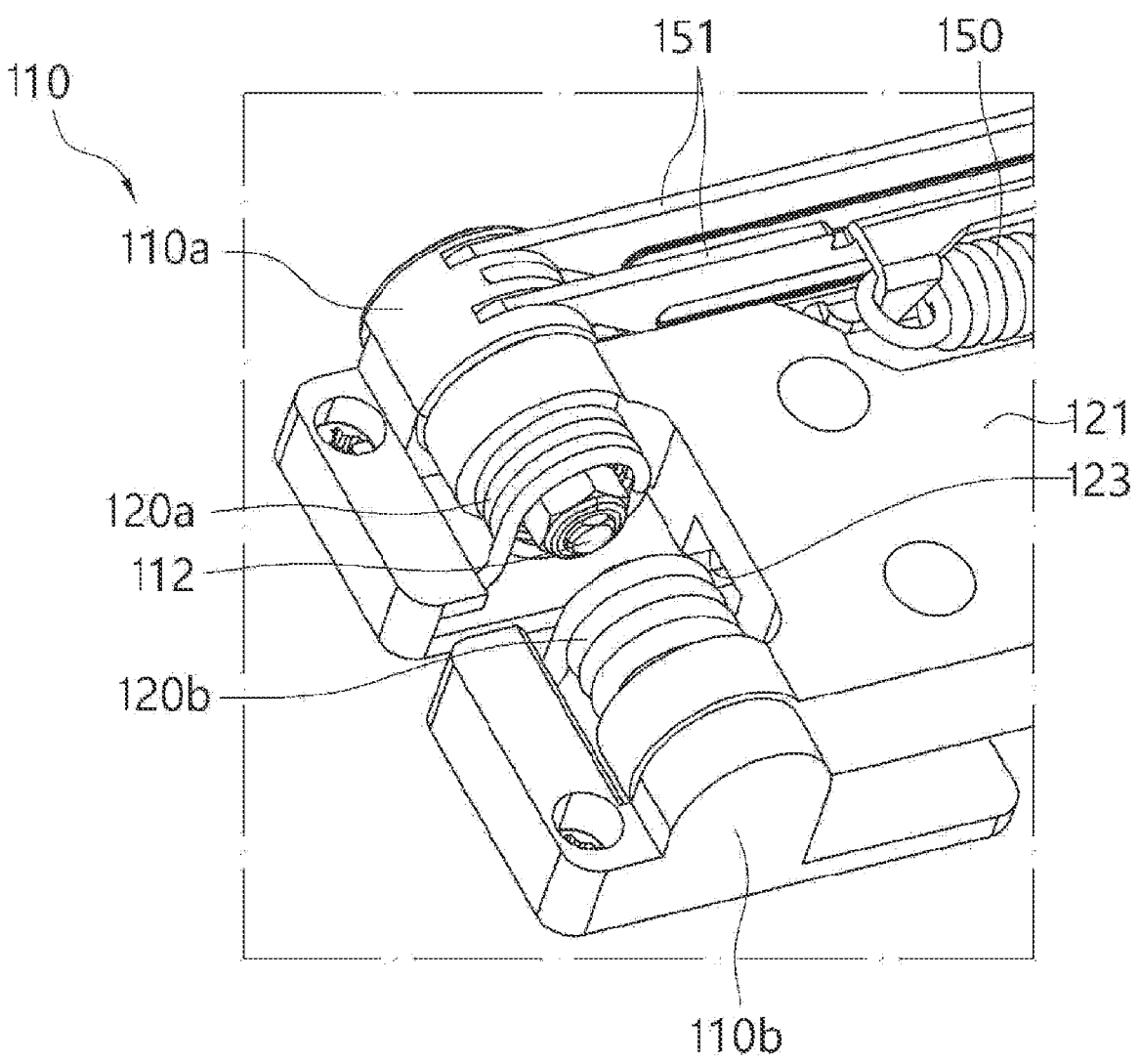
Figure 23:
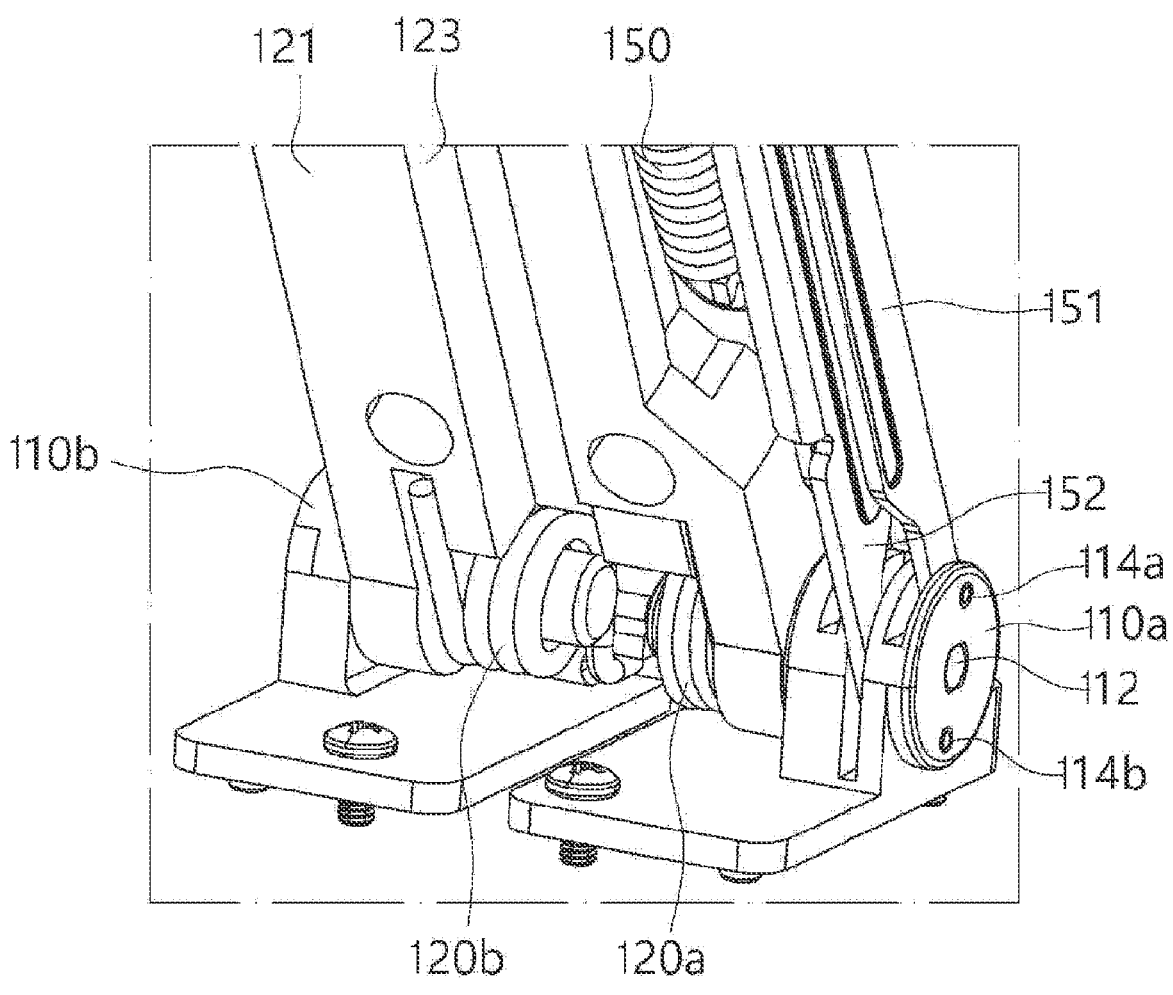
Figure 24:
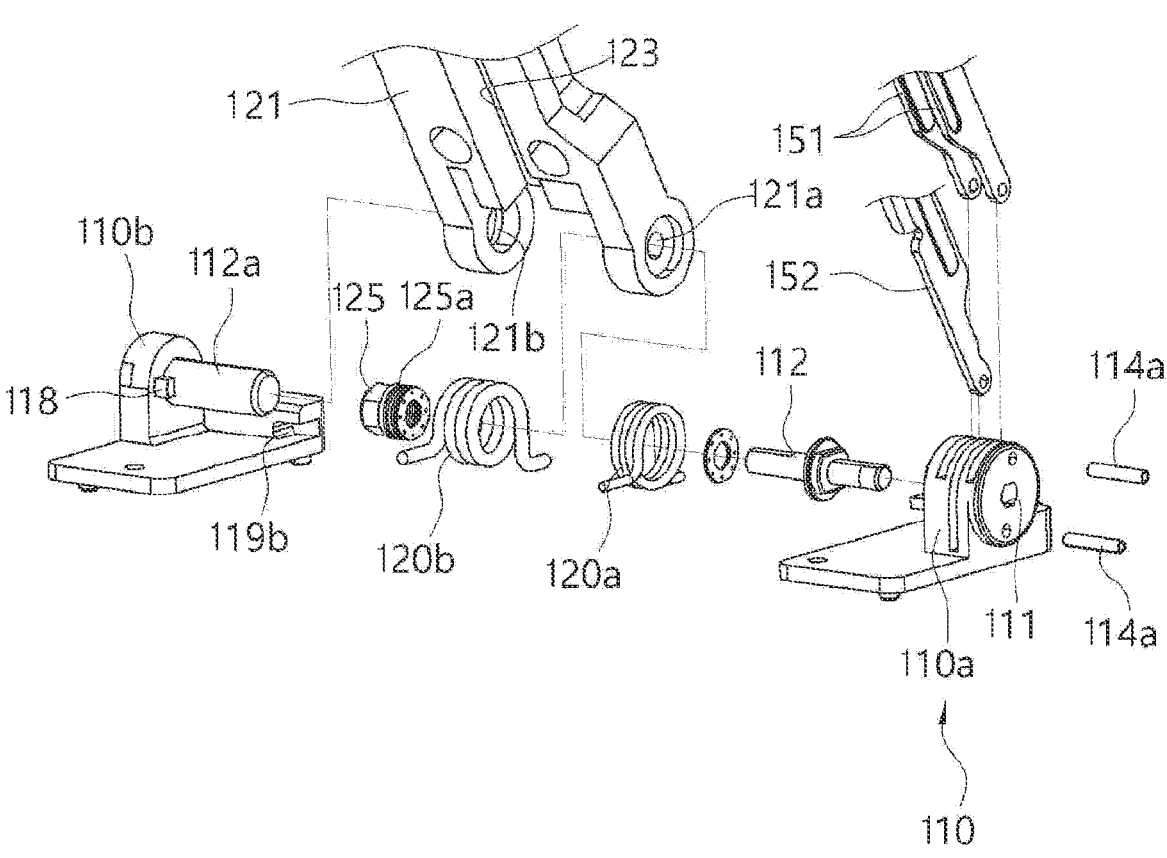
Figure 25:
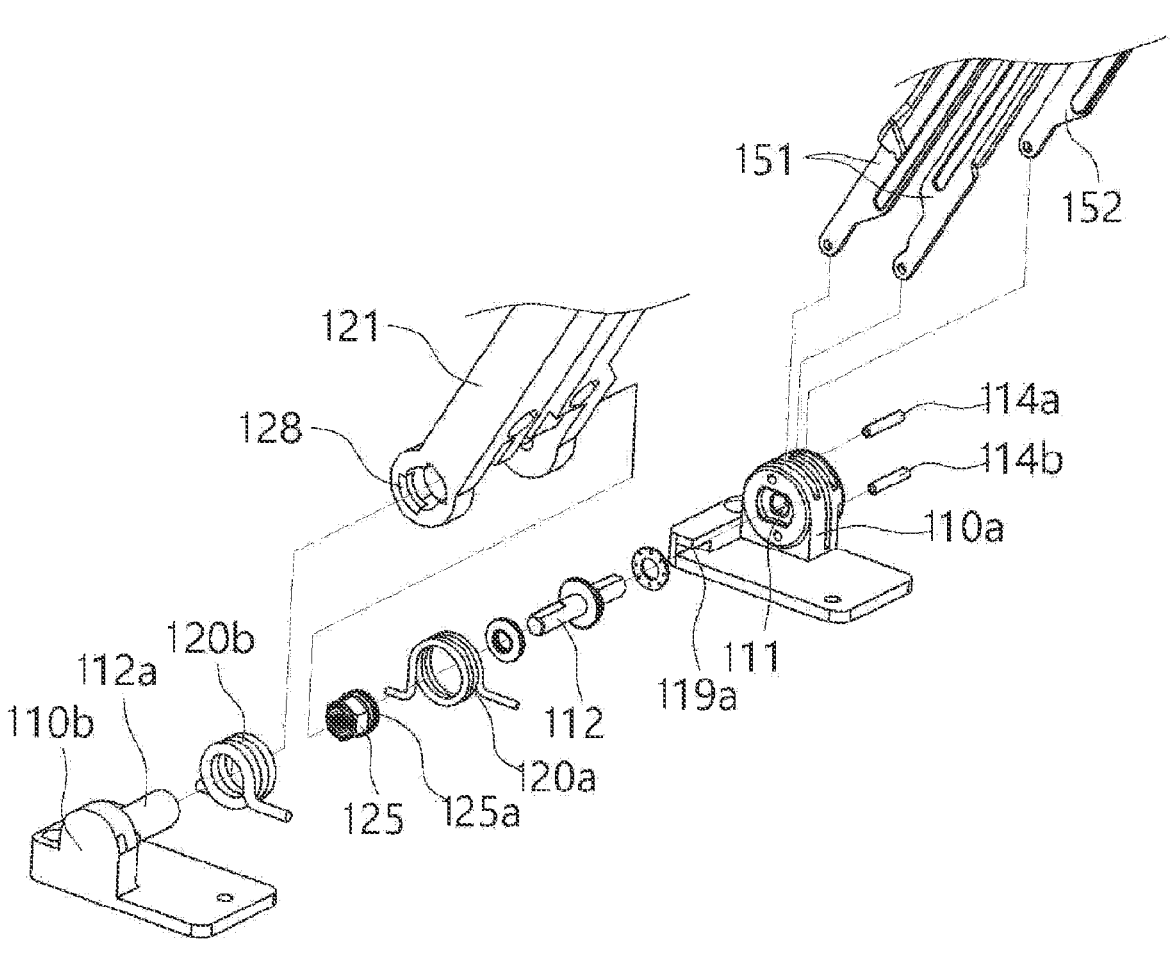

FIGS. 16 and 17 are schematic views illustrating a state of switching between a folded position and an unfolded position of an arm stand for a display according to an embodiment of the present disclosure; FIGS. 20 and 21 are perspective views illustrating an unfolded state of an arm stand for a display according to an embodiment of the present disclosure; FIGS. 22 and 23 are detailed views illustrating a coupled state between a base, a first link, and a first torsion spring in an unfolded state and a folded state of an arm stand for a display according to an embodiment of the present disclosure; and FIGS. 24 and 25 are exploded perspective views illustrating a base, a first link, and a torsion spring that are provided at an arm stand for a display according to an embodiment of the present disclosure.

As shown in FIGS. 16 to 21, an arm stand 1100 for a display of this embodiment may include a base 110, a first link 121, a pair of first torsion springs 120a and 120b, an articulating base 130, a second link 141, a second torsion spring 140, third links 151 and 152, a tension spring 150, a bracket unit 60, and a locking unit 70, so as to be smoothly and stably switched from a folded state to an unfolded state when a display D is in use, and from the unfolded state to the folded state when the display D is not in use. The arm stand 1100 for a display may be referred to as a display stand 1100, a monitor arm 1100, a stand 1100, or a supporter 1100. The display D and the arm stand 1100 for a display may be collectively referred to as a display device. The display D may be referred to as a display unit D, a display module D, or a head D. The first link 121 and the second link 141 may be collectively referred to as a foldable link (121, 141). The third links 151 and 152 may be referred to as bars 151 and 152, auxiliary links 151 and 152, or support links 151 and 152.

As shown in FIGS. 22 to 25, the base 110 includes a first base 110a provided with a first hinge shaft 112 coupled to a first hinge hole 111 formed through a body and a second base 110b provided with a hinge shaft 112a of a predetermined length integrally formed with its one surface corresponding to the first hinge shaft, so as to be detachably installed on a flat surface by a plurality of fastening members.

Such a base 110 is a structure in which the first and second bases are fixedly installed on the flat surface of a table or on the bottom surface of a pit depressed to a certain depth.

The first base 110a may define a flat surface, which is in contact with a flat surface formed on an outer surface of the first hinge shaft, on an inner surface of the first hinge hole 111. Accordingly, when the first hinge shaft and the first hinge hole are correspondingly coupled to each other, the first hinge shaft may be coupled to the first hinge hole in a non-rotatable manner by the contact between the flat surface formed on the outer surface of the first hinge shaft 112 and the flat surface formed on the inner surface of the first hinge hole.

A first end, namely, a lower end of the first link may be rotatably coupled to the first hinge shaft 112, and a first torsion spring 120a of the pair of first torsion springs may be provided on the first hinge shaft 112.

The second base 110b may be provided with the hinge shaft 112a integrally formed with its one surface corresponding to the first base in a manner of extending toward the first hinge shaft side by a predetermined length, and the integrally formed hinge shaft 112a which the first end (i.e., the lower end) of the first link is rotatably coupled may be provided with a first torsion spring 120b of the pair of first torsion springs to provide an elastic force to the first link.

As shown in FIGS. 22 to 25, the first link 121, which is a link member of a predetermined length, has connecting holes 121a and 121b of a substantially circular shape formed through the first end (i.e., lower end) thereof to correspond to the first hinge shaft and the integrally formed hinge shaft respectively provided at the first base and the second base of the base, so as to be rotatably connected to the first hinge shaft 112 and the hinge shaft 112a. The first link 121 may be referred to as a lower arm 121.

Other engaging grooves into which second ends of the pair of torsion springs that are respectively hooked into engaging grooves 119a and 119b of the first base and the second base are hooked may be formed in a recessed manner in the first end of the first link 120 coupled to the first hinge shaft 112.

In addition, a cable placement groove 123 in which a cable having a predetermined length and electrically connected to the display is accommodated may be formed in a recessed manner in a lower surface of the first link 121 that corresponds to the flat surface on which the base is fixedly installed.

It is preferable that a cut-out portion is formed in a second end, namely, an upper end of the first link that is connected to the second link via a second hinge shaft, so as to secure a space to allow the second link, which is laid on top of the first link when folded, to be inserted and disposed without interference.

The pair of first torsion springs 120a and 120b are elastic members respectively provided on the first hinge shaft 112 corresponding to the first end of the first link and the integrally formed hinge shaft 112*a* of the second base so that first ends thereof are respectively hooked into the engaging grooves formed in the first and the second bases and second ends thereof are respectively hooked into the engaging grooves formed in the first end, namely, the lower end of the first link, so as to apply an elastic force to allow the first link 121 to pivot upward about the first hinge shaft when switched to an unfolded position. The first torsion springs 120*a* and 120*b* may be referred to as first elastic members 120*a* and 120*b*.

Although it is illustrated and described that the first torsion springs 120*a* and 120*b* are configured as a pair of torsion spring members having first ends respectively disposed at the first hinge shaft and the integrated hinge shaft of the first and second baes, but the present disclosure is not limited thereto, and may be configured as a single torsion spring member disposed on the first hinge shaft and the integrated hinge shaft in such a manner that its first end is engaged with one base of the first and the second bases and its second end is engaged with the first end of the first link.

In addition, a first nut 125 for separation prevention may be fastened to an end portion of the first hinge shaft 112 via a plurality of first spacer washers 125*a*. The first spacer washer 125*a* may be referred to as a washer 125*a* or a disc spring 125*a*.

Accordingly, when the first link is pivoted downward as the first link is switched from an unfolded state to a folded state by the force of a user, the respective second ends of the pair of torsion springs hooked to the first end, namely, the lower end of the first link may be torsionally elastically deformed to generate an elastic restoring force by being forcibly moved to the side of the first and second bases.

Conversely, when the first link is switched from the folded state to the unfolded state, the first link may be pivoted upward about the first hinge shaft by an elastic restoring force that enables the first torsion spring elastically deformed when folded to returns itself to its original state.

Figure 26:
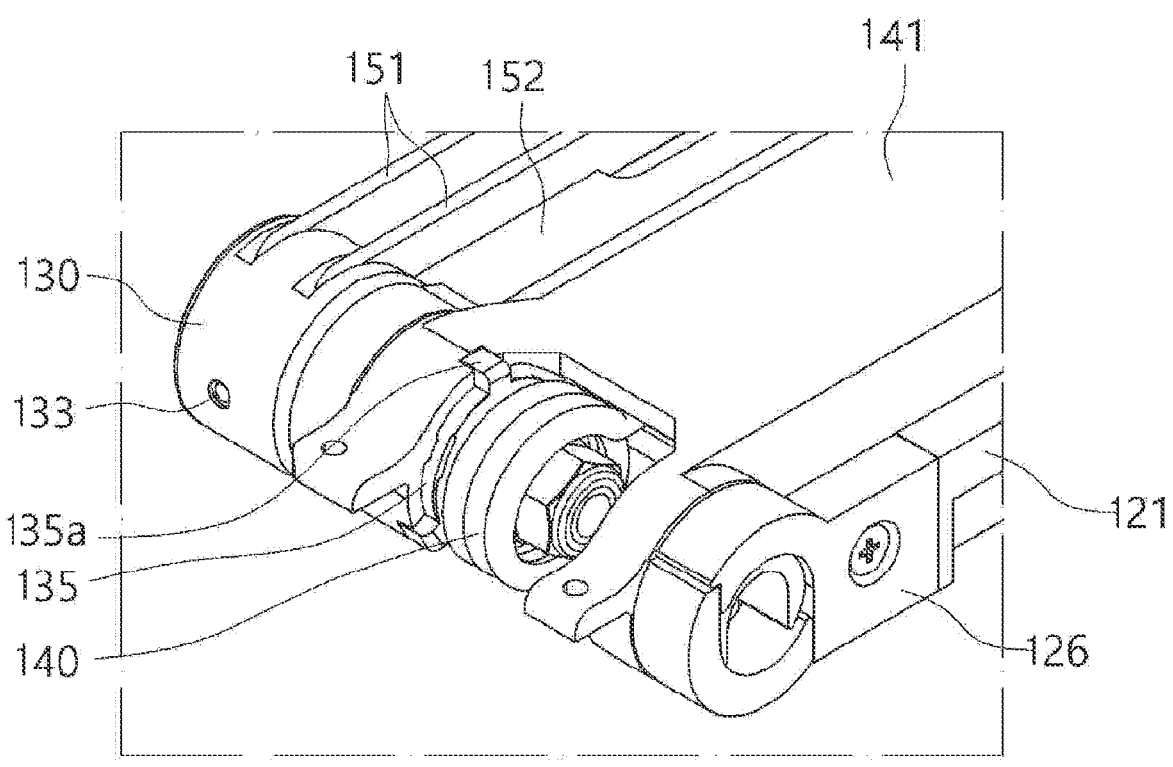
Figure 27:
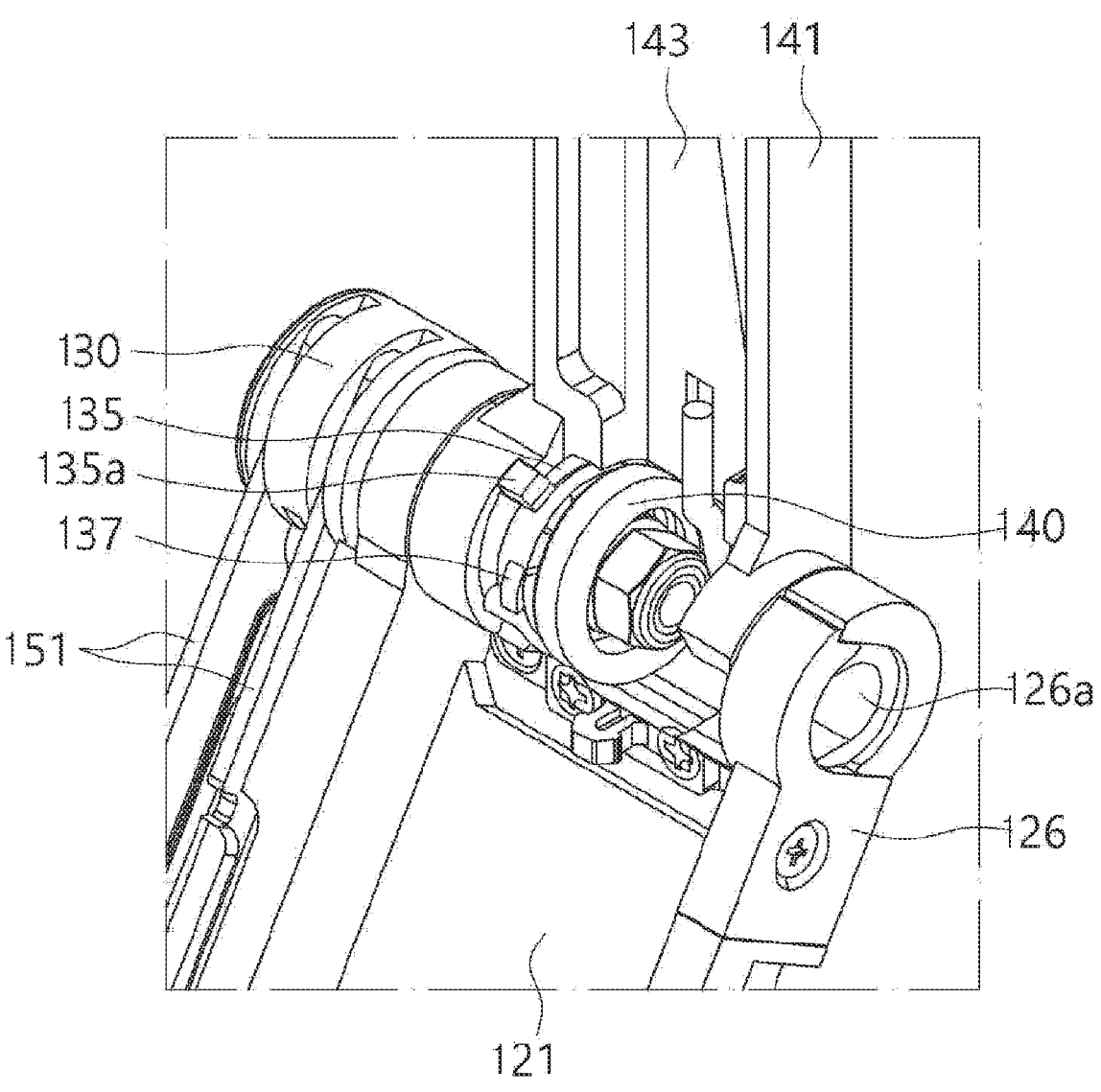
Figure 28:
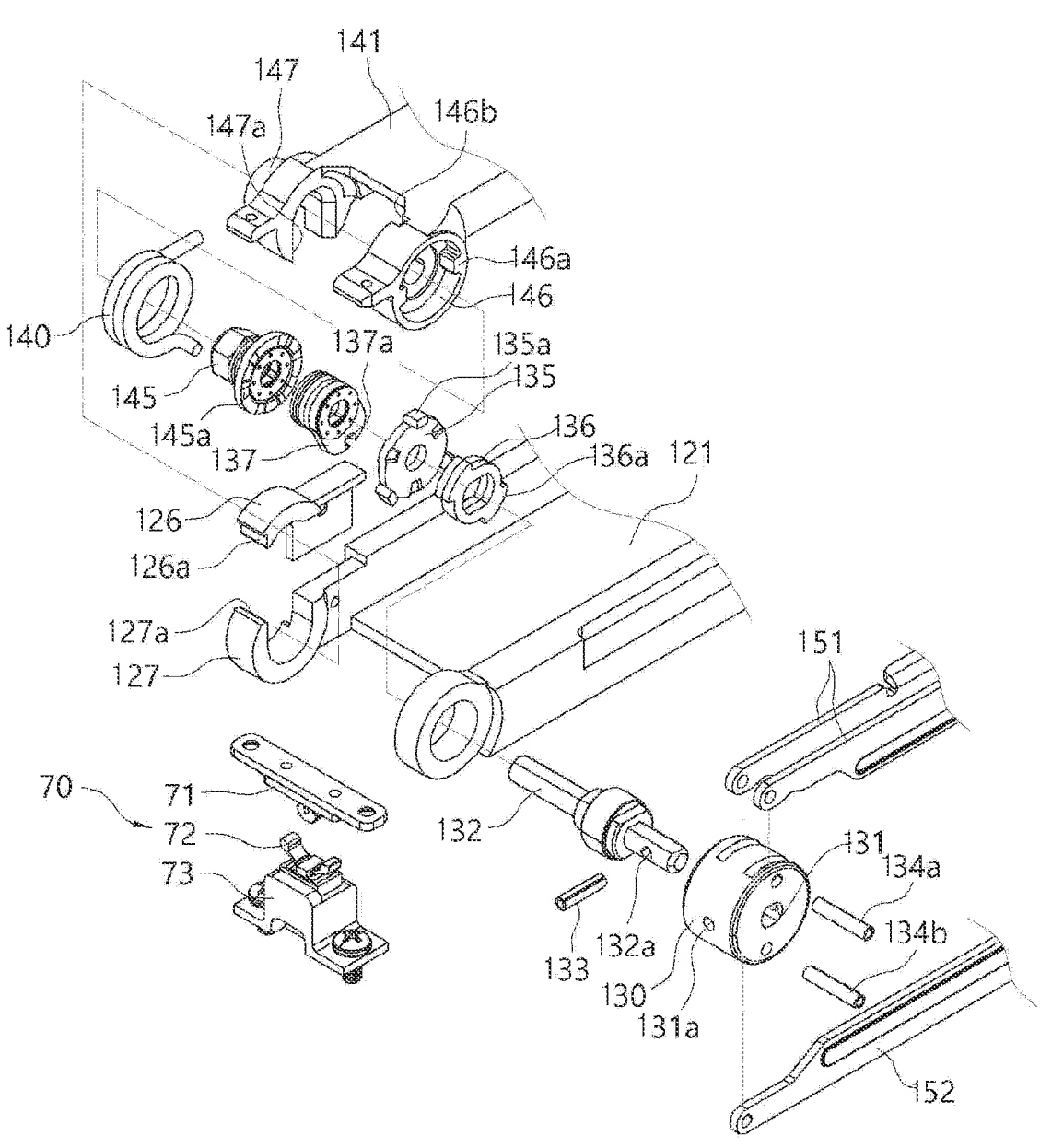
Figure 29:
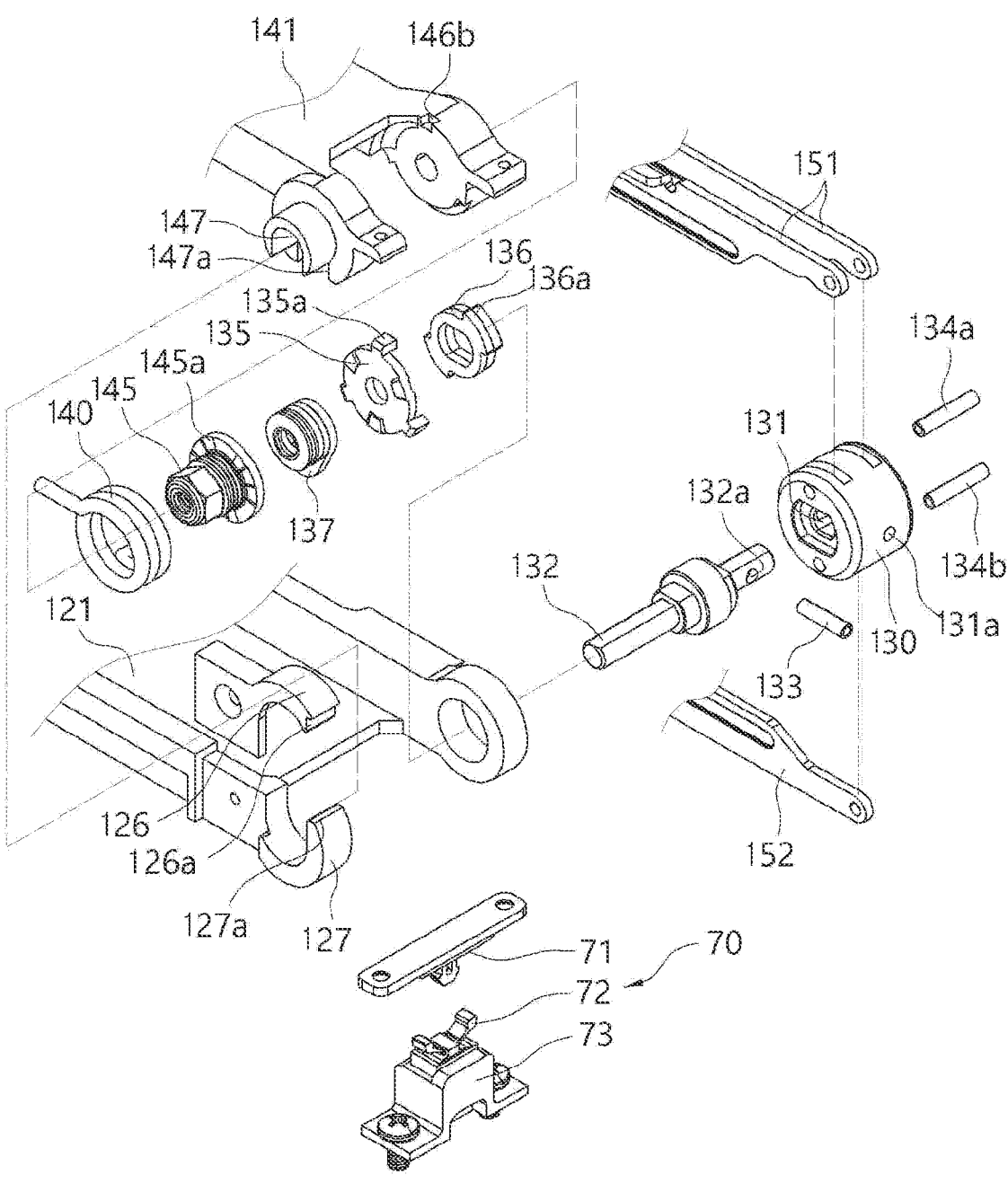

FIGS. 26 and 27 are detailed views illustrating a coupled state between an articulating based, a second link, and a second torsion spring in an unfolded state and a folded state of an arm stand for a display according to an embodiment of the present disclosure; and FIGS. 28 and 29 are exploded perspective views illustrating an articulating base, a second link, and a second torsion spring provided at an arm stand for a display according to an embodiment of the present disclosure.

As shown in FIGS. 26 to 29, the articulating base 130 has a second hinge hole 131 formed through the center of a body and is provided with a second hinge shaft 132 of a predetermined length passing through the second hinge hole 131, so as to provide connection between the first link 121 and the second link 141. The articulating base 130 may be referred to as a joint 130 or an arm hinge 130.

Such an articulating base 130 may be eccentrically disposed at one end of the second hinge shaft that corresponds to the third link.

The second hinge shaft 132, which is a shaft member of a predetermined length, has a first end correspondingly inserted into the second hinge hole 131 and a second end extending to the outside of the articulating base by a predetermined length.

In the middle of a length of the second hinge shaft 132 coupled to the articulating base, a connecting hole formed through a connecting hole formed through one side of a second end, namely, an upper end of the first link is rotatably coupled and another connecting hole formed through one side of a first end, namely, a lower end of the second link is rotatably coupled, and the second torsion spring 140 disposed between the second end (i.e., the upper end) of the first link and the first end (i.e., the lower end) of the second link may be provided so as to apply an elastic force to the second link.

A first pin hole 131*a* intersecting the second hinge hole may be formed through the articulating base 130, a second pin hole 132*a* intersecting the second hinge hole may be formed through an end portion of the second hinge shaft 132, and a fixing pin 133 correspondingly inserted into the first and second pin holes aligned with each other may be provided.

As the fixing pin is coupled to the second hinge shaft by being correspondingly inserted through the first and second pin holes, the second hinge shaft inserted and disposed in the second hinge hole may be configured as a fixed shaft member coupled to the second hinge hole of the articulating base in in a non-rotatable manner by the fixing pin.

In addition, the articulating base 130 defines a flat surface, which is in contact with a flat surface formed on an outer surface of the second hinge shaft, on an inner surface of the second hole 131. Accordingly, when the second hinge shaft and the second hinge hole are correspondingly coupled to each other, due to the contact between the flat surface formed on the outer surface of the second hinge shaft 132 and the flat surface formed on the inner surface of the second hinge hole, the second hinge shaft may be coupled to the second hinge hole of the articulating base in a non-rotatable manner while being securely fixed by the fixing pin.

As shown in FIGS. 26 to 29, the second link 141, which is a link member having a predetermined length less than the length of the first link, has a connecting hole of a substantially circular shape formed therethrough so that the first end, namely, the lower end of the second link 141 is rotatably connected to the second hinge shaft 132 passing through the second hinge hole of the articulating base and rotatably connected to the second end (i.e., the upper end) of the first link. The second link 141 may be referred to as an upper arm 141.

The bracket unit 60 detachably coupled to the display D, which is a heavy object, may be fixedly installed at a second end, namely, an upper end of the second link 141.

The second torsion spring 140 is an elastic member having a first end, which is bent, hooked into a fixing hole 137*a* of a stopper plate 137 rotatably coupled to the second hinge shaft in a non-rotatable manner, and a second end hooked into an engaging groove formed in a recessed manner in one surface of the first end of the second link that corresponds to the first link so as to apply an elastic restoring force to allow the second link to pivot upward about the second hinge shaft when switched to an unfolded position, while being torsionally elastically deformed to generate an elastic restoring force when switched to a folded position in which the second link is laid on top of the first link 121. The second torsion spring 140 may be referred to as a second clastic member 140.

As a flat surface in contact with a flat surface formed on the outer surface of opposite ends of the second hinge shaft is formed in the second hinge hole 132, the second hinge shaft coupled to the articulating base may be restricted in rotation by the fixing pin while being coupled to the second hinge hole in a non-rotational manner.

A second nut 145 for separation prevention may be fastened to a first end of the second hinge shaft 132 via a spacer washer 145*a* to prevent the separation of the first link and the second link. The spacer washer 145*a* may be referred to as a washer 145*a* or a disc spring 145*a*.

In addition, a circular placement groove 146 into which at least one circular control plate 136 coupled to the second hinges shaft 132 in a non-rotatable manner is inserted may be formed in a recessed manner in one surface of the first end, namely, the lower end of the second link 141, and the circular placement groove 146 may be provided, on its inner surface, with an engaging projection engaged with a positioning projection 136*a* formed in a protruding manner on an outer surface of the circular control plate 136.

Accordingly, while the second link pivots about the second hinge shaft for converting between the folded position and the unfolded position, it is possible to control a pivoting movement of the second link at a predetermined angle by the positioning projection of the circular control plate, which is fixedly installed on the second hinge shaft, moved along the inner surface of the circular placement groove formed in the second link performing a pivoting movement to be engaged with the engaging projection.

Here, a spacer circular plate 135 passing through the second hinge shaft may be provided between the stopper plate 137 with which the first end of the second torsion spring 140 is engaged and the first end of the second link 141 defining the circular placement groove, and a plurality of assembly projections 135*a* formed in a protruding manner on an outer edge of the spacer circular plate 135 may be correspondingly coupled to an assembly groove 147*b* formed in a recessed manner in a second surface of the first end of the second link, allowing the spacer circular plate to be fixedly installed on a first surface of the first end of the second link.

In this case, a direct contact between the first end of the second link pivoting in a direction opposite to the first link and the stopper plate coupled to the second hinge shaft in a non-rotatable manner by the space circular plate may be avoided in the transition between the unfolded position and the folded position, thereby preventing damage caused by friction between members.

A shaft portion 147 that defines an opening portion 147*a* open toward the second end of the first link may be provided on one side of the first end of the second link, an accommodating portion 127 that defines an opening portion 127*a* open toward the shaft portion 147 may be provided at the second end of the first link corresponding to the shaft portion, and a cover support portion 126 that covers and supports the shaft portion to rotatably support the shaft portion having an outer surface in surface contact with an inner surface of the accommodating portion.

The cover support portion 126 may be detachably coupled to a side surface of the accommodating portion provided at an outer surface of the second end of the first link by a fastening member.

Accordingly, a circular hole rotatably coupled to the second hinge shaft may be formed through a portion of the upper end (i.e., the second end) of the first link and a portion of the lower end (i.e., the first end) of the second link, and remaining portions of the first and the second links may be rotatably assembled by the cover support portion covering and supporting the shaft portion disposed in the accommodating portion.

In addition, a cable placed in the cable placement groove formed in a recessed manner in one surface of the first link may pass through a path formed between the accommodation portion and the shaft portion.

As shown in FIG. 24, FIG. 25, FIG. 28, FIG. 29, and FIG. 30, a plurality of third links 151 and 152 are link members of a predetermined length having opposite ends rotatably connected to the articulating base 130 that provides a connection between the first base 110*a* corresponding to the articulating base (of the first and the second bases 110*a* and 110*b* fixed on the flat surface) and the first and second links. The third link 151 may be referred to as an outer bar 151 or a first bar 151, and the third link 152 may be referred to as an inner bar 152 or a second bar 152.

Of the plurality of third links, a pair of third links 151 may each be provided, at a first end thereof corresponding to the first base 110*a*, with a connecting hole formed in a penetrating manner to be rotatably connected with a first upper pin 114*a* inserted into an upper pin hole formed in a penetrating manner to be eccentric upward from the first hinge hole of the first base 110*a*, and, at a second end thereof corresponding to the articulating base 130, with another connecting hole formed in a penetrating manner to be rotatably connected with a second upper pin 134*a* inserted into another upper pin hole formed in a penetrating manner to be eccentric upward from the second hinge hole of the articulating base.

Of the plurality of third links, a third link 152 disposed between the pair of third links 151 may have, at a first end thereof, with a connecting hole formed in a penetrating manner to be rotatably connected with a first lower pin 114*b* inserted into a lower pin hole formed in a penetrating manner to be eccentric downward from the first hinge hole of the first base 10*a*, and have, at a second end thereof, with another connecting hole formed in a penetrating manner to be rotatably connected with a second lower pin 134*b* inserted into another lower pin hole formed in a penetrating manner to be eccentric downward from the second hinge hole of the articulating base.

Of the plurality of third links 151 and 152, the pair of third links 151 have opposite ends rotatably coupled to the first upper pin 114*a* of the first base and the second upper pin 134*a* of the articulating base, respectively, and the third link 152 disposed between the pair of third links has opposite ends rotatably connected to the first lower pin 114*b* of the first base and the second lower pin 134*b* of the articulating base, respectively, allowing the pair of third links 151 and the third link 152 to be disposed at one side of the first link with a height difference to be parallel with each other.

It is preferable that a slit groove is formed in a cut-out manner in the outer surface of the first and second bases having the first upper and lower pins so that the first end of the third link is rotated without being caught when converting the position together with the first link, and another slit groove is formed in a cut-out manner in the outer surface of the articulating base having the second upper and lower pins so that the second end of the third link is rotated without being caught when converting the position together with the first link.

As shown in FIGS. 18, 19, 20, and 21, the tension spring 150, which is a coiled spring member, has a first end hooked to any one of the pair of third links disposed at one side of the first link 121, and a second end hooked to the other third link disposed between the pair of third links, so as to apply an elastic restoring force to the first link 121 pivoting upward about the first hinge shaft 112 when unfolded and to provide a reaction force that prevents rapid pivoting of the first link about the first hinge shaft 112 due to the weight (or load) of the display when folded. The tension spring 150 may be referred to as a third spring member 150.

The first end of the tension spring 150 may be hooked to a bent portion provided in the middle of the length of the first link, and the second end of the tension spring 150 may be hooked to a bent portion formed by being bent from an inner surface of the other third link disposed between the pair of third links.

The tension spring 150 may be disposed at one side of the first link while being adjacent to the first base, and a cut-out portion may be formed in one surface of the first link that is adjacent to the first base to allow the first tension spring 150 to be disposed.

Figure 30:
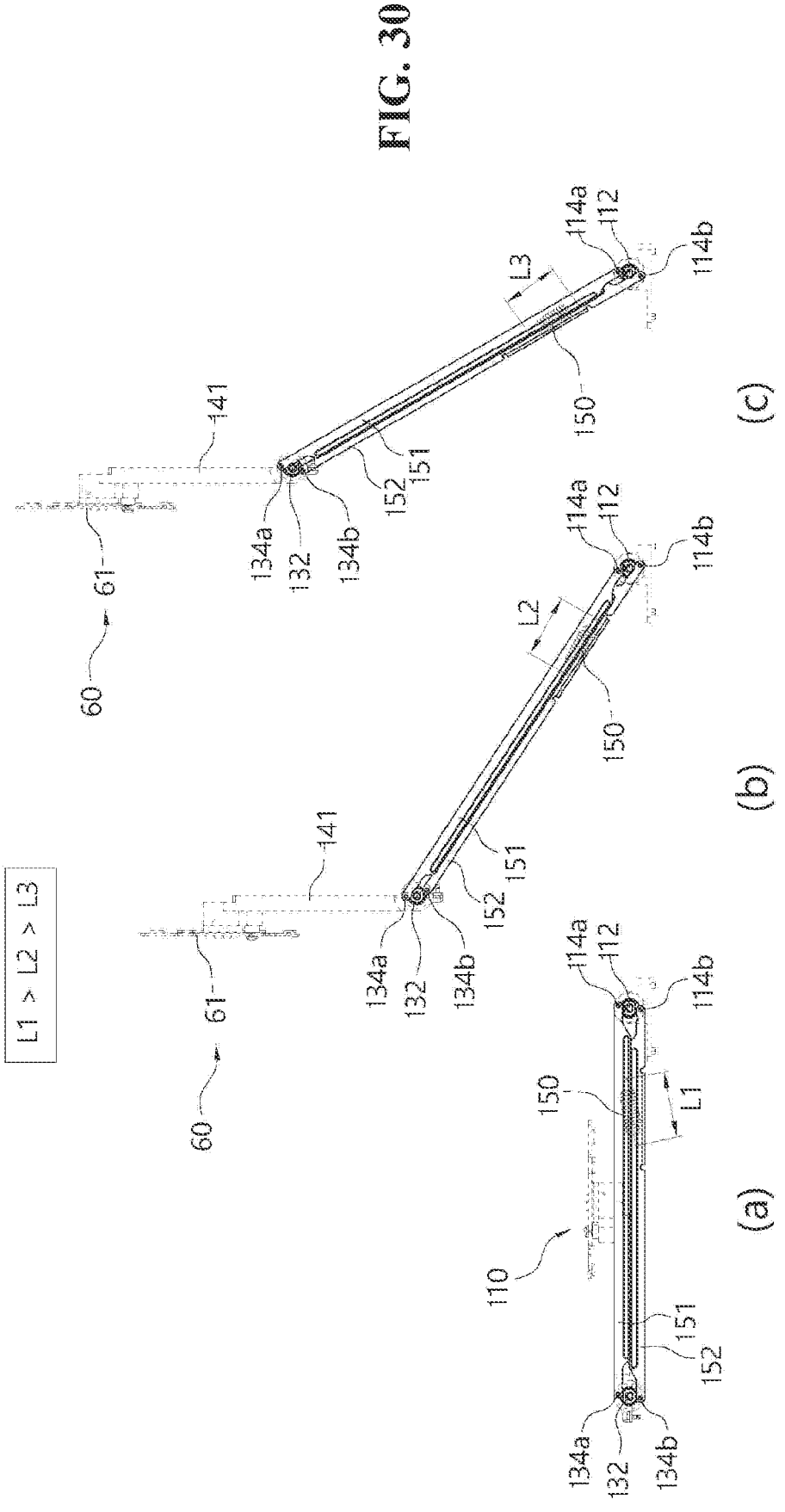

FIG. 30 is a schematic view illustrating an arm stand for a display in transition from a folded state to an unfolded state, according to an embodiment of the present disclosure. In the folded state in which the first link is folded in parallel with the flat surface, when the first link is rotated upward in a clockwise direction in the drawing, since the pair of third links arranged side by side with different heights on one side of the first link and the other third link disposed between the pair of third links are pivoted upward about the first upper and lower pins eccentrically disposed adjacent to the first hinge shaft while maintaining a parallel state with the first link, a distance between opposite ends of each of the pair of tension springs decreases in the order of L1>L2>L3 as the engaging position where the second end of the tension spring hooked to the other third link is moved closer to the engaging position where the first end of the tension spring is hooked to the first link.

Accordingly, when the first link is switched from the folded state to the unfolded state for using the display, an elastic restoring force generated while the tension spring stretched to the fullest extent are contracted and restored to its original state may be transferred to the first link in addition to an elastic restoring force from the first torsion spring, allowing the first link pivoting upward about the first hinge shaft with a large and heavy display mounted thereto to be more stably rotated. In addition, the elastic modulus of the first torsion spring that provides the elastic restoring force when the first link pivots upward to be switched to the unfolded state, thereby increasing the degree of freedom in design.

In addition, as shown in FIG. 16, when switching from the folded state to the unfolded state, a pivoting angle for the first link to pivot upward about the first hinge shaft by the elastic restoring force of the first torsion spring and the tension spring is set to be similar to a pivoting angle for the second link to pivot upward about the second hinge shaft by the elastic restoring force of the second torsion spring, and thus, the display may be raised to a certain height while maintaining the display in a horizontal state, and then be converted to a vertical state.

Conversely, in the unfolded state in which the first link is in a slantly standing position as the first link is pivoted upward, when the first link is rotated downward about the first hinge shaft in a counterclockwise direction in the drawing, since the plurality of third links are pivoted downward about the upper and lower pins eccentrically disposed adjacent to the first hinge shaft while maintaining a parallel state at one side of the first link, a distance between opposite ends of the tension spring increases in the order of L3<L2<L1 as the engaging position where the second end of the tension spring is connected to the third link is moved away from the engaging position where the first end of the tension spring is connected to the other third link.

Accordingly, when the first link is switched from the upfolded state to the folded state for storing the display device after use, an elastic restoring force may be generated while the tension spring contracted and restored to its original state when unfolded is stretched in the longitudinal direction.

Due to this elastic restoring force, the weight of the heavy large display mounted on the bracket unit of the second link may be distributed, thereby preventing the first link from rotating suddenly downward about the first hinge shaft while allowing the first link to be rotated more stably. In addition, the degree of freedom in design may be increased by reducing the elastic modulus of the first torsion spring.

Further, while the first link pivots downward about the first hinge shaft in the transition from the folded state to the unfolded state, as shown in FIG. 17, the display mounted on the bracket unit of the second link may be lowered while maintaining a vertical state until the first end, namely, the lower end of the second link is engaged and restricted by the locking unit.

In addition, as the plurality of third links 151 and 152 are arranged in a row, side by side, at one side of the first link 121, when the first link is rotated upward to be switched from the folded state to the unfolded state or is rotated downward to be switched from the unfolded state to the folded state, an external force transferred directly or indirectly to the first link due to the weight of the display, which is a heavy object, may be distributed by the third links arranged in a row eccentrically at the outside of the first link, it is possible to prevent deformation or damage of the first link without excessively increasing the section modulus and strength of the first link, which is a key component, Thus, it is possible to achieve an optimal arm stand suitable for mounting a larger and heavier display. Also, it is possible to reduce the size of the elastic force to be borne by the torsion spring that applies the elastic force to the first link, and thus, the size of the torsion spring may be reduced to thereby reduce the size of the base, which is advantageous to achieve a slim profile.

Figure 31:
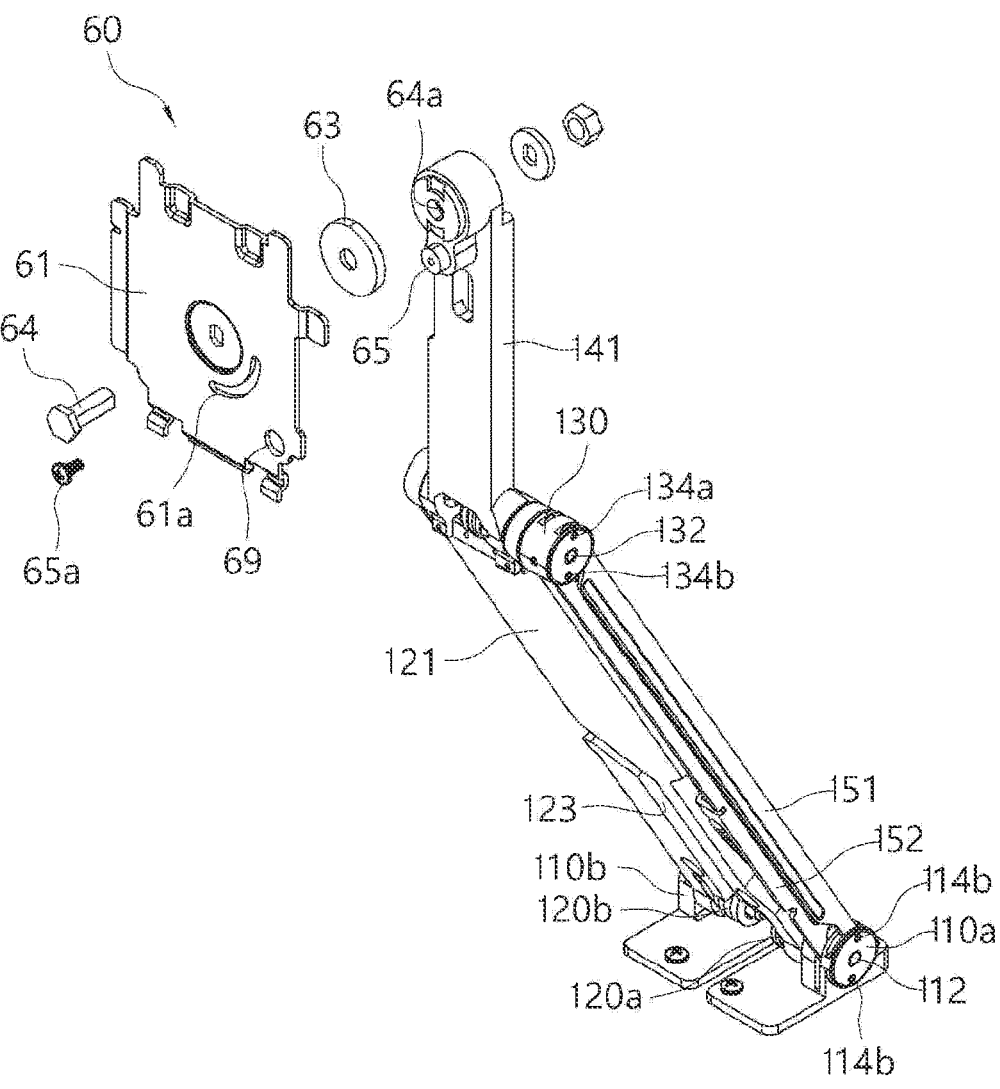
Figure 32:
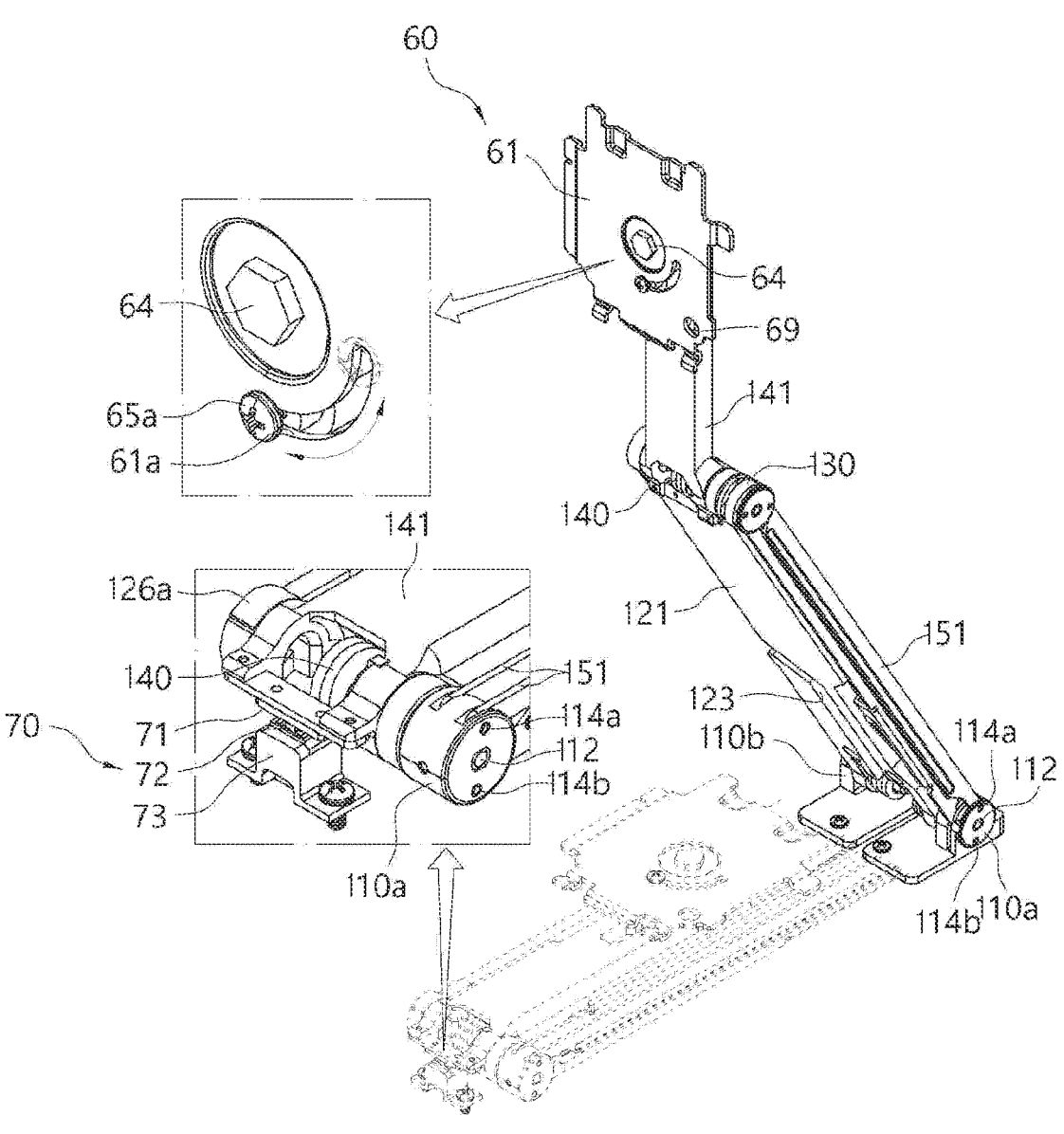

FIG. 31 is a bracket unit provided at an arm stand for a display according to an embodiment of the present disclosure; and FIG. 32 is a detailed view illustrating a locking unit provided at an arm stand for a display according to an embodiment of the present disclosure.

As shown in FIGS. 31 and 32, the bracket unit 60 may have a rotating plate 61 of a substantially square plate shape rotatably coupled to a tip of a rotation support shaft 64 provided at the second end of the second link 141 so as to be detachably connected to the rear surface of the display D. The bracket unit 60 may be referred to as a bracket 60. The bracket 60 may be detachably coupled to a back cover of display D. The display D may include an LCD panel or an OLED panel that is opposite the back cover and configured to display an image. When the display D has an LCD panel, the display D may include a backlight unit to provide light to the LCD panel.

The rotation support shaft 64, which is a shaft member of a predetermined length, is coupled in a non-rotatable manner to an assembly hole 64a formed through the second end, namely, the upper end of the second link, and is fastened by a nut member to prevent the separation from the assembly hole.

A spacer plate 63 of a substantially disc shape in contact with a rear surface of the rotating plate may be provided for separation between the rotating plate 61 rotatably coupled to the tip of the rotation support shaft and the second end of the second link having the assembly hole, so as to facilitate the rotation of the rotating plate.

In addition, a pin support 65 having an engaging pin member 65a at its tip may be provided at the second end of the second link 141 that corresponds to the rotating plate, and the rotating plate 61 corresponding to the engaging pin member may include an arcuate guide slit 61a formed in a penetrating manner at a rotation angle of approximately 90 degrees to allow the engaging pin member to be guided and moved.

It is preferable that a cable outlet hole 69 through which the cable extending from the display passes by being drawn out to the second link side is formed through one side of the rotating plate 61, and another cable outlet hole through which the cable drawn out through the cable outlet hole passes being drawn out to the first link side is formed through the upper end of the second link.

Accordingly, the rotating plate detachably connected to the rear surface of the display may be rotated about 90 degrees in a forward direction or a reverse direction about the rotation support shaft, thereby allowing the display to be rotatably moved.

In addition, a cable such as a power cable or a video cable may be drawn out to the first link side through the cable outlet hole formed through the rotating plate and the second link, and then may pass through a path formed between the accommodating portion and the shaft portion to be placed in the cable placement groove formed in a recessed manner in one surface of the first link, allowing the cable to be placed neatly in appearance.

Further, is rotatably moved, the engaging pin member may be engaged by being guided and moved along the arcuate guide slit, allowing a user to be easily and freely change the mode of the display in landscape mode or in portrait mode as desired.

As shown in FIGS. 31 and 32, the locking unit 70 may selectively restrict or the first end of the second link 141 corresponding to the articulating base to maintain a folded state in which the first link 121 and the second link 142 are laid flat by being folded with respect to the second hinge shaft 132, or may selectively release the constraint on the first end of the second link 141 corresponding to the articulated to be switched to the unfolded state achieved by the first link and the second link being pivoted upward in opposite directions about the first hinge shaft and the second hinge shaft.

The locking unit 70 may include a striker 71 detachably provided at the first end of the second link 41 that corresponds to the articulating base, a push-type latch 72 having a snap fit in which a lower end of the striker is fittingly inserted to be fixed, and a latch holder 73 that allows the push-type latch to be fixedly installed on the flat surface on which the base is fixedly installed.

Here, the locking unit is illustrated and described as a push-type latch, but is not limited thereto. An actuator such as a solenoid that generates an external force to cause a latching force on one end of the second link when power is applied as the first and the second links overlapping each other approach the flat surface or a manual latching mechanism such as a latching pin may be used.

Referring to FIGS. 16 to 32, an arm stand for a display may include: a base that has a first base provided with a first hinge shaft coupled to a first hinge hole formed through a body and a second base provided with a hinge shaft integrally formed with one surface of the second base, so as to be fixedly installed on a flat surface; a first link having a first end rotatably connected to the first hinge shaft and the hinge shaft; a pair of first torsion springs provided on the first hinge shaft and the hinge shaft, respectively, so that first ends thereof are respectively hooked to the first base and the second base and second ends thereof are hooked to the first end of the first link so as to apply an elastic force to the first link; an articulating base provided with a second hinge shaft coupled to a second hinge shaft formed through a body; a second link having a first end rotatably coupled to the second hinge shaft to which a second end of the first link is rotatably coupled; a second torsion spring having a first end hooked to the articulating base and a second end hooked to the first end of the second link so as to apply an elastic force to the second link; a plurality of third links having opposite ends rotatably coupled to the first base and the articulating base, respectively, so as to be disposed on one side of the first link; a tension spring having a first end hooked to one of the plurality of third links and a second link hooked to a remaining one of the plurality of third links so as to apply an elastic force to the first link; a bracket unit having a rotating plate rotatably coupled to a tip of a rotation support shaft provided at the second end of the second link so as to be connected to a rear surface of the display; and a locking unit that restricts the second link to maintain a folded state in which the first and the second links are folded with respect to the first and second hinge shafts, or releases the engagement with the second link to be switched to an unfolded state, which is achieved by the first link and the second link being pivoted about the first and second hinge shafts.

A first pin hole interesting the second hinge hole may be formed through the articulating base, and a second pin hole interesting the second hinge hole may be formed at an end portion of the second hinge shaft that corresponds to the articulating base, and the second hinge shaft may be couple to the second hinge hole in a non-rotatable manner by a fixing pin inserted into the first and second pin holes aligned with each other.

A first end, which is bent, of the second torsion spring may be hooked into a fixing hole of a stopper plate coupled to the second hinge shaft in a non-rotatable manner, and a second end of the second torsion spring may be hooked into an engaging groove formed in a recessed manner in one surface of the first end of the second link that corresponds to the first link.

A spacer circular plate may be provided between the stopper plate and the first end of the second link, and a plurality of assembly projections formed in a protruding manner on an outer edge of the space circular plate may be coupled to an assembly groove formed in a recessed manner in the first end of the second link so as to be fixedly installed.

A circular placement groove in which at least one circular control plate coupled to the second hinge shaft in a non-rotatable manner is inserted and disposed may be formed in one surface of the first end of the second link, and an engaging projection may be formed on an inner surface of the circular placement groove to be engaged with a positioning projection formed in a protruding manner on an outer circumferential surface of the circular placement groove.

A shaft portion that defines an opening portion open toward the second end of the first link may be provided at one side of the first end of the second link, an accommodating portion that defines an opening portion open toward the shaft portion may be provided at the second end of the first link corresponding to the shaft portion, and a cover support portion that covers and supports the shaft portion to support the shaft portion having an outer surface in surface contact with an inner surface of the accommodating portion may be provided at one surface of the second end of the first link.

A pin support having an engaging pin member at a tip thereof may be provided at the second end of the second link where the rotation support shaft is installed, and the rotating plate may have an arcuate guide slit formed therethrough at a rotation angle of 90 degrees to allow the engaging pin member to be guided and moved.

Referring to FIGS. 33 to 39, a display stand 2100 may be folded or unfolded. A first side (e.g., a bottom) of the display stand 2100 may be mounted on a counterpart object, and a display D may be mounted on a second side (e.g., an upper portion) of the display stand 2100. For example, the counterpart object on which the display stand 2100 is installed may be a table, a wall, or a bag or case designed to be carried by a user. The display stand 2100 may be a monitor arm 2100, a supporter 2100, a stander 2100, or an arm stand 2100 for a display. The display stand 2100 and the display D may be collectively referred to as a display device. The display D may be referred to as a display unit D, a display module D, or a head D.

Figure 33:
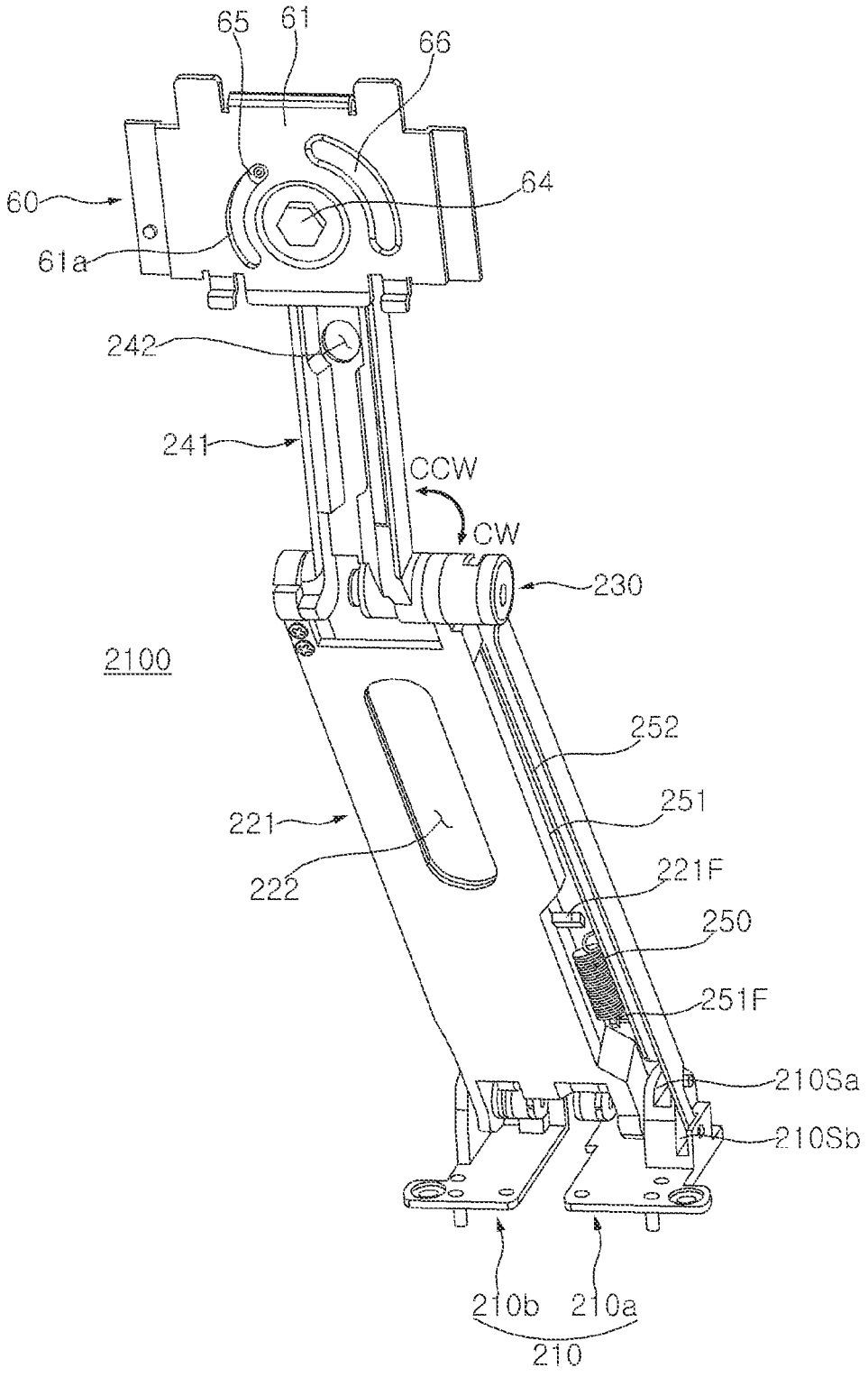

Referring to FIG. 33, the display stand 2100 may include a base 210, a lower arm 221, a first elastic member 220, a joint 230, an upper arm 241, a second elastic member 240, bars 251 and 252, a third elastic member 250, and a bracket 60. The lower arm 221 and the upper arm 241 may be collectively referred to as a link (221, 241) or a foldable link (221, 241). The bars 251 and 252 may be collectively referred to as an auxiliary link (251, 252) or a support link (251, 252). The foldable link (221, 241) and the support link (251, 252) may include a metal material. Meanwhile, the locking unit 70 described above with reference to FIG. 15 or FIG. 32 may also be employed in the display stand 2100.

Figure 34:
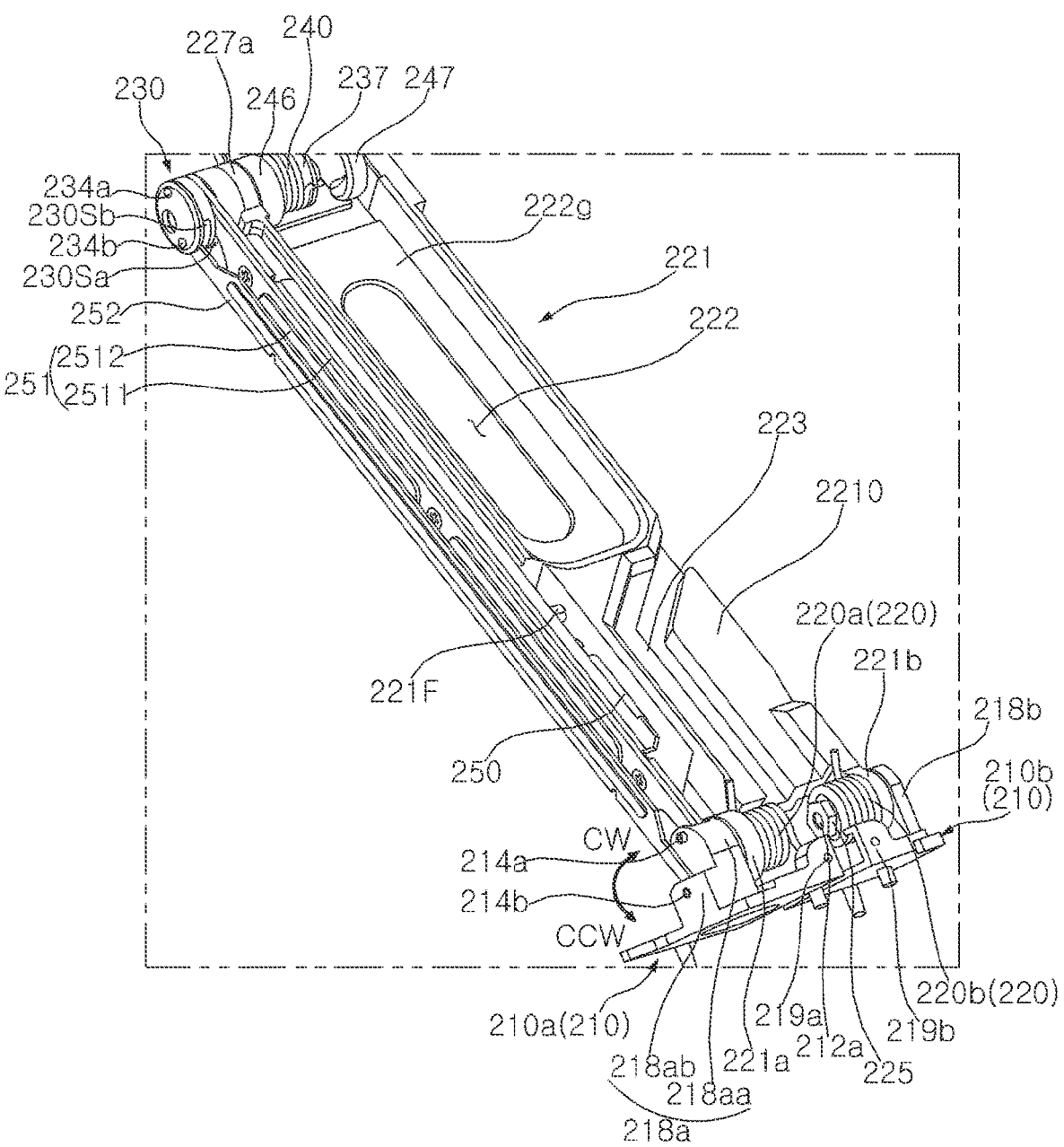
Figure 35:
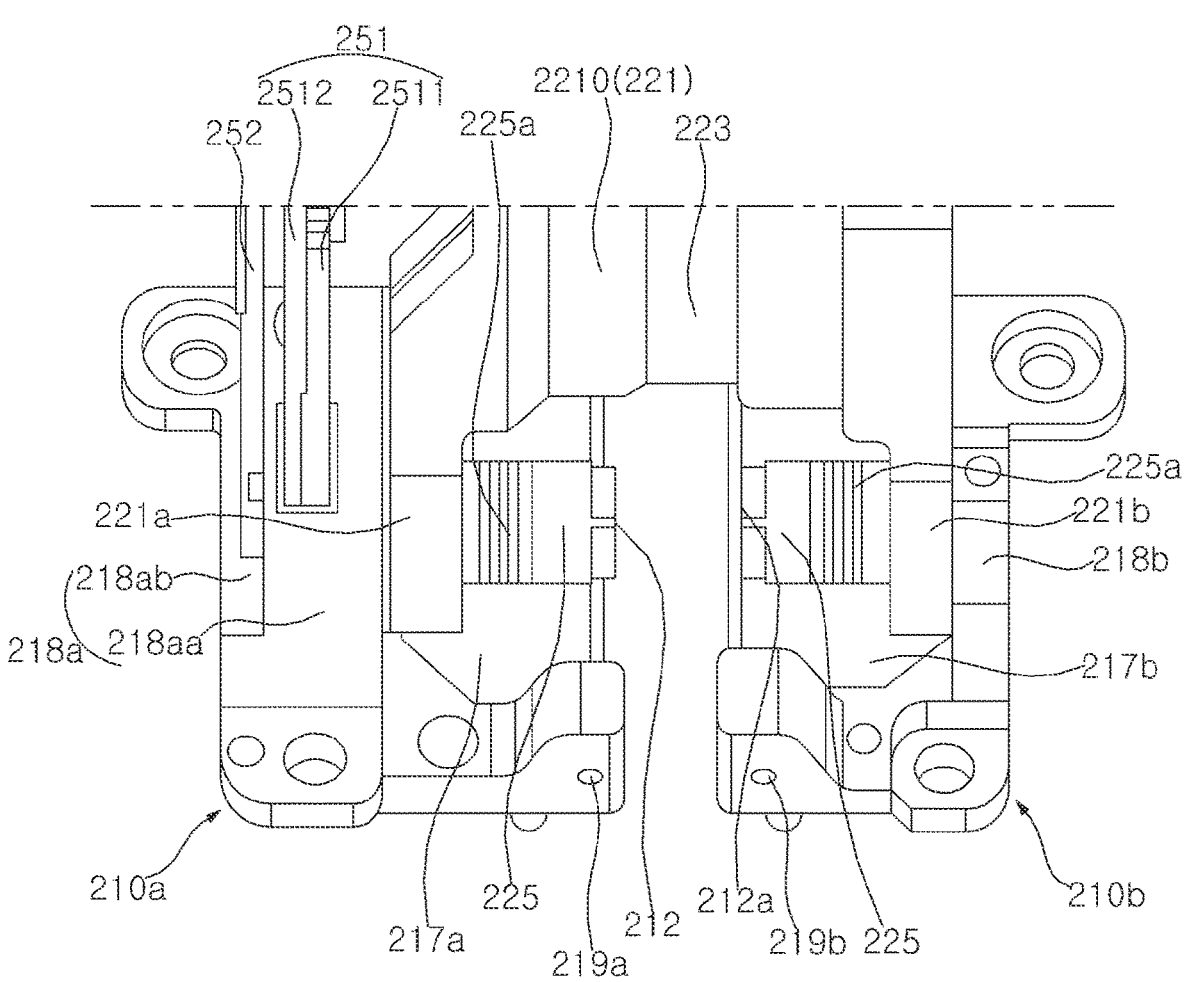

Referring to FIGS. 34 and 35, the base 210 may be mounted on a counterpart object (not shown). The counterpart object may provide a flat surface on which the base 210 is seated. The base 210 may include a first base 210a and a second base 210b that are adjacent to each other. Alternatively, the first base 210a and the second base 210b may be formed as one body.

The first base 210a may include a first bottom 217a, a first holder 218a, and a first fixer 219a. The first bottom 217a may have a plate shape, and may be seated on the counterpart object. The first holder 218a may protrude upward from the first bottom 217a while being adjacent to one side (i.e., a left side) of the first bottom 217a that is farthest apart from the second base 210b. The first holder 218a may be referred to as a first hinge base 218a. The first fixer 219a may be provided at the first bottom 217a while being adjacent to the other side of the first bottom 217a.

The second base 210b may include a second bottom 217b, a second holder 218b, and a second fixer 219b. The second bottom 217b may have a plate shape, and may be seated on the counterpart object. The second holder 218b may protrude upward from the second bottom 217b while being adjacent to one side (i.e., a right side) of the second bottom 217b that is farthest apart from the first base 210a. The second holder 218b may be referred to as a second hinge base 218b. The second fixer 219b may be provided at the second bottom 217b while being adjacent to the other side of the second bottom 217b.

A body 2210 of the lower arm 221 may have a long bar shape. A hole 222 may be formed in the body 2210 of the lower arm 221. A groove 223 may be formed in the body 2210 of the lower arm 221, so that a cable may be placed in the groove 223. The lower arm 221 may be referred to as a first link 221. The cable may be electrically connected to the display D.

A pair of bottom coupling portions 221a and 221b may protrude from a lower side of the body 2210 of the lower arm 221, and may be spaced apart from each other along the lower side of the body 2210. The pair of bottom coupling portions 221a and 221b may be referred to as a pair of bottom connecting portions 221a and 221b. The pair of bottom coupling portions 221a and 221b may be disposed between the first holder 218a of the first base 210a and the second holder 218b of the second base 210b. The pair of bottom coupling portions 221a and 221b may each have a ring shape. A first bottom coupling portion 221a may be adjacent to a left side of the body 2210 of the lower arm 221, and may be positioned on a right surface of the first holder 218a. A second bottom coupling portion 221b may be adjacent to a right side of the body 2210 of the lower arm 221, and may be positioned on a left surface of the second holder 218b.

A first hinge shaft 212 may extend in a direction intersecting the first holder 218a, and may pass through the first bottom coupling portion 221a. The first hinge shaft 212 may be fixed to the first holder 218a or be formed as one body with the first holder 218a. Washers 225a may be disposed opposite the first holder 218a with respect to the first bottom coupling portion 221a, and the first hinge shaft 212 may pass through the washers 225a. A fastening member 225, such as a nut, may be fastened to an end of the first hinge shaft 212, and may press the washers 225a. The washer 225a may be referred to as a disc spring 225a or a spacer washer 225a. The first bottom coupling portion 221a may be rotatably coupled to the first hinge shaft 212.

A first hinge shaft 212a may extend in a direction intersecting the second holder 218b, and may pass through the second bottom coupling portion 221b. The first hinge shaft 212a may be fixed to the second holder 218b or be formed as one body with the second holder 218b. Washers 225a may be disposed opposite the second holder 218b with respect to the second bottom coupling portion 221b, and the first hinge shaft 212a may pass through the washers 225a. A fastening member 225, such as a nut, may be fastened to an end of the first hinge shaft 212a, and may press the washers 225a. The washer 225a may be referred to as a disc spring 225a or a spacer washer 225a. The second bottom coupling portion 221b may be rotatably coupled to the first hinge shaft 212a.

A first left elastic member 220a of the first elastic member 220 may be a torsion spring wound in a coil shape around a lateral surface of the first hinge shaft 212, and may surround the washers 225a. A first end of the first left elastic member 220a may be hooked into the first fixer 219a of the first base 210a, and a portion of the first left elastic member 220a adjacent to a second end of the first left elastic member 220a may support one side of the body 2210 of the lower arm 221.

A first right elastic member 220b of the first elastic member 220 may be a torsion spring wound in a coil shape around a lateral surface of the first hinge shaft 212a, and may surround the washers 225a. A first end of the first right elastic member 220b may be hooked into the second fixer 219b of the second base 210b, and a portion of the first right elastic member 220b adjacent to a second end of the first right elastic member 220b may support one side of the body 2210 of the lower arm 221.

Accordingly, when a user rotates the lower arm 221 counterclockwise (refer to CCW of FIG. 34) to fold the lower arm 221 toward the base 210, the first left elastic member 220a and the first right elastic member 220b that support the lower arm 221 may be elastically deformed. Conversely, when the user rotates the lower arm 221 clockwise (refer to CW of FIG. 34) to unfold the lower arm 221 from the base 210, the first left elastic member 220a and the first right elastic member 220b are restored, causing the lower arm 221 to rotate clockwise CW. In other words, the lower arm 221 may be hinged to the base 210.

Meanwhile, instead of the first left and right elastic members 220a and 220b, a single first elastic member 220 may surround the lateral surfaces of the first hinge shaft 212 and the first hinge shaft 212a.

Figure 36:
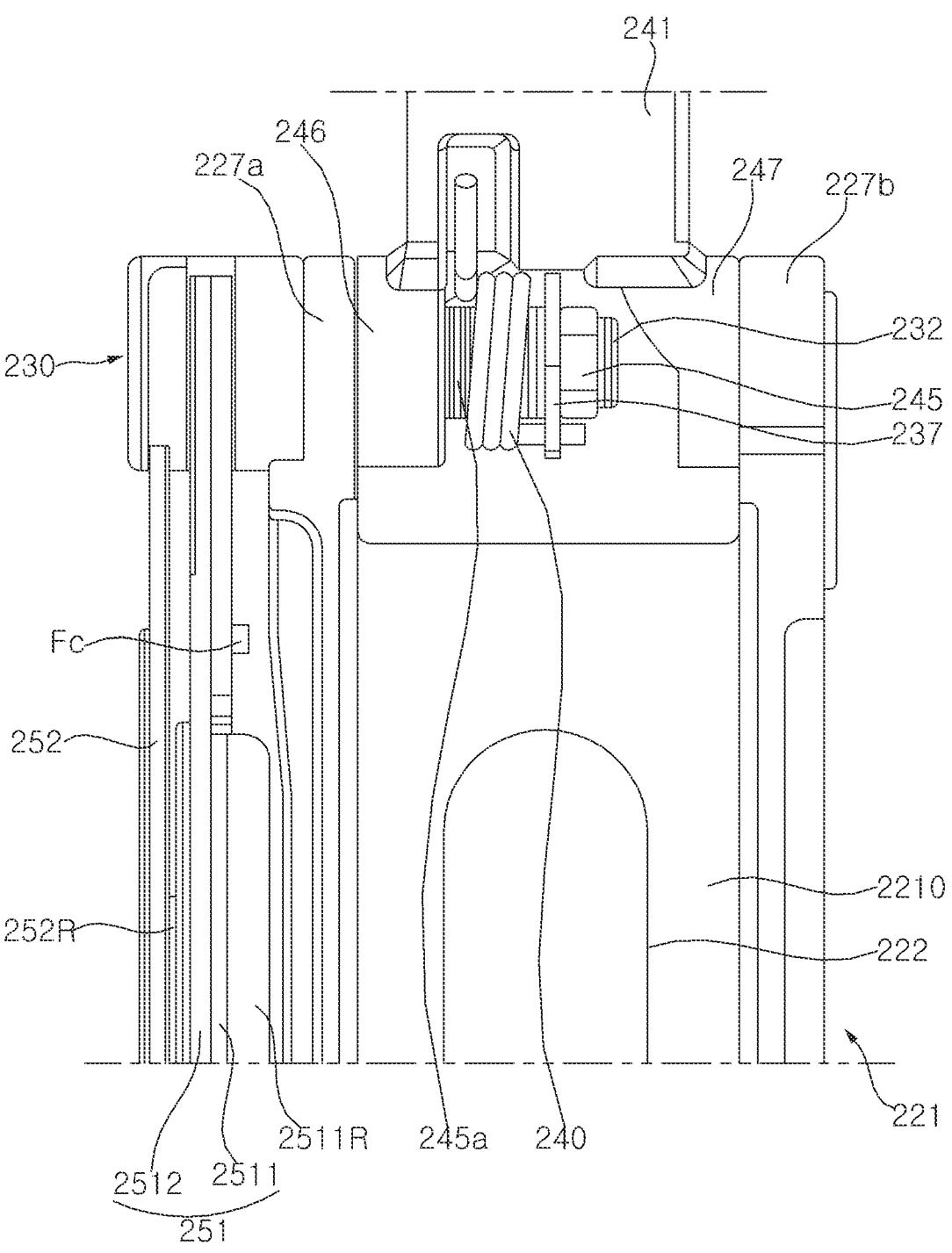
Figure 37:
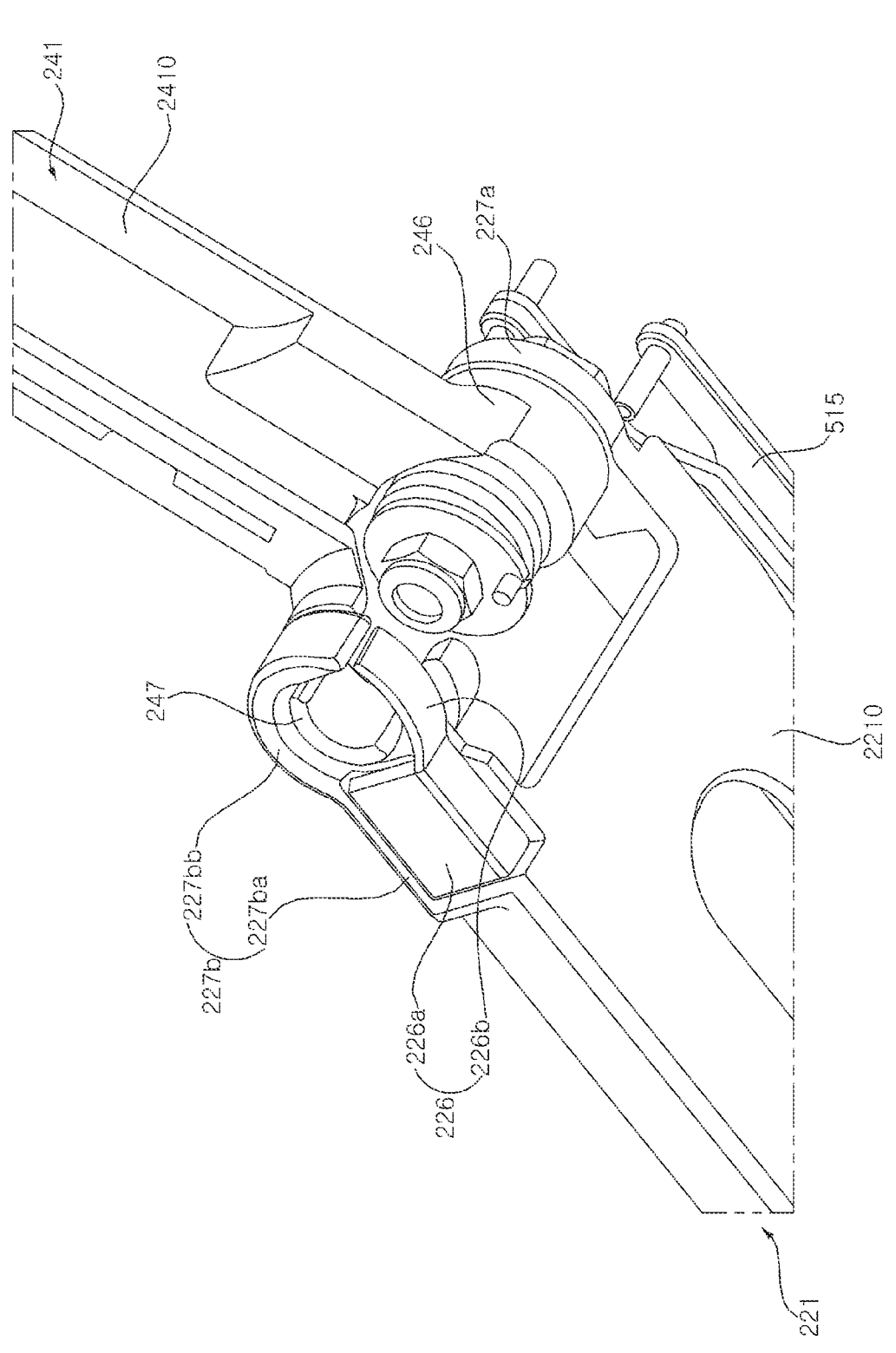

Referring to FIGS. 36 and 37, a pair of top coupling portions 227a and 227b may protrude from an upper side of the body 2210 of the lower arm 221, and may be spaced apart from each other along the upper side of the body 2210. The pair of top coupling portions 227a and 227b may be referred to as a pair of top connecting portions 227a and 227b. A first top coupling portion 227a may be adjacent to a left side of the body 2210 of the lower arm 221, and may be opposite the first bottom coupling portion 221a (see FIG. 35). The first top coupling portion 227a may have a ring shape. A second top coupling portion 227b may be adjacent to a right side of the body 2210 of the lower arm 221, and may be opposite the second bottom coupling portion 221b (see FIG. 35).

A body 2410 of the upper arm 241 may have a long bar shape. A hole 242 (see FIG. 33) may be formed in the body 2410 of the upper arm 241. The upper arm 241 may be shorter in length than the lower arm 221 (see FIG. 33). The upper arm 241 may be referred to as a second link 241.

A pair of connecting portions 246 and 247 may protrude from a lower side of the body 2410 of the upper arm 241, and may be spaced apart from each other along the lower side of the body 2410. The pair of connecting portions 246 and 247 may be disposed between the pair of top coupling portions 227a and 227b of the lower arm 22. A first connecting portion 246 may have a ring shape. The first connecting portion 246 may be adjacent to a left side of the body 2410 of the upper arm 241, and may be positioned on a right surface of the first top coupling portion 227a. A second connecting portion 247 may be adjacent to a right side of the body 2410 of the upper arm 241, and may be inserted into the second top coupling portion 227b.

The joint 230 may be disposed opposite the first connecting portion 246 with respect to the first top coupling portion 227a. The joint 230 may be positioned on a left surface of the first top coupling portion 227a. The joint 230 may have an overall cylindrical shape. The joint 230 may be referred to as an articulating base 230 or an arm hinge 230.

A second hinge shaft 232 may extend in a direction parallel to the first hinge shaft 212, 212a (see FIG. 35), and may pass through the first connecting portion 246 and the first top coupling portion 227a. The second hinge shaft 232 may be fixed to the joint 230 or be formed as one body with the joint 230. Washers 245a may be disposed opposite the first top coupling portion 227a with respect to the first connecting portion 246, and the second hinge shaft 232 may pass through the washers 245a. A fastening member 245, such as a nut, may be fixed to an end of the second hinge shaft 232, and may press the washers 245a. The washer 245a may be referred to as a disc spring 245a or a spacer washer 245a. The first top coupling portion 227a and the first connecting portion 246 may be rotatably coupled to the second hinge shaft 232.

The second elastic member 240 may be a torsion spring wound in a coil shape around a lateral surface of the second hinge shaft 232, and may surround the washers 245a. A first end of the second elastic member 240 may be hooked into a hole formed in a fixing ring 237, and a portion of the second elastic member 240 adjacent to a second end of the second elastic member 240 may support one side of the body 2410 of the upper arm 241. Here, the fixing ring 237 may be a member fixed to the second hinge shaft 232 between the washer 245a and the fastening member 245.

Thus, when a user rotates the upper arm 241 clockwise (refer to CW of FIG. 33) to fold the upper arm 241 toward the lower arm 221, the second elastic member 240 that supports the upper arm 241 may be elastically deformed. Conversely, when the user rotates the upper arm 241 counterclockwise (refer to CCW of FIG. 33) to unfold the upper arm 241 from the lower arm 221, the second elastic member 240 may be restored, causing the upper arm 241 to rotate counterclockwise CCW. In other words, the upper arm 241 may be hinged to the lower arm 221.

In this case, the upper arm 241 may be inserted into a recessed portion 222g in which the hole 222 of the lower arm 221 is formed (see FIG. 34). That is, the upper arm 241 may be stored or accommodated in the recessed portion 222g of the lower arm 221, and the recessed portion 222g may be referred to as a storage groove 222g. Accordingly, the upper arm 241 folded onto the lower arm 221 may be laid flat on top of the lower arm 221.

Meanwhile, the second top coupling portion 227b may include a mount 227ba and a finger 227bb. The mount 227ba may be formed on the right side of the body 2210 of the lower arm 221. The finger 227bb may extend from the mount 227ba in a curved manner. The finger 227bb may have the shape of an arc, and may be an open ring. The second connecting portion 247 may be inserted into the finger 227bb, and may be a circle part extending along the finger 227bb. A cable holder 226 may include a block 226a and a tip 226b. The block 226a may be coupled to the mount 227ba, and the tip 226b may extend from the block 226a in a curved manner. The tip 226b and the finger 227bb may form a circle together. A cable placed in the groove 223 (see FIG. 34) of the lower arm 221 may pass through the circle defined by the tip 226b and the finger 227bb, and may pass through the hole 242 (see FIG. 33) of the upper arm 241.

The bracket 60 (see FIG. 33) may be mounted to an upper end of the upper arm 241. The bracket 60 may have a plate shape. The bracket 60 may be referred to as a bracket unit 60. The bracket 60 may be detachably coupled to a back cover of the display D. The display D may include an LCD panel or an OLED panel that is opposite the back cover and configured to display an image. When the display D has an LCD panel, the display D may include a backlight unit configured to provide light to the LCD panel. The description of the bracket 60 described above with reference to FIGS. 14 and 15 or the description of the bracket 60 described above with reference to FIGS. 31 and 32 may applied to the bracket 60 of FIG. 33.

Accordingly, the length and angle of the display D mounted to the bracket 60 of the display stand 100 may be varied in response to folding and unfolding of the foldable link (221, 241). In other words, a user may fold the foldable link (221, 241) to store or carry the display device. Conversely, the user may unfold the foldable link (221, 241) to watch (or use) the display device.

Meanwhile, the position of an arcuate guide slit 61a of the bracket 60 of FIG. 33 may be different from the position of the arcuate guide slit 61a of the bracket 60 of FIGS. 14 and 15 or the arcuate guide slit 61a of the bracket 60 of FIGS. 31 and 32. The bracket 60 of FIG. 33 may include an arcuate pressed portion 66 disposed opposite the arcuate guide slit 61a with respect to a rotation support shaft 64.

Figure 38:
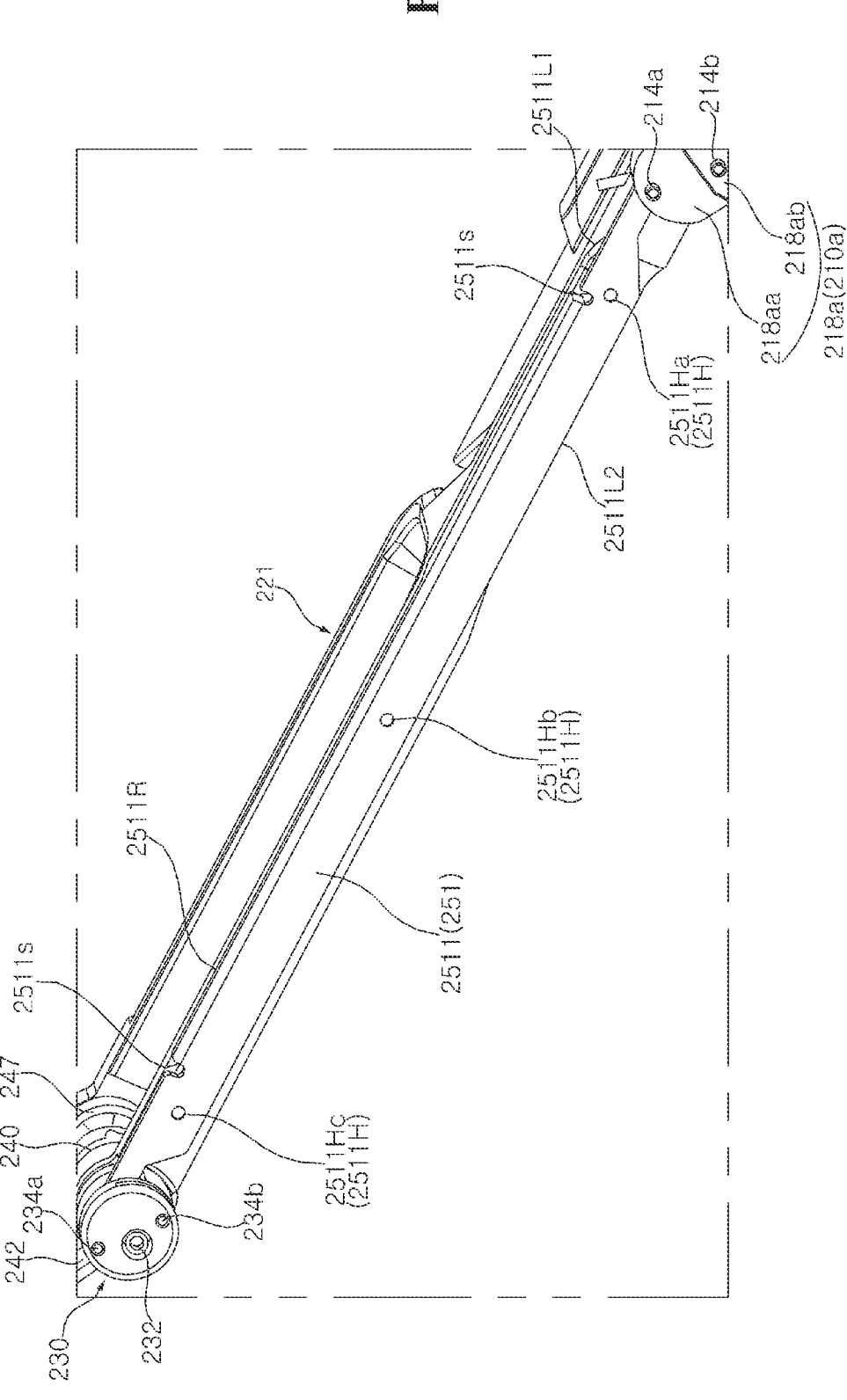
Figure 39:
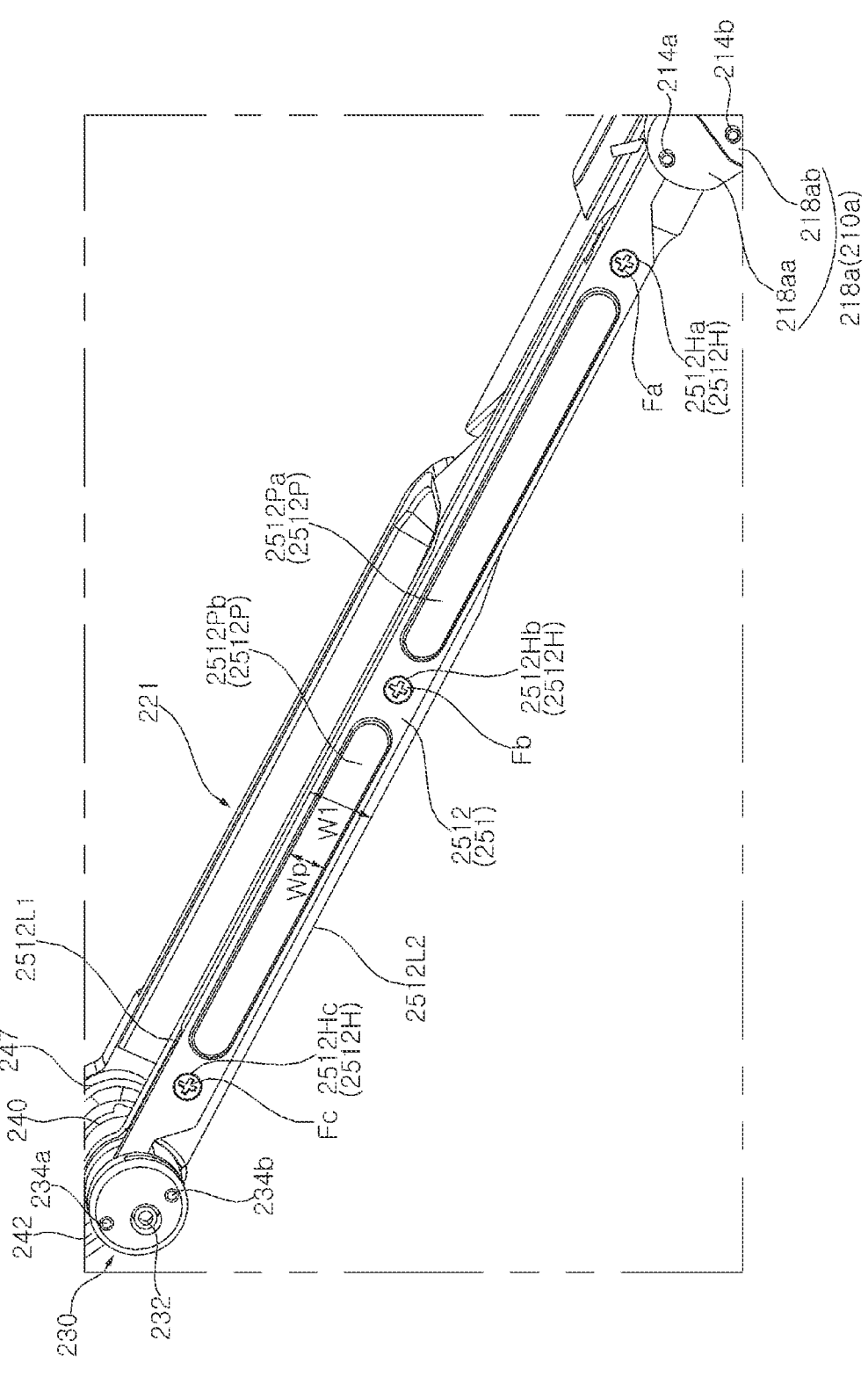
Figure 40:
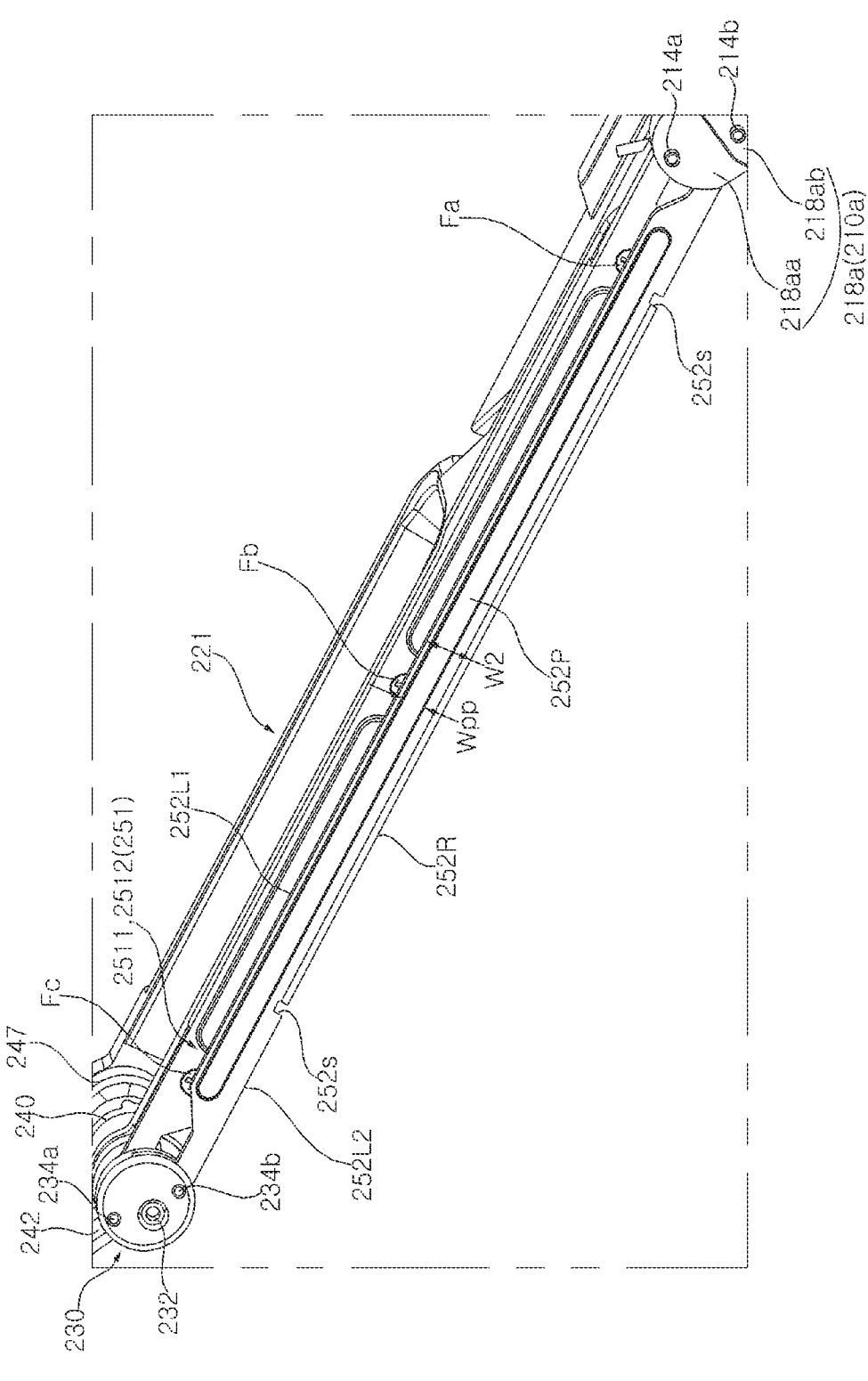

Referring to FIGS. 38 to 40, the joint 230 may be opposite the first holder 218a of the first base 210a. For example, the first holder 218a may include a first part 218aa and a second part 218ab. The second part 218ab may be formed on an outer surface of the first part 218aa, and may form a step descending from the first part 218aa.

The bars 251 and 252 may be positioned between the joint 230 and the first holder 218*a*, and may connect the joint 230 and the first holder 218*a*. The bars 251 and 252 may include a metal material.

A first upper pin 214*a* may extend in a direction parallel to the first hinge shaft 212, and may be coupled to the first part 218*aa* of the first holder 218*a*. The first upper pin 214*a* may be eccentric upward from the first hinge shaft 212. A first lower pin 214*b* may extend in a direction parallel to the first hinge shaft 212, and may be coupled to the second part 218*ab* of the first holder 218*a*. The first lower pin 214*b* may be eccentric downward from the first hinge shaft 212.

A second upper pin 234*a* may extend in a direction parallel to the second hinge shaft 232, and may be coupled to the joint 230. The second upper pin 234*a* may be eccentric upward from the second hinge shaft 232. A second lower pin 234*b* may extend in a direction parallel to the second hinge shaft 232, and may be coupled to the joint 230. The second lower pin 234*b* may be eccentric downward from the second hinge shaft 232.

For example, a distance between the first upper pin 214*a* and the first lower pin 214*b* may be equal to a distance between the second upper pin 234*a* and the second lower pin 234*b*.

An inner bar 251 may be elongated along the lower arm 221. A first end (i.e., a lower end) of the inner bar 251 may be rotatably coupled to the first upper pin 214*a* that is coupled to the first part 218*aa* of the first holder 218*a*. For example, a bottom ring may be provided at the first end (i.e., the lower end) of the inner bar 251, and the first upper pin 214*a* may pass through the bottom ring. A second end (i.e., an upper end) of the inner bar 251 may be rotatably coupled to the second upper pin 234*a* that is coupled to the joint 230. For example, a top ring may be provided at the second end (i.e., the upper end) of the inner bar 251, and the second upper pin 234*a* may pass through the top ring.

Here, a first inner slot 210Sa (see FIG. 33) may be formed in the first part 218*aa* of the first holder 218*a*, and may extend along a movement trajectory of the inner bar 251 rotating about the first upper pin 214*a*. A second inner slot 230Sa (see FIG. 34) may be formed in the joint 230, and may extend along a movement trajectory of the inner bar 251 rotating about the second upper pin 234*a*.

An outer bar 252 may be elongated along the inner bar 251. The outer bar 252 may be spaced apart from the inner bar 251 while being adjacent thereto. A first end (i.e., a lower end) of the outer bar 252 may be rotatably coupled to the first lower pin 214*b* that is coupled to the second part 218*ab* of the first holder 218*a*. For example, a bottom ring may be provided at the first end (i.e., the lower end) of the outer bar 252, and the first lower pin 214*b* may pass through the bottom ring. A second end (i.e., an upper end) of the outer bar 252 may be rotatably coupled to the second lower pin 234*b* that is coupled to the joint 230. For example, a top ring may be provided at the second end (i.e., the upper end) of the outer bar 252, and the second lower pin 234*b* may pass through the top ring.

Here, a first outer slot 210Sb (see FIG. 33) may be formed in the second part 218*ab* of the first holder 218*a*, and may extend along a movement trajectory of the outer bar 252 rotating about the first lower pin 214*b*. A second outer slot 230Sb (see FIG. 34) may be formed in the joint 230, and may extend along a movement trajectory of the outer bar 252 rotating about the second lower pin 234*b*.

Accordingly, the outer bar 252 may be spaced leftward from the inner bar 251, and may be offset downward relative to the inner bar 251. The first upper pin 214*a*, the second upper pin 234*a*, the first lower pin 214*b*, and the second lower pin 234*b* may form pivot points of a four-bar linkage. Even when the inner bar 251 and the outer bar 252 rotate clockwise CW or counterclockwise CCW, an angle of the joint 230 with the base 210 may remain constant. In this case, an angle of the second hinge shaft 232 fixed to the joint 230 may also remain constant, and the fixing ring 237 fixed to the second hinge shaft 232 may support one end of the second elastic member 240. That is, the joint 230, the bars 251 and 252, and the first holder 218*a* may support the elastic member 240, and the elastic member 240 may allow the upper arm 241 to which the bracket 60 and the display D are coupled to smoothly stand up.

The inner bar 251 and the outer bar 252 may each include a pressed portion. The pressed portion may be formed on a side surface of each of the bars 251 and 252, thereby increasing the rigidity of the bars 251 and 252. For example, the inner bar 251 may include a first inner bar 2511 and a second inner bar 2512.

Referring to FIG. 38, opposite ends of the first inner bar 2511 may be rotatably coupled to the first upper pin 214*a* and the second upper pin 234*a*. A rib 2511R may be bent from a first long side 2511L of the first inner bar 2511 toward the lower arm 221, and may extend along the first long side 2511L1. A pair of slits 2511*s* may be formed on opposite sides of the rib 2511R. The rib 2511R may allow the rigidity of the first inner bar 2511 to be increased.

A plurality of holes 2511H may be formed in the first inner bar 2511, and may be spaced apart from each other in a longitudinal direction of the first inner bar 2511. A first hole 2511Ha may be adjacent to a first end of the first inner bar 2511, a second hole 2511Hb may be positioned in a central portion of the first inner bar 2511, and a third hole 2511Hc may be adjacent to a second end of the first inner bar 2511.

Referring to FIG. 39, the second inner bar 2512 may be positioned on a left surface of the first inner bar 2511. The second inner bar 2512 may generally have a similar shape to the first inner bar 2511. Opposite ends of the second inner bar 2512 may be rotatably coupled to the first upper pin 214*a* and the second upper pin 234*a*. A pressed portion 2512P may be formed by being pressed leftward from a right surface of the second inner bar 2512, and may extend in a longitudinal direction of the second inner bar 2512. A width Wp of the pressed portion 2512P may be slightly less than a width Wp of the second inner bar 2512. In other words, a first long side of the pressed portion 2512P may be adjacent to a first long side 2512L1 of the second inner bar 2512, and a second long side of the pressed portion 2512P may be adjacent to a second long side 2512L2 of the second inner bar 2512. The pressed portion 2512P may allow the rigidity of the second inner bar 2512 to be increased.

A plurality of holes 2512H may be formed in the second inner bar 2512, and may be spaced apart from each other in the longitudinal direction of the second inner bar 2512. A first hole 2512Ha of the second inner bar 2512 may be aligned with the first hole 2511Ha of the first inner bar 2511, a second hole 2512Hb of the second inner bar 2512 may be aligned with the second hole 2511Hb of the first inner bar 2511, and a third hole 2512Hc of the second inner bar 2512 may be aligned with the third hole 2511Hc of the first inner bar 2511. A plurality of pressed portions 2512P may be positioned between the plurality of holes 2512H. A first pressed portion 2512Pa may be positioned between the first hole 2512Ha and the second hole 2512Hb, and may be elongated. A second pressed portion 2512Pb may be positioned between the second hole 2512Hb and the third hole 2512Hc, and may be elongated. The plurality of pressed portions 2512P may allow the rigidity of the second inner bar 2512 to be increased.

Fastening members Fa, Fb, and Fc, such as screws, may pass through the holes 2512H of the second inner bar 2512, respectively, and may be fastened to the holes 2511H of the first inner bar 2511, respectively. Accordingly, the second inner bar 2512 may be coupled to the first inner bar 2511, and the inner bar 251 may have an increased rigidity.

Referring to FIG. 40, the outer bar 252 may generally have an inverted shape of the inner bar 251. Opposite ends of the outer bar 252 may be rotatably coupled to the first lower pin 214b and the second lower pin 234b. A rib 252R may be bent from a second long side 252L2 of the outer bar 252, and may extend along the second long side 252L2. A pair of slits 252s may be formed on opposite sides of the rib 252R. The rib 252R may allow the rigidity of the outer bar 252 to be increased.

A pressed portion 252P may be formed by being pressed leftward from a right surface of the outer bar 252, and may extend in a longitudinal direction of the outer bar 252. A width Wpp of the pressed portion 252P may be about half of a width W2 of the outer bar 252. That is, the pressed portion 252P may have a narrow width relative to the width of the outer bar 252. However, a length of the pressed portion 252P may be slightly less than a length of the outer bar 252. The pressed portion 252P may allow the rigidity of the outer bar 252 to be increased.

Accordingly, as the inner bar 251 and the outer bar 252 have an increased rigidity, the inner bar 251 and the outer bar 252 may be suppressed from being deformed by the weight (or load) of the display D transferred to the inner bar 251 and the outer bar 252. In other words, it is possible to minimize vibration or noise caused by bending or twisting of the inner bar 251 and the outer bar 252 or touching between the inner bar 251 and the outer bar 252.

Referring back to FIGS. 33 and 34, the third elastic member 250 may be positioned between the inner bar 251 and the lower arm 221. The third elastic member 250 may be a torsion spring, and the length of the third elastic member 250 may be varied. A first end of the third elastic member 250 may be fixed to a fixing portion 251F provided on one side of the first inner bar 2511, and a second end of the third elastic member 250 may be fixed to a fixing portion 221F provided on one side of the lower arm 221. The fixing portion 251F may be adjacent to the first base 210a, and the fixing portion 221F may be farther away from the first base 201a compared to the fixing portion 251F.

When the lower arm 221 and the bars 251 and 252 rotate counterclockwise CCW, the third elastic member 250 may be elastically deformed, causing its length to increase. In other words, the third elastic member 250 may minimize the lower arm 221 and the bars 251 and 252 from being suddenly folded by the weight of the bracket 60 and the display D.

When the lower arm 221 and the bars 251 and 252 rotate clockwise CW, the third elastic member 250 may be restored, causing its length to decrease. In other words, an elastic force of the third elastic member 250 may assist the rotation of the lower arm 221 and the bars 251 and 252.

Referring to FIGS. 1 to 40, a display device may include: a display; an upper arm coupled to a rear of the display; a lower arm to which the upper arm is hingedly connected; a base to which the lower arm is hingedly connected; a joint connecting the upper arm and the lower arm; a first elastic member providing an elastic force to the lower arm with respect to the base; a second elastic member providing an elastic force to the upper arm with respect to the joint; an inner bar having opposite ends pivotably coupled to the base and the joint; and an outer bar having opposite ends pivotably coupled the base and the joint.

A height of the opposite ends of the outer bar with respect to the base may be different from a height of the opposite ends of the inner bar with respect to the base.

The display device may further include: a first hinge shaft providing a central axis of rotation of the lower arm and fixed to the base; a second hinge shaft providing a central axis of rotation of the upper arm and fixed to the joint; a first upper pin which is eccentric from the first hinge shaft in a first direction, which is coupled to the base, and to which a first end of the inner bar is rotatably coupled; a first lower pin which is eccentric from the first hinge shaft in a second direction, which is coupled to the base, and to which a first end of the outer bar is rotatably coupled; a second upper pin which is eccentric from the second hinge shaft in the first direction, which is coupled to the joint, and to which a second end of the inner bar is rotatably coupled; and a second lower pin which is eccentric from the second hinge shaft in the second direction, which is coupled to the joint, and to which a second end of the outer bar is rotatably coupled.

A distance between the first upper pin and the first lower pin may be equal to a distance between the second upper pin and the second lower pin.

The first elastic member may cover a lateral surface of the first hinge shaft and support one side of the lower arm, and the second elastic member may cover a lateral surface of the second hinge shaft and supports one side of the upper arm.

A first end of the first elastic member may be fixed to the base, and a first end of the second elastic member may be fixed to the second hinge shaft.

The lower arm may be elongated, the inner bar may extend along one long side of the lower arm while being adjacent to the one long side, and the outer bar may extend along the inner bar and is spaced apart from the inner bar.

The inner bar may include a pressed portion formed by being pressed from a first surface toward a second surface of the inner bar.

The inner bar may include: a first inner bar facing the one long side of the lower arm; and a second inner bar opposite the lower arm with respect to the first inner bar and coupled to the first inner bar.

The first inner bar may include a rib bent from one side of the first inner bar toward the lower arm.

The display device may further include fastening members to couple the second inner bar to the first inner bar. The second inner bar may include: holes through which the respective fastening members pass; and a pressed portion formed between the holes.

The outer bar may include: a pressed portion formed by being pressed from a first surface toward a second surface of the outer bar; and a rib bent from one side of the outer bar toward the lower arm.

The display device may further include a third elastic member positioned between the lower arm and the inner bar, the third elastic member having a first end fixed to the inner bar and a second end fixed to the lower arm. The third elastic member may be elastically deformed when the lower arm is folded toward the base, and may be restored when the lower arm is unfolded from the base.

The lower arm may include: a body extending long; a pair of bottom coupling portions protruding from a first end of the body and rotatably coupled to the base; and a pair of top coupling portions protruding from a second end of the body.

The upper arm may be positioned between the pair of top coupling portions and is rotatably coupled to the pair of top coupling portions. The joint may be coupled to any one of the pair of top coupling portions. The inner bar and the outer bar may connect the joint and the base and which are adjacent to one long side of the body.

The display device may further include a bracket to couple the upper arm to the display.

The display device according to the present disclosure has the following effects.

According to at least one of the embodiments of the present disclosure, it is possible to provide a structure that enables a display stand to be folded and unfolded.

According to at least one of the embodiments of the present disclosure, it is possible to provide a structure capable of facilitating folding and unfolding of a foldable link of a display stand.

According to at least one of the embodiments of the present disclosure, it is possible to provide a support link for supporting a foldable link of a display stand.

According to at least one of the embodiments of the present disclosure, it is possible to provide a structure capable of minimizing the deformation of a support link by increasing the rigidity of the support link.

According to at least one of the embodiments of the present disclosure, it is possible to provide various examples of a display stand.

Certain embodiments or other embodiments of the disclosure described above are not mutually exclusive or distinct from each other. Any or all elements of the embodiments of the disclosure described above may be combined or combined with each other in configuration or function.

For example, a configuration "A" described in one embodiment of the disclosure and the drawings, and a configuration "B" described in another embodiment of the disclosure and the drawings may be combined with each other. Namely, although the combination between the configurations is not directly described, the combination is possible except in the case where it is described that the combination is impossible.

The above detailed description is to be construed in all aspects as illustrative and not restrictive. The scope of the disclosure should be determined by reasonable interpretation of the appended claims, and all changes coming within the equivalency range of the disclosure are intended to be embraced in the scope of the disclosure.

What is claimed is:

1. A display device comprising:
a display;
an upper arm coupled to a rear of the display;
a lower arm to which the upper arm is hingedly connected;
a base to which the lower arm is hingedly connected;
a joint connecting the upper arm and the lower arm;
a first elastic member providing an elastic force to the lower arm with respect to the base;
a second elastic member providing an elastic force to the upper arm with respect to the joint;
an inner bar having opposite ends pivotably coupled to the base and the joint; and
an outer bar having opposite ends pivotably coupled the base and the joint,
wherein the lower arm is elongated,
wherein the inner bar extends along one long side of the lower arm adjacent to the one long side,
wherein the outer bar extends along the inner bar and is spaced apart from the inner bar, and wherein the inner bar comprises:
a first inner bar facing the one long side of the lower arm; and
a second inner bar opposite the lower arm with respect to the first inner bar and fixed to the first inner bar.

2. The display device of claim 1, wherein a height of the opposite ends of the outer bar with respect to the base is different from a height of the opposite ends of the inner bar with respect to the base.

3. The display device of claim 1, further comprising:
a first hinge shaft providing a central axis of rotation of the lower arm and fixed to the base;
a second hinge shaft providing a central axis of rotation of the upper arm and fixed to the joint;
a first upper pin which is eccentric from the first hinge shaft in a first direction, which is coupled to the base, and to which a first end of the inner bar is rotatably coupled;
a first lower pin which is eccentric from the first hinge shaft in a second direction, which is coupled to the base, and to which a first end of the outer bar is rotatably coupled;
a second upper pin which is eccentric from the second hinge shaft in the first direction, which is coupled to the joint, and to which a second end of the inner bar is rotatably coupled; and
a second lower pin which is eccentric from the second hinge shaft in the second direction, which is coupled to the joint, and to which a second end of the outer bar is rotatably coupled.

4. The display device of claim 3, wherein a distance between the first upper pin and the first lower pin is equal to a distance between the second upper pin and the second lower pin.

5. The display device of claim 3, wherein the first elastic member covers a lateral surface of the first hinge shaft and supports one side of the lower arm, and
wherein the second elastic member covers a lateral surface of the second hinge shaft and supports one side of the upper arm.

6. The display device of claim 5, wherein a first end of the first elastic member is fixed to the base, and
wherein a first end of the second elastic member is fixed to the second hinge shaft.

7. The display device of claim 1, wherein the inner bar further comprises a pressed portion formed by being pressed from a first surface toward a second surface of the inner bar.

8. The display device of claim 1, wherein the first inner bar comprises a rib bent from one side of the first inner bar toward the lower arm.

9. The display device of claim 1, further comprising fastening members to couple the second inner bar to the first inner bar,
wherein the second inner bar comprises:
holes through which the respective fastening members pass; and
a pressed portion formed between the holes.

10. The display device of claim 1, wherein the outer bar comprises:
a pressed portion formed by being pressed from a first surface toward a second surface of the outer bar; and
a rib bent from one side of the outer bar toward the lower arm.

11. The display device of claim 1, further comprising a third elastic member positioned between the lower arm and the inner bar, the third elastic member having a first end fixed to the inner bar and a second end fixed to the lower arm, wherein the third elastic member is elastically deformed when the lower arm is folded toward the base, and is restored when the lower arm is unfolded from the base.

12. The display device of claim 1, wherein the lower arm comprises:

a body extending long;

a pair of bottom coupling portions protruding from a first end of the body and rotatably coupled to the base; and a pair of top coupling portions protruding from a second end of the body, wherein the upper arm is positioned between the pair of top coupling portions and is rotatably coupled to the pair of top coupling portions, wherein the joint is coupled to any one of the pair of top coupling portions, and wherein the inner bar and the outer bar connect the joint and the base and which are adjacent to one long side of the body.

13. The display device of claim 1, further comprising a bracket to couple the upper arm to the display.

* * * * *